United States Patent
Oh et al.

(10) Patent No.: US 8,730,738 B2
(45) Date of Patent: May 20, 2014

(54) NONVOLATILE MEMORY DEVICES AND METHODS OF OPERATING NONVOLATILE MEMORY DEVICES

(75) Inventors: Eun Chu Oh, Hwaseong-si (KR); Hong Rak Son, Anyang-si (KR); KyoungLae Cho, Yongin-si (KR); Junjin Kong, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 263 days.

(21) Appl. No.: 13/211,743

(22) Filed: Aug. 17, 2011

(65) Prior Publication Data
US 2012/0257455 A1 Oct. 11, 2012

(30) Foreign Application Priority Data
Apr. 5, 2011 (KR) ........................ 10-2011-0031320

(51) Int. Cl.
*G11C 11/34* (2006.01)
*G11C 16/06* (2006.01)

(52) U.S. Cl.
USPC ............ 365/185.22; 365/185.17; 365/185.18; 365/185.23; 365/189.09

(58) Field of Classification Search
USPC ............ 365/185.22, 185.17, 185.18, 185.23, 365/189.09
See application file for complete search history.

(56) References Cited

U.S. PATENT DOCUMENTS

| | | | |
|---|---|---|---|
| 5,511,022 A | 4/1996 | Yim et al. | |
| 5,673,223 A | 9/1997 | Park | |
| 5,740,107 A | 4/1998 | Lee | |
| 5,923,587 A | 7/1999 | Choi | |
| 6,009,014 A | 12/1999 | Hollmer et al. | |
| 6,028,788 A | 2/2000 | Choi et al. | |
| 6,285,587 B1 | 9/2001 | Kwon | |
| 6,650,566 B2 | 11/2003 | Jeong et al. | |
| 6,975,542 B2 | 12/2005 | Roohparvar | |
| 7,064,981 B2 | 6/2006 | Roohparvar | |
| 7,064,986 B2 | 6/2006 | Lee et al. | |
| 7,079,419 B2 | 7/2006 | Roohparvar | |
| 7,149,124 B2 | 12/2006 | Nazarian | |
| 7,177,192 B2 | 2/2007 | Yoon et al. | |
| 7,292,476 B2 | 11/2007 | Goda et al. | |

(Continued)

FOREIGN PATENT DOCUMENTS

| | | |
|---|---|---|
| JP | 9007383 A | 1/1997 |
| JP | 10-032269 A | 2/1998 |

(Continued)

OTHER PUBLICATIONS

US Office Action dated Jan. 15, 2013 for related U.S. Appl. No. 13/023,934.

(Continued)

*Primary Examiner* — Toan Le
(74) *Attorney, Agent, or Firm* — Harness, Dickey & Pierce, P.L.C.

(57) ABSTRACT

Methods of operating nonvolatile memory devices including a plurality of cell strings each having at least one ground selection transistor, a plurality of memory cells, and at least one string selection transistor, the operating methods including receiving a command and an address, determining a voltage applying time in response to the input command and address, and applying a specific voltage to memory cells of cell strings corresponding to the input address during the determined voltage applying time.

20 Claims, 59 Drawing Sheets

(56) References Cited

U.S. PATENT DOCUMENTS

| | | |
|---|---|---|
| 7,403,422 B2 | 7/2008 | Kim et al. |
| 7,403,429 B2 | 7/2008 | Chae et al. |
| 7,408,806 B2 | 8/2008 | Park et al. |
| 7,417,904 B2 | 8/2008 | Sivero et al. |
| 7,450,433 B2 | 11/2008 | Wan et al. |
| 7,489,556 B2 | 2/2009 | Tanzawa |
| 7,518,920 B2 | 4/2009 | Kang |
| 7,529,138 B2 | 5/2009 | Park et al. |
| 7,532,514 B2 | 5/2009 | Cernea et al. |
| 7,551,487 B2 * | 6/2009 | Park et al. ............... 365/185.22 |
| 7,551,492 B2 | 6/2009 | Kim |
| 7,566,927 B2 | 7/2009 | Kim et al. |
| 7,606,074 B2 | 10/2009 | Wan et al. |
| 7,633,803 B2 | 12/2009 | Lee |
| 7,668,014 B2 | 2/2010 | Hwang |
| 7,724,577 B2 | 5/2010 | Goda et al. |
| 7,778,084 B2 | 8/2010 | Kim et al. |
| 7,813,184 B2 | 10/2010 | Kim et al. |
| 7,859,902 B2 | 12/2010 | Maejima |
| 7,888,731 B2 | 2/2011 | Kim |
| 7,933,151 B2 | 4/2011 | Maeda et al. |
| 7,936,617 B2 | 5/2011 | Sudo |
| 7,983,084 B2 | 7/2011 | Tokiwa et al. |
| 8,013,389 B2 | 9/2011 | Oh et al. |
| 8,023,321 B2 | 9/2011 | Kim |
| 8,149,635 B2 * | 4/2012 | Lee ......................... 365/189.16 |
| 8,169,826 B2 | 5/2012 | Hishida et al. |
| 8,189,391 B2 | 5/2012 | Itagaki et al. |
| 8,228,733 B2 | 7/2012 | Tokiwa et al. |
| 8,243,518 B2 | 8/2012 | Oh et al. |
| 8,467,246 B2 | 6/2013 | Kim et al. |
| 8,570,805 B2 | 10/2013 | Lee et al. |
| 2002/0071311 A1 | 6/2002 | Jeong et al. |
| 2005/0006692 A1 | 1/2005 | Kim et al. |
| 2005/0141283 A1 | 6/2005 | Lee et al. |
| 2005/0248991 A1 * | 11/2005 | Lee et al. ............... 365/185.28 |
| 2006/0140012 A1 | 6/2006 | Wan et al. |
| 2007/0070701 A1 | 3/2007 | Kim et al. |
| 2007/0158736 A1 | 7/2007 | Arai et al. |
| 2007/0159886 A1 | 7/2007 | Kang |
| 2007/0183204 A1 | 8/2007 | Kim et al. |
| 2007/0252201 A1 | 11/2007 | Kito et al. |
| 2007/0297234 A1 | 12/2007 | Cernea et al. |
| 2008/0007999 A1 | 1/2008 | Park et al. |
| 2008/0253183 A1 | 10/2008 | Mizukami et al. |
| 2008/0279012 A1 | 11/2008 | Lee |
| 2009/0002182 A1 | 1/2009 | Knox et al. |
| 2009/0003075 A1 * | 1/2009 | Kim et al. ............... 365/185.19 |
| 2009/0021983 A1 | 1/2009 | Wan et al. |
| 2009/0021988 A1 | 1/2009 | Hong et al. |
| 2009/0097309 A1 | 4/2009 | Mizukami et al. |
| 2009/0122613 A1 | 5/2009 | Kim et al. |
| 2009/0168533 A1 | 7/2009 | Park et al. |
| 2009/0175081 A1 | 7/2009 | Kim |
| 2009/0180323 A1 | 7/2009 | Park et al. |
| 2009/0268524 A1 | 10/2009 | Maejima |
| 2009/0279359 A1 | 11/2009 | Goda et al. |
| 2010/0124120 A1 | 5/2010 | Park et al. |
| 2010/0195395 A1 | 8/2010 | Jeong et al. |
| 2010/0238732 A1 | 9/2010 | Hishida et al. |
| 2011/0063913 A1 | 3/2011 | Maejima |
| 2011/0199825 A1 | 8/2011 | Han et al. |
| 2011/0216603 A1 | 9/2011 | Han et al. |
| 2011/0238913 A1 | 9/2011 | Kurashige et al. |
| 2012/0099377 A1 | 4/2012 | Maejima |
| 2012/0275234 A1 | 11/2012 | Lee et al. |
| 2013/0182502 A1 | 7/2013 | Cheo et al. |

FOREIGN PATENT DOCUMENTS

| | | |
|---|---|---|
| JP | 2002203393 A | 7/2002 |
| JP | 2005032430 A | 2/2005 |
| JP | 2005196931 A | 7/2005 |
| JP | 2007087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007272952 | 10/2007 |
| JP | 2007-323716 A | 12/2007 |
| JP | 2008-311650 A | 12/2008 |
| JP | 2009-026369 | 2/2009 |
| JP | 2009-088446 | 4/2009 |
| JP | 2009124107 | 6/2009 |
| JP | 2009-266281 | 11/2009 |
| KR | 100157342 B1 | 7/1998 |
| KR | 100390145 | 6/2002 |
| KR | 100688494 A | 1/2005 |
| KR | 100541819 A | 7/2005 |
| KR | 1020060129806 A | 12/2006 |
| KR | 10-0672151 | 1/2007 |
| KR | 100706797 B1 | 4/2007 |
| KR | 100729359 B1 | 6/2007 |
| KR | 10-0784862 B1 | 7/2007 |
| KR | 2007-0078355 A | 7/2007 |
| KR | 10-2007-0096972 | 10/2007 |
| KR | 100897415 A | 11/2007 |
| KR | 10-2008-0005765 | 1/2008 |
| KR | 100890016 A | 11/2008 |
| KR | 2008-0110168 A | 12/2008 |
| KR | 2009-0002471 A | 1/2009 |
| KR | 10-0884861 A | 2/2009 |
| KR | 10-2009-0034776 | 4/2009 |
| KR | 1020090048877 | 5/2009 |
| KR | 10-2009-0072406 | 7/2009 |
| KR | 1020090079037 | 7/2009 |

OTHER PUBLICATIONS

US Office Action dated Jan. 15, 2013 for related U.S. Appl. No. 13/028,918.

US Office Action dated Apr. 5, 2013 for related U.S. Appl. No. 13/029,518.

US Office Action dated Mar. 12, 2013 for related U.S. Appl. No. 12/985,695.

Jaehoon Jang et al, "Vertical Cell Array using TCAT (Terabit Cell Array Transistor) Technology for Ultra High Density NAND Flash Memory", VLSI Symp. Tech. Dig., pp. 192-193, 2009.

Notice of Allowance dated Oct. 11, 2013 in corresponding U.S. Appl. No. 13/967,455.

Office Action dated Nov. 5, 2013 in corresponding U.S. Appl. No. 14/043,256.

Office Action dated Aug. 30, 2013 in corresponding U.S. Appl. No. 12/985,695.

Office Action dated Nov. 1, 2013 in corresponding U.S. Appl. No. 13/545,588.

US Office Action dated Jul. 31, 2013 for related U.S. Appl. No. 13/545,588.

* cited by examiner

Fig. 9

|  | Program | Verify |
|---|---|---|
| Selected BL | V1 | Vpre |
| Unselected BL | V2 | GND |
| Selected SSL | Von1 | Von2 |
| Unselected SSL | Voff1 | Voff3 |
| Selected WL | Vpgm | Vvfy |
| Unselected WL | Vpass | Vread |
| GSL | Voff2 | Von3 |

Fig. 16

| WL group 3 | WL6 | Common Vpgm |
| | WL5 | |
| WL group 2 | WL4 | Common Vpgm |
| | WL3 | |
| WL group 1 | WL2 | Common Vpgm |
| | WL1 | |

| | Erase | Erase Verify |
|---|---|---|
| BL | Float/V4 | Vpre/GND |
| Selected SSL | Float/V5 | Von4 |
| Unselected SSL | | Voff4 |
| WL | VSS | Vvfye |
| GSL | Float/V6 | Von5 |
| CSL | Float/V7 | VSS |
| Substrate | Vers | VSS |

| Sub-block | Voltage Applying Time |
|---|---|
| 2nd Sub-block | TE2 |
| 1st Sub-block | TE1(<TE2) |

Fig. 57

| WL group 3 | WL6 | Common Vpgm3 |
| --- | --- | --- |
|  | WL5 |  |
| WL group 2 | WL4 | Common Vpgm2 |
|  | WL3 |  |
| WL group 1 | WL2 | Common Vpgm1 |
|  | WL1 |  |

NONVOLATILE MEMORY DEVICES AND METHODS OF OPERATING NONVOLATILE MEMORY DEVICES

CROSS-REFERENCE TO RELATED APPLICATIONS

This application claims the priority under 35 U.S.C §119, of Korean Patent Application No. 10-2011-0031320 filed Apr. 5, 2011, in the Korean Intellectual Property Office (KIPO), the entire contents of which is incorporated herein by reference.

BACKGROUND

1. Field

Example embodiments relate to semiconductor memory devices, and more particularly, to nonvolatile memory devices and nonvolatile memory device operating methods.

2. Description of the Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

Volatile memory devices may lose stored contents at power-off. The volatile memory devices include static RAM (SRAM), dynamic RAM (DRAM), synchronous DRAM (SDRAM), and the like. The nonvolatile memory devices may retain stored contents even at power-off. Nonvolatile memory devices include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), and the like. A flash memory device is roughly classified into NOR type and NAND type.

A semiconductor memory device with a three-dimensional array structure has been developed to improve the integration density of a semiconductor memory device.

SUMMARY

Example embodiments of the inventive concepts may be directed to providing methods of operating nonvolatile memory devices which include a plurality of cell strings each having at least one ground selection transistor, a plurality of memory cells, and at least one string selection transistor.

In one embodiment, the operating method includes receiving a command and an address, determining a voltage applying time in response to the input command and address, and applying a specific voltage to memory cells of cell strings corresponding to the input address during the determined voltage applying time.

According to at least one example embodiment, if the input command is a program command, the applying a specific voltage includes applying a program voltage to memory cells of cell strings corresponding to the input address during the determined voltage applying time. According to at least one example embodiment, the determining a voltage applying time includes gradually decreasing the voltage applying time according to a decrease in a word line address of the input address, the word line address appointing a plurality of word lines connected with memory cells of the plurality of cell strings. According to at least one example embodiment, the determining a voltage applying time includes gradually decreasing, increasing, and gradually decreasing the voltage applying time according to a decrease in a word line address of the input address, the word line address appointing a plurality of word lines connected with memory cells of the plurality of cell strings.

According to at least one example embodiment, the determining a voltage applying time includes gradually decreasing and gradually increasing the voltage applying time according to a decrease in a word line address of the input address, the word line address appointing a plurality of word lines connected with memory cells of the plurality of cell strings. According to at least one example embodiment, each of the plurality of cell strings includes a pillar contacting the substrate and extending in a direction perpendicular to the substrate, and the determining a voltage applying time includes gradually decreasing the voltage applying time according to a decrease in a cross-sectional area of pillars corresponding to memory cells of the cell strings corresponding to the input address.

According to at least one example embodiment, the determining a voltage applying time includes gradually decreasing the voltage applying time according to a decrease in the number of memory cells stacked between the substrate and the memory cells of the cell strings corresponding to the input address. According to at least one example embodiment, the determining a voltage applying time includes decreasing, increasing, and gradually decreasing the voltage applying time according to a decrease in the number of memory cells stacked between the substrate and the memory cells of the cell strings corresponding to the input address.

According to at least one example embodiment, a plurality of word lines connected with a plurality of memory cells of the plurality of cell strings is divided into a plurality of word line groups, and the determining a voltage applying time includes determining the voltage applying time according to whether the input address corresponding to one of the plurality of word line groups. According to at least one example embodiment, the operating method further includes applying a verify voltage to memory cells of cell strings corresponding to the input address following the applying a specific voltage and when a failed memory cell is detected from the memory cells of cell strings corresponding to the input address, again applying the specific voltage to the memory cells of cell strings corresponding to the input address during the determined voltage applying time.

According to at least one example embodiment, when the specific voltage is again applied, a level of the specific voltage increases, and an increment of the specific voltage decreases according to a decrease in the voltage applying time. According to at least one example embodiment, the voltage applying time varies, while an interval between a start point of a specific voltage pulse and a start point of a verify voltage pulse is constant. According to at least one example embodiment, the voltage applying time varies, while an interval between an end point of a specific voltage pulse and a start point of a verify voltage pulse is constant. According to at least one example embodiment, when the input command is an erase command, the applying a specific voltage includes applying an erase voltage to memory cells of cell strings corresponding to the input address via the substrate during the determined voltage applying time.

Still other example embodiments of the inventive concepts may be directed to providing a nonvolatile memory device including a memory cell array including a plurality of cell strings each having at least one ground selection transistor, a plurality of memory cells, and at least one string selection transistor, an address decoder connected to a plurality of string selection transistors of the plurality of cell strings via a plurality of string selection lines, to a plurality of memory cells of the plurality of cell strings via a plurality of word lines, and to a plurality of ground selection transistors of the plurality of cell strings via a ground selection line; a reading/writing circuit connected to the plurality of string selection transistors of the plurality of cell strings via a plurality of bit lines; a voltage generator configured to generate a plurality of voltages, and control logic configured to adjust a voltage applying time when a specific voltage generated by the voltage generator is applied to a plurality of memory cells of the memory cell array.

A method of operating a nonvolatile memory device includes receiving a command and an address, determining a voltage applying time in response to the received command and address and applying a first voltage to memory cells of cell strings corresponding to the received address for the voltage applying time.

A nonvolatile memory includes a memory cell array including a plurality of cell strings, each of the plurality of cell strings including at least one ground selection transistor, a plurality of memory cells, and at least one string selection transistor, an address decoder connected to a plurality of string selection transistors of the plurality of cell strings via a plurality of string selection lines, the address decoder connected to a plurality of memory cells of the plurality of cell strings via a plurality of word lines, and the address decoder connected to a plurality of ground selection transistors of the plurality of cell strings via a ground selection line, a reading/writing circuit connected to the plurality of string selection transistors of the plurality of cell strings via a plurality of bit lines, a voltage generator configured to generate a plurality of voltages and a controller configured to adjust a voltage applying time upon applying a voltage generated by the voltage generator to a plurality of memory cells of the memory cell array.

A method of operating a three-dimensional (3D) semiconductor array includes applying a first voltage to a first semiconductor device of a plurality of semiconductor devices for a first period of time, each of the plurality of semiconductor devices including a portion of one vertical channel, the first period of time based on a width of the portion of the vertical channel included in the first semiconductor device.

BRIEF DESCRIPTION OF THE FIGURES

Example embodiments will be more clearly understood from the following brief description taken in conjunction with the accompanying drawings.

FIG. 1 is a flowchart illustrating methods of operating nonvolatile memory devices according to at least one example embodiment of the inventive concepts;

FIG. 9 is a table illustrating voltages supplied to a memory block at a program operation and a verify operation;

FIG. 16 is a table illustrating word line groups according to at least one example embodiment of the inventive concepts;

FIG. 57 is a table illustrating word line groups according to yet other example embodiments of the inventive concepts;

FIG. 65 is a block diagram illustrating computing systems including memory systems illustrated in FIG. 64.

Figure 1:
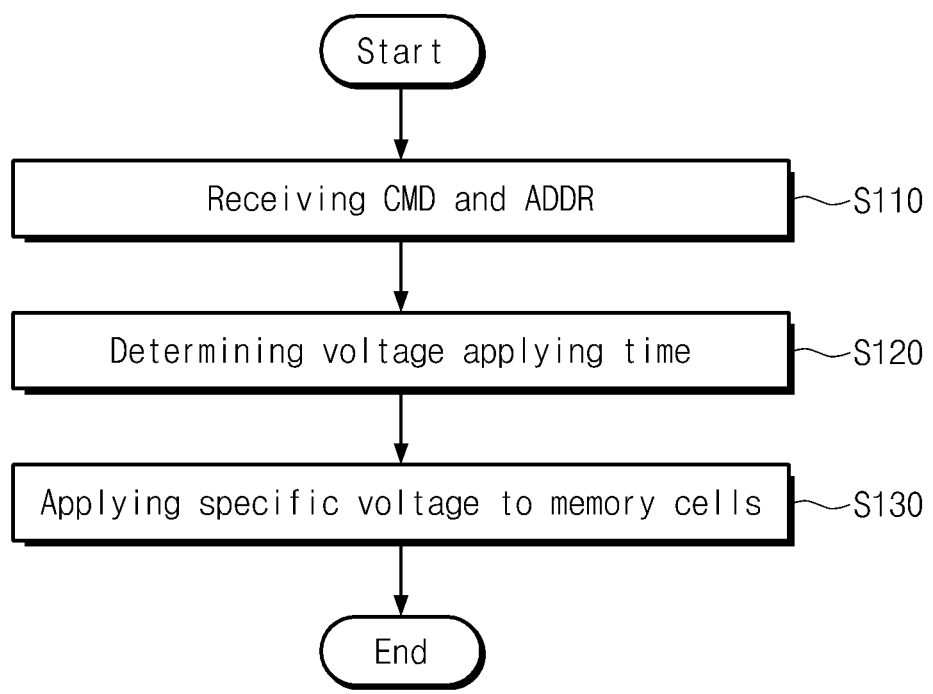
FIGS. 1-65 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The term "selected bit line" or "selected bit lines" may be used to indicate a bit line or bit lines, connected with a cell transistor to be programmed or read, among a plurality of bit lines. The term "unselected bit line" or "unselected bit lines" may be used to indicate a bit line or bit lines, connected with a cell transistor to be program-inhibited or read-inhibited, among a plurality of bit lines.

The term "selected string selection line" may be used to indicate a string selection line connected with a cell string, which includes a cell transistor to be programmed or read, among a plurality of string selection lines. The term "unselected string selection line" or "unselected string selection lines" may be used to indicate a remaining string selection line or remaining string selection lines other than the selected string selection line among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line connected with a cell string, which includes a cell transistor to be programmed or read, among a plurality of ground selection lines. The term "unselected ground selection line" may be used to indicate a remaining ground selection line or remaining ground selection lines other than the selected ground selection line among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "unselected word line" may be used to indicate a word line, connected with a cell transistor to be programmed or read, among a plurality of word lines. The term "unselected word line" or "unselected word lines" may be used to indicate a remaining word lines or remaining word lines other than a selected word line among a plurality of word lines. The term "selected memory cell" or "selected memory cells" may be used to designate memory cells to be programmed or read among a plurality of memory cells. The term "unselected memory cell" or "unselected memory cells" may be used to indicate a remaining memory cell or remaining memory cells other than a selected memory cell or selected memory cells among a plurality of memory cells.

FIG. 1 is a flowchart illustrating methods of operating nonvolatile memory devices according to at least one example embodiment of the inventive concepts. Referring to FIG. 1, in operation S110, a command CMD and an address ADDR may be received. The command CMD may be a program command or an erase command. The address ADDR may designate memory cells to be programmed or to be erased. In operation S120, a voltage applying time may be determined (e.g., a duration for which the voltage is applied). For example, a voltage applying time may be different according to the command CMD and the address ADDR input in operation S110.

In operation S130, a specific voltage may be applied to memory cells. For example, a voltage corresponding to the command CMD input in operation S110 may be applied to memory cells corresponding to the address ADDR input in operation S110, during the voltage applying time determined in operation S120. When the input command CMD is a program command, the specific voltage may be a program voltage, and memory cells corresponding to the input address ADDR may be programmed. When the input command CMD is an erase command, the specific voltage may be an erase voltage, and memory cells corresponding to the input address ADDR may be erased.

Figure 2:
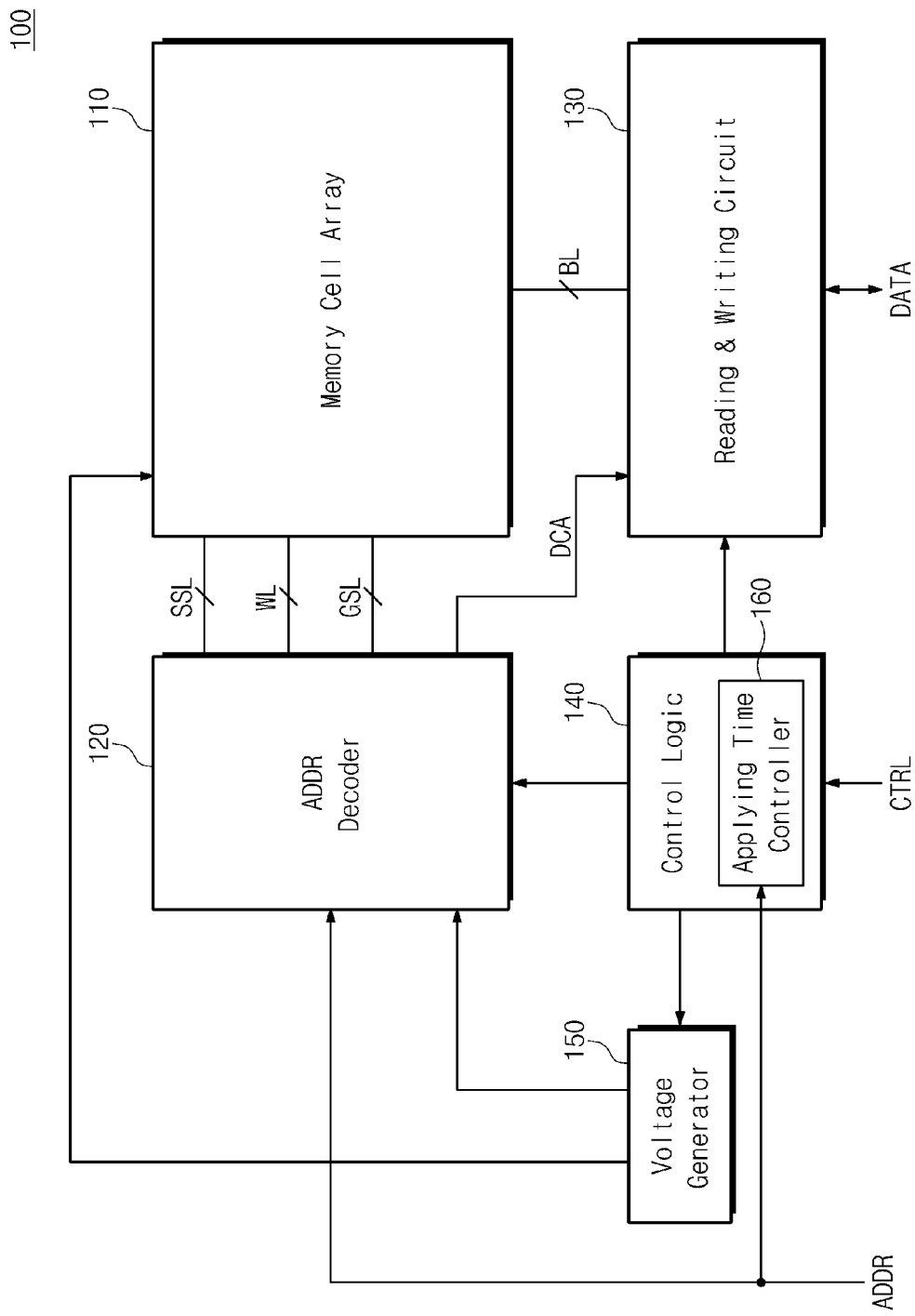
FIG. 2 is a block diagram illustrating nonvolatile memory devices according to at least one example embodiment of the inventive concepts.

FIG. 2 is a block diagram illustrating nonvolatile memory devices according to at least one example embodiment of the inventive concepts. Referring to FIG. 2, a nonvolatile memory device 100 may include a memory cell array 110, an address decoder 120, a reading/writing circuit 130, control logic 140, and a voltage generator 150. The memory cell array 100 may include a plurality of cell strings which may be arranged on a substrate in a row direction and a column direction. Each cell string may include a plurality of memory cells stacked along a direction perpendicular to the substrate. Memory cells may be provided on the substrate along rows and columns, and may be stacked in a direction perpendicular to the substrate to form a three-dimensional structure. The memory cell array 110 may include plural memory cells which store one or more bits of data, respectively.

The address decoder 120 may be coupled with the memory cell array 110 via word lines WL, string selection lines SSL, and ground selection lines GSL. The address decoder 120 may be configured to operate responsive to the control of the control logic 140. The address decoder 120 may receive an address ADDR from an external device. The address decoder 120 may be configured to decode a row address of the input address ADDR. The address decoder 120 may be configured to select a word line corresponding to the decoded row address among the word lines WL. The address decoder 120 may be configured to select a string selection line and a ground selection line corresponding to the decoded row address among the string selection lines SSL and the ground selection lines GSL.

The address decoder 120 may be configured to decode a column address among the input address ADDR. The address decoder 120 may transfer the decoded column address DCA to the reading/writing circuit 130. According to at least one example embodiment, although not shown in FIG. 2, the address decoder 120 may include a row decoder configured to decode a row address, a column decoder configured to decode a column address, an address buffer configured to store the input address ADDR, and the like.

The reading/writing circuit 130 may be coupled with the memory cell array 110 via the bit lines BL. The reading/writing circuit 130 may be configured to exchange data with the external device. The reading/writing circuit 130 may operate responsive to the control of the control logic 140. The reading/writing circuit 130 may receive the decoded column address DCA from the address decoder 120. The reading/writing circuit 130 may select the bit lines BL in response to the decoded column address DCA.

The reading/writing circuit 130 may receive data from the external device to write it in the memory cell array 110. The reading/writing circuit 130 may read data from the memory cell array 110 to output it to the external device. The reading/writing circuit 130 may read data from a first storage area of the memory cell array 110 to store it in a second storage area thereof. The reading/writing circuit 130 may perform a copyback operation. Although not shown in FIG. 1, the reading/writing circuit 130 may include constituent elements such as a page buffer (or a page register), a column selector circuit, a data buffer, and the like. The reading/writing circuit 130 may include constituent elements such as a sense amplifier, a write driver, a column selector circuit, a data buffer, and the like.

The control logic 140 may be coupled with the address decoder 120 and the reading/writing circuit 130. The control logic 140 may be configured to control an overall operation of the nonvolatile memory device 100. The control logic 140 may operate responsive to a control signal CTRL input from the external device. The control signal CTRL may include a command. The voltage generator 150 may operate according to the control of the control logic 140. The voltage generator 150 may be configured to generate various voltages used at the nonvolatile memory device 100. The voltage generator 150 may generate high voltages used at the nonvolatile memory device 140. Voltages generated from the voltage generator 150 may be supplied to the address decoder 120 and the memory cell array 110.

The control logic 140 may include an applying time controller 160. The applying time controller 160 may be configured to determine a voltage applying time of a specific voltage. The applying time controller 160 may be configured to control an applying time of a program or erase voltage according to the control of the control logic 140. The applying time controller 160 may be configured to control an applying time according to an input address ADDR. For example, when the input address ADDR varies, a voltage applying time determined by the applying time controller 160 may vary. The control logic 140 may control the address decoder 120 so as to supply a specific voltage (e.g., a program voltage) to word lines WL during an applying time determined by the applying time controller 160. The control logic 140 may control the voltage generator 150 so as to supply a specific voltage (e.g., an erase voltage) to the memory cell array 110 during an applying time determined by the applying time controller 160.

The applying time controller 160 may be configured to determine a voltage applying time in response to an address ADDR input from the external device. The applying time controller 160 may be configured to determine a voltage applying time in response to an address input from the address decoder 120. For example, the applying time controller 160 may be configured to determine a voltage applying time in response to a row address decoded by the address decoder 220, a row address, and/or a block address.

Figure 3:
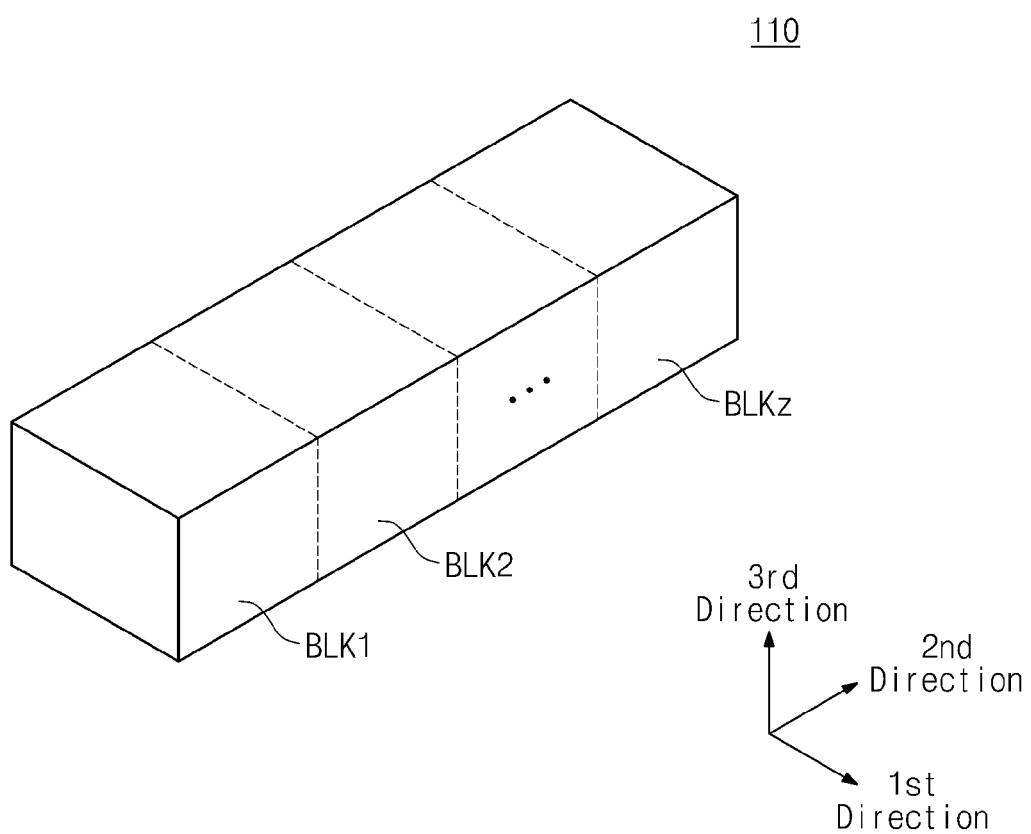
FIG. 3 is a diagram illustrating a memory cell array of FIG. 2 according to at least one example embodiment of the inventive concepts.

FIG. 3 is a diagram illustrating a memory cell array in FIG. 2 according to at least one example embodiment of the inventive concepts. Referring to FIGS. 2 and 3, a memory cell array 110 may include a plurality of memory blocks BLK1-BLKz, each of which is formed to have a three-dimensional structure (or, a vertical structure). For example, each of the memory blocks BLK1-BLKz may include structures extending along first to third directions. Although not shown in FIG. 3, each of the memory blocks BLK1-BLKz may include a plurality of cell strings extending along the second direction. Although not shown in FIG. 3, a plurality of cell string may be spaced apart from one other along the first and third directions.

Cell strings within one memory block may be coupled with a plurality of bit lines, a plurality of string selection lines, a plurality of word lines, one or more ground selection lines, and a common source line. Cell strings in the plurality of memory blocks BLK1-BLKz may share a plurality of bit lines. For example, the plurality of bit lines may extend along the second direction so as to be shared by the plurality of memory blocks BLK1 to BLKz.

The plurality of memory blocks BLK1-BLKz may be selected by an address decoder 120 in FIG. 2. For example, the address decoder 120 may be configured to select a memory block corresponding to an input address ADDR among the plurality of memory blocks BLK1-BLKz. Erasing, programming, and reading may be made at a selected memory block.

Figure 4:
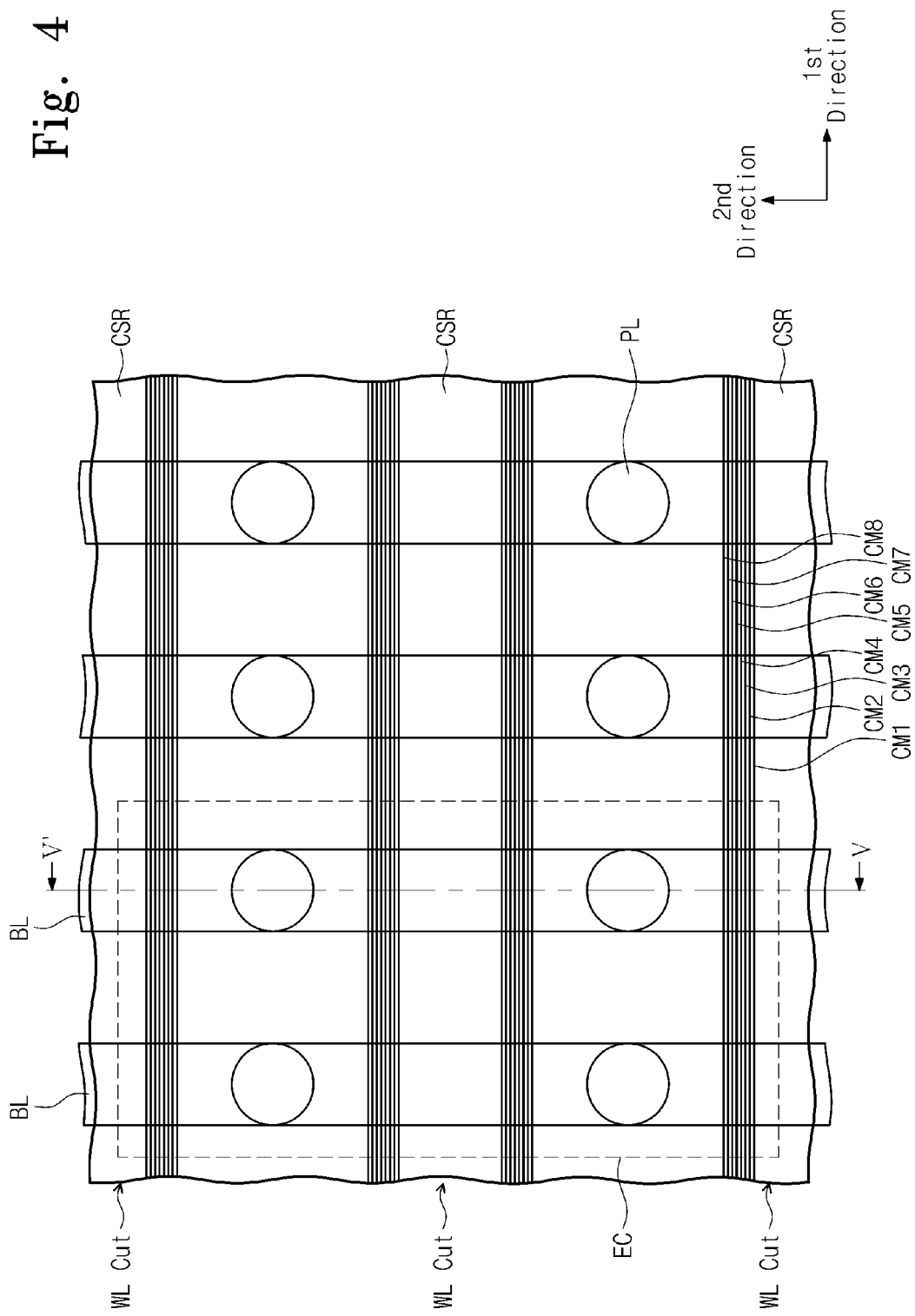
FIG. 4 is a plan diagram of one of memory blocks in FIG. 3 according to at least one example embodiment of the inventive concepts.
Figure 5:
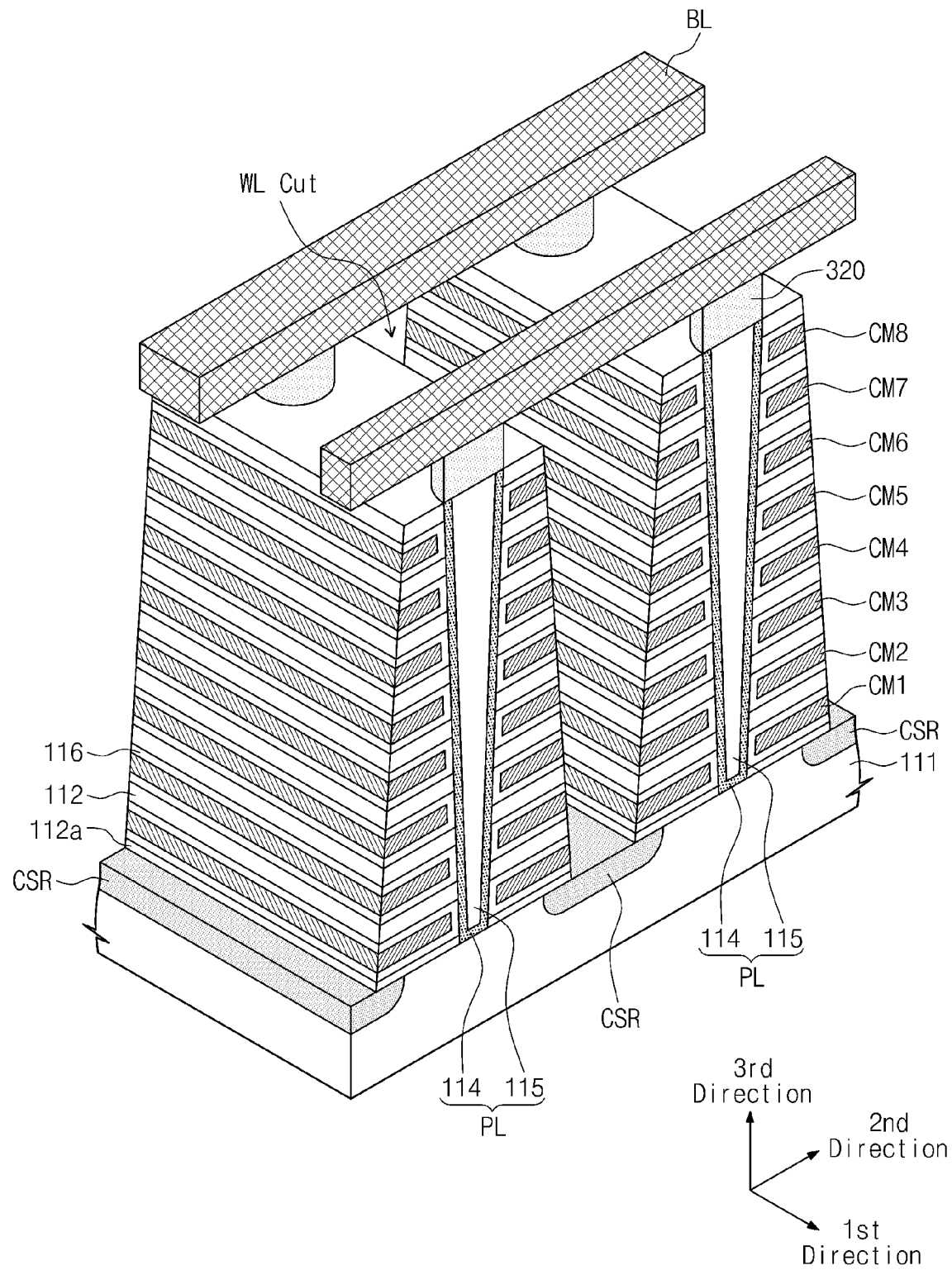
FIG. 5 is a perspective diagram taken along a line V-V' of FIG. 4 according to at least one example embodiment of the inventive concepts.
Figure 6:
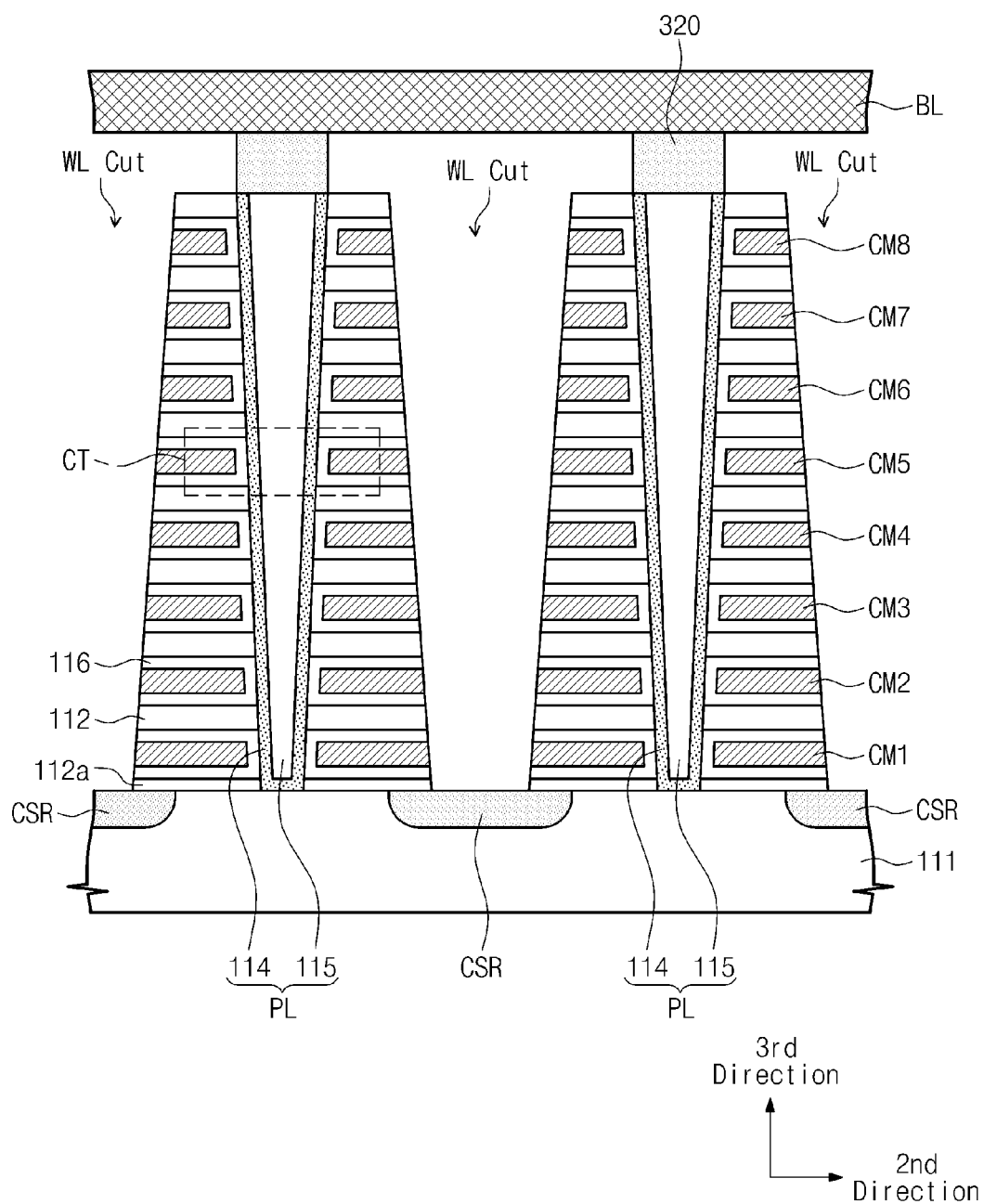
FIG. 6 is a cross-sectional diagram taken along a line V-V' of FIG. 4 according to at least one example embodiment of the inventive concepts.

FIG. 4 is a plan diagram of one of memory blocks in FIG. 3 according to at least one example embodiment of the inventive concepts. FIG. 5 is a perspective diagram taken along a line V-V' of FIG. 4 according to at least one example embodiment of the inventive concepts. FIG. 6 is a cross-sectional diagram taken along a line V-V' of FIG. 4 according to at least one example embodiment of the inventive concepts.

Referring to FIGS. 4-6, three-dimensional structures extending along first to third directions may be provided. A substrate 111 may be provided. The substrate 111 may be a well having a first conductivity type, for example. The substrate 111 may be a p-well in which the Group III element such as Boron May be injected. The substrate 111 may be a pocket p-well which may be provided within an n-well. Below, it may be assumed that the substrate 111 may be a p-well (or, a pocket p-well). However, the substrate 111 may not be limited to p-type.

A plurality of common source regions CSR extending along the first direction may be provided in the substrate 111. The common source regions CSR may be spaced apart from one another along the second direction. The common source regions CSR may be connected in common to form a common source line. The common source regions CSR may have a second conductivity type different from that of the substrate 111. For example, the common source regions CSR may be an n-type. Below, it may be assumed that the common source regions CSR may be the n-type. However, the common source regions CSR may not be limited to the n-type.

Between two adjacent regions of the common source regions CSR, a plurality of insulation materials 112 and 112a may be provided sequentially on the substrate 111 along the third direction (e.g., a direction perpendicular to the substrate 111). The insulation materials 112 and 112a may be spaced apart along the third direction. The insulation materials 112 and 112a may extend along the first direction. For example, the insulation materials 112 and 112a may include an insulation material such as a semiconductor oxide film. A thickness of the insulation material 112a contacting with the substrate 111 may be thinner than those of other insulation materials 112.

Between two adjacent regions of the common source regions CSR, a plurality of pillars PL may be arranged sequentially along the first direction so as to penetrate the plurality of insulation materials 112 and 112a along the second direction. For example, the pillars PL may contact the substrate 111 through the insulation materials 112 and 112a.

The pillars PL between two adjacent common source regions may be spaced apart along the first direction. The pillars PL may be disposed in line along the first direction. Each of the pillars PL may include a channel film 114 and an inner material 115 within the channel film 114.

The channel films 114 may include a semiconductor material (e.g., silicon) having a first conductivity type. For example, the channel films 114 may include a semiconductor material (e.g., silicon) having the same type as the substrate 111. The channel films 114 may include intrinsic semiconductor being a nonconductor. The inner materials 115 may include an insulation material. For example, the inner materials 115 may include an insulation material such as silicon oxide. The inner materials 115 may include an air gap.

Between two adjacent regions of the common source regions CSR, information storage films 116 may be provided on exposed surfaces of the insulation materials 112 and 112a and the pillars PL. The information storage films 116 may store information by trapping and/or discharging charges. Between two adjacent common source regions and between the insulation materials 112 and 112a, conductive materials CM1-CM8 may be provided on exposed surfaces of the information storage films 116. The conductive materials CM1-CM8 may extend along the first direction. The conductive materials CM1-CM8 on the common source regions CSR may be separated by word line cuts. The common source regions CSR may be exposed by the word line cuts. The word line cuts may extend along the first direction.

For example, the conductive materials CM1-CM8 may include a metallic conductive material. The conductive materials CM1-CM8 may include a nonmetallic conductive material (e.g., polysilicon). Information storage films 116 provided on an upper surface of an insulation material placed at the uppermost layer among the insulation materials 112 and 112a may be removed. Information storage films provided at sides opposite to the pillars PL among sides of the insulation materials 112 and 112a may be removed. A plurality of drains 320 may be on the plurality of pillars PL, respectively. The drains 320 may include a semiconductor material (e.g., silicon) having the second conductivity type, for example. The drains 320 may include an n-type semiconductor material (e.g., silicon). Below, it may be assumed that the drains 320 include n-type silicon. However, the prevent invention may not be limited thereto. The drains 320 may be extended to the upside of the channel films 114 of the pillars PL.

Bit lines BL extending in the second direction may be provided on the drains 320 so as to be spaced apart from one another along the first direction. The bit lines BL may be coupled with the drains 320. In this example embodiment, the drains 320 and the bit lines BL may be connected via contact plugs (not shown). The bit lines BL may include a metallic conductive material. The bit lines BL may include a nonmetallic conductive material (e.g., polysilicon).

Below, the conductive materials CM1-CM8 may have a first height to an eighth height according to a distance from the substrate 111. The plurality of pillars PL may form a plurality of cell strings together with the information storage films 116 and the plurality of conductive materials CM1-CM8. Each of the pillars PL may form a cell string with an information storage film 116 and an adjacent conductive material.

The pillars PL may be on the substrate 111 along row and column directions. The eighth conductive materials CM8 may constitute rows. Pillars connected with the same conductive material among the eighth conductive materials CM8 may constitute one row. The bit lines BL may constitute columns. Pillars connected with the same bit line among the bit lines BL may constitute a column. The pillars PL may constitute a plurality of strings arranged along row and column directions together with the information storage films 116 and the plurality of conductive materials CM1-CM8. Each cell string may include a plurality of cell transistors CT stacked in a direction perpendicular to the substrate 111.

Figure 7:
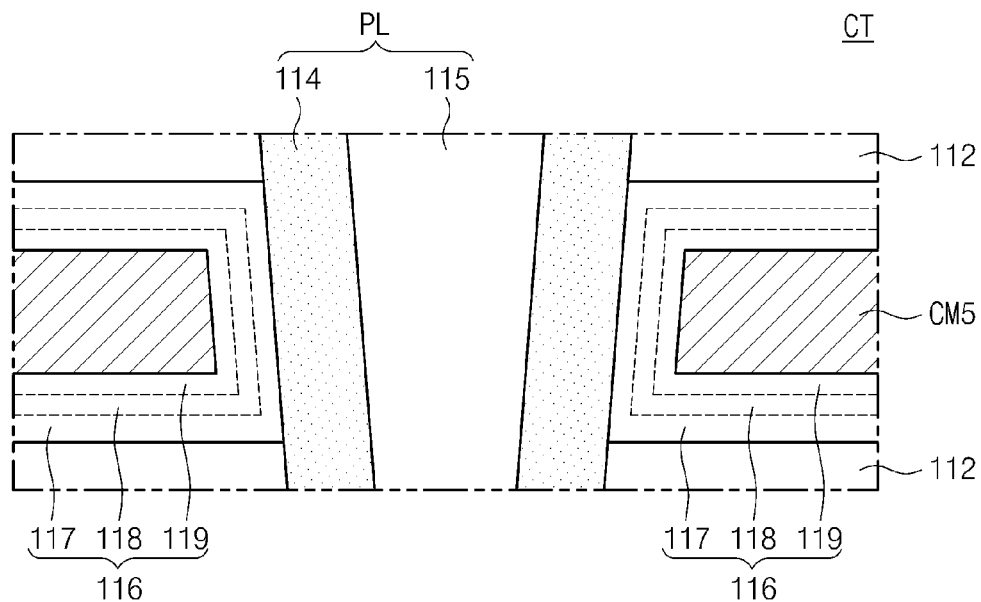
FIG. 7 is a diagram illustrating a cell transistor of FIG. 6.

FIG. 7 is a diagram illustrating a cell transistor of FIG. 6. Referring to FIGS. 4-7, cell transistors CT may include conductive materials CM1-CM8, pillars PL, and information storage films 116 between the conductive materials CM1-CM8 and the pillars PL.

The information storage films 116 may extend to upper surfaces and lower surfaces of the conductive materials CM1-CM8 from regions between the conductive materials CM1-CM8 and the pillars PL. Each of the information storage films 116 may include first to third sub insulation films 117, 118, and 119. In the cell transistors CT, the channel films 114 of the pillars PL may include the same p-type silicon as the substrate 111 but are not limited thereto. The channel films 114 may act as bodies of cell transistors CT. The channel films 114 may be in a direction perpendicular to the substrate 111. The channel films 114 of the pillars PL may act as a vertical body. Vertical channels may be formed in the channel films 114.

The first sub insulation films 117 adjacent to the pillars PL may act as tunneling insulation films of the cell transistors CT. For example, the first sub insulation films 117 may include a thermal oxide film, respectively. The first sub insulation films 117 may include a silicon oxide film, respectively. The second sub insulation films 118 may act as charge storage films of the cell transistors CT. For example, the second sub insulation films 118 may act as a charge trap film, respectively. For example, the second sub insulation films 118 may include a nitride film and/or a metal oxide film, respectively.

The third sub insulation films 119 adjacent to the conductive materials CM1-CM8 may act as blocking insulation films of the cell transistors CT. According to at least one example embodiment, the third sub insulation films 119 may be a single layer or multiple layers. The third sub insulation films 119 may be a high dielectric film (e.g., an aluminum oxide film, a hafnium oxide film, etc.) having a dielectric constant greater than those of the first and second sub insulation films 117 and 118. The third sub insulation films 119 may include a silicon oxide film, respectively. According to at least one example embodiment, the first to third sub insulation films 117-119 may constitute ONA (oxide-nitride-aluminum-oxide) and/or ONO (oxide-nitride-oxide).

The plurality of conductive materials CM1-CM8 may act as a gate (or a control gate), respectively. The plurality of conductive materials CM1-CM8 acting as gates (or control gates), the third sub insulation films 119 acting as block insulation films, the second sub insulation films 118 acting as charge storage films, the first sub insulation films 117 acting as tunneling insulation films, and the channel films 114 acting as vertical bodies may operate as cell transistors CT stacked in a direction perpendicular to the substrate 111. The cell transistors CT may be a charge trap type cell transistor.

The cell transistors CT may be used for different purposes according to height. For example, among the cell transistors CT, cell transistors having at least one height and placed at an upper portion may be used as string selection transistors. String selection transistors may be configured to perform switching operations between cell strings and bit lines. Among the cell transistors CT, cell transistors having at least one height and placed at a lower portion may be used as ground selection transistors. Ground selection transistors may be configured to perform switching operations between cell strings and a common source line formed of common source regions. Cell transistors between cell transistors used as string and ground selection transistors may be used as memory cells and dummy memory cells.

The conductive materials CM1-CM8 may extend along the first direction to be connected with the plurality of pillars PL. The conductive materials CM1-CM8 may constitute conductive lines interconnecting cell transistors CT of the pillars PL. According to at least one example embodiment, the conductive materials CM1-CM8 may be used as a string selection line SSL, a ground selection line GSL, a word line WL, and/or a dummy word line DWL according to height. Conductive lines interconnecting cell transistors used as string selection transistors SST may be used as string selection lines SSL. Conductive lines interconnecting cell transistors used as ground selection transistors GST may be used as ground selection lines GSL. Conductive lines interconnecting cell transistors used as memory cells may be used as word lines. Conductive lines interconnecting cell transistors used as dummy memory cells may be used as dummy word lines.

Figure 8:
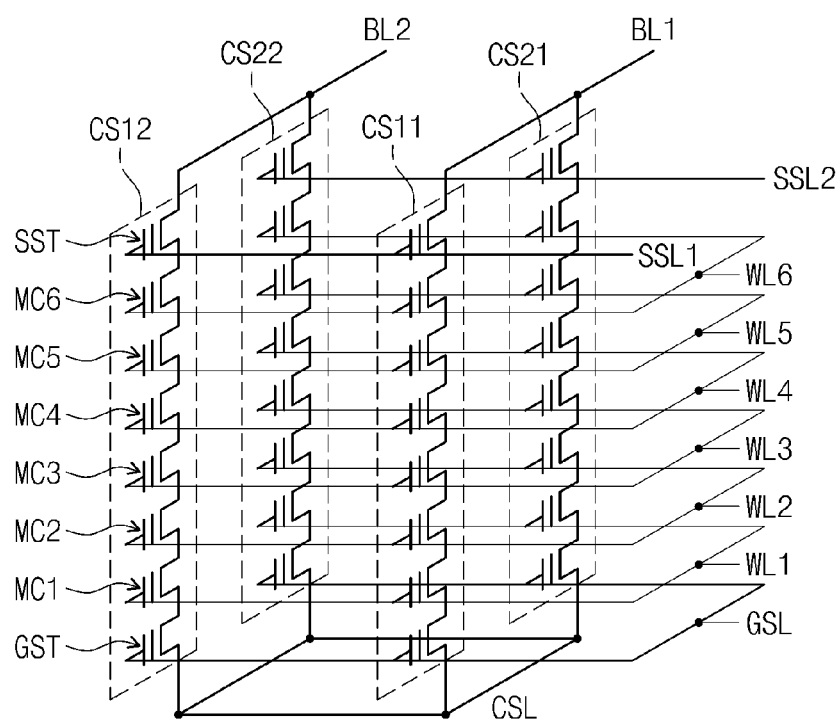
FIG. 8 is a circuit diagram illustrating an equivalent circuit of a part EC of the plan view in FIG. 4 according to at least one example embodiment of the inventive concepts.

FIG. 8 is a circuit diagram illustrating an equivalent circuit of a part EC of the plan view in FIG. 4 according to at least one example embodiment of the inventive concepts. Referring to FIGS. 4-8, cell strings CS11, CS12, CS21, and CS22 may be between bit lines BL1 and BL2 and a common source line CSL. Cell strings CS11 and CS21 may be connected between a first bit line BL1 and the common source line CSL, and cell strings CS12 and CS22 may be connected between a second bit line BL2 and the common source line CSL.

Common source regions CSR may be connected in common to form a common source line CSL. The cell strings CS11, CS12, CS21, and CS22 may correspond to four pillars of a part EC of a plane view in FIG. 4. The four pillars may constitute four cell strings CS11, CS12, CS21, and CS22 together with conductive materials CM1-CM8 and information storage films 116.

According to at least one example embodiment, the first conductive materials CM1 may constitute ground selection transistors GST with the information storage films 116 and the pillars PL. The first conductive materials CM1 may form a ground selection line GSL. The first conductive materials CM1 may be interconnected to form a ground selection line CSL. The second to seventh conductive materials CM2-CM7 may constitute first to sixth memory cells MC1-MC6 with the information storage films 116 and the pillars PL. The second to seventh conductive materials CM2-CM7 may be used as first to sixth word lines WL1-WL6. The second conductive material CM2 may be interconnected to form the first word line WL1. The third conductive material CM3 may be interconnected to form the second word line WL2. The fourth conductive material CM4 may be interconnected to form the third word line WL3. The fifth conductive material CM5 may be interconnected to form the fourth word line WL4. The sixth conductive material CM6 may be interconnected to form the fifth word line WL5. The seventh conductive material CM7 may be interconnected to form the sixth word line WL6.

The eighth conductive materials CM8 may constitute string selection transistors SST with the information storage films 116 and the pillars PL. The eighth conductive materials CM8 may form string selection lines SSL1 and SSL2.

Memory cells of the same height may be connected in common with one word line. When a word line of a specific height is supplied with a voltage, a voltage may be applied to all cell strings CS11, CS12, CS21, and CS22. Cell strings in different rows may be connected with different string selection lines SSL1 and SSL2. The cell strings CS11, CS12, CS21, and CS22 may be selected or unselected by selecting or unselecting the string selection lines SSL1 and SSL2.

For example, cell strings (CS11 and CS12) or (CS21 and CS22) connected with an unselected string selection line SSL1 or SSL2 may be electrically separated from the bit lines BL1 and BL2. Cell strings (CS21 and CS22) or (CS11 and CS12) connected with a selected string selection line SSL2 or SSL1 may be electrically connected with the bit lines BL1 and BL2. The cell strings CS11, CS12, CS21, and CS22 may be connected with the bit lines BL1 and BL2 by a column unit. The cell strings CS11 and CS21 may be connected with the bit line BL1, and the cell strings CS12 and CS22 may be connected with the bit line BL2. The cell strings CS11, CS12, CS21, and CS22 may be selected and unselected by a column unit by selecting and unselecting the bit lines BL1 and BL2.

FIG. 9 is a table illustrating voltages supplied to a memory block at a program operation and a verify operation. Referring to FIGS. 8 and 9, at programming, a first voltage V1 may be applied to a selected bit line, and a second voltage V2 may be applied to an unselected bit line. The first voltage V1 may be a ground voltage VSS, and the second voltage V2 may be a power supply voltage VCC. A first turn-on voltage Von1 may be applied to a selected string selection line and a first turn-off voltage Voff1 may be applied to an unselected string selection line. The first turn-on voltage Von1 may be a power supply voltage VCC. The first turn-off voltage Voff1 may be a ground voltage VSS. A program voltage Vpgm may be supplied to a selected word line and a pass voltage Vpass may be supplied to unselected word lines. A second turn-off voltage Voff2 may be applied to a ground selection line GSL. The second turn-off voltage Voff2 may be a ground voltage VSS.

At a verify, a pre-charge voltage Vpre may be applied to a selected bit line and an unselected bit line may be grounded. For example, the selected bit line may be a bit line connected with program-failed memory cells, and the unselected bit line may be a bit line connected with program-passed memory cells. A second turn-on voltage Von2 may be supplied to a selected string selection line. The second turn-on voltage Von2 may be a non-selection read voltage Vread. A third turn-off voltage Voff3 may be supplied to an unselected string selection line. The third turn-off voltage Voff3 may be a ground voltage VSS. A verification voltage Vvfy may be applied to a selected word line. The non-selection read voltage Vread may be supplied to unselected word lines. A third turn-on voltage Von3 may be supplied to a ground selection line GSL. The third turn-on voltage Von3 may be the non-selection read voltage Vread.

As illustrated in FIGS. 4-8, cross-sectional areas of pillars PL may vary according to a distance from a substrate 111. For example, as a distance from the substrate 111 decreases, cross-sectional areas of the pillars PL may decrease. An electric field may be generated when a program voltage Vpgm is applied to one of conductive materials CM1-CM8. The electric field thus generated may be applied to portions of pillars PL at the same height. The electric field may be distributed to first to third sub insulation films 117-119 of the pillars PL. The electric field distributed to the first sub insulation films 117 may cause Fowler-Nordheim tunneling. This means that memory cells may be programmed due to the electric field distributed to the first sub insulation films 117.

The electric field generated by the program voltage Vpgm may be distributed according to capacitances of the first to third sub insulation films 117-119. As widths of the pillars PL decrease, a ratio of an area of the first sub insulation film 117 to an area of the third sub insulation film 119 may decrease. As the area ratio decreases, a ratio of a capacitance of the first sub insulation film 117 to a capacitance of the third sub insulation film 119 may decrease. As the capacitance ratio decreases, a ratio of an electric field distributed to the first insulation film 117 may increase. When a cross-sectional area of a pillar decreases, the efficiency of the Fowler-Nordheim tunneling may increase. A program speed of memory cells may increase.

Figure 10:
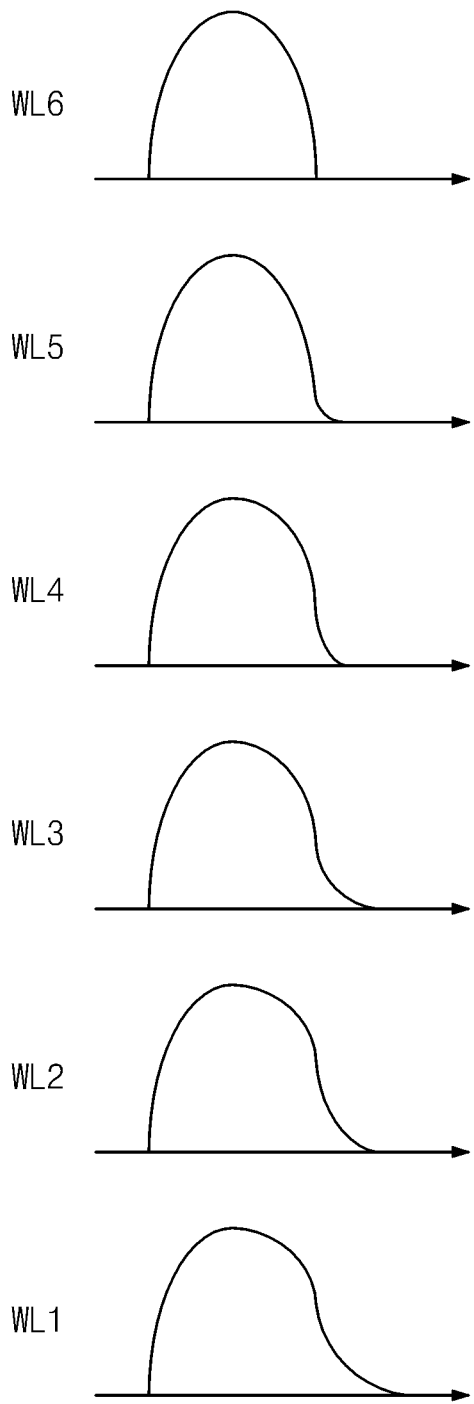
FIG. 10 is a diagram illustrating threshold voltage distributions of memory cells programmed according to the voltages of FIG. 9.

FIG. 10 is a diagram illustrating threshold voltage distributions of memory cells programmed according to the voltages in FIG. 9. In FIG. 10, there are illustrated, for purposes of example, threshold voltage distributions of memory cells MC in word lines WL1-WL6. The closer to a substrate 111, the narrower a width of a pillar PL may be. This means that a program speed of memory cells MC may gradually increase as a word line becomes close to the substrate 111. As illustrated in FIG. 10, the closer to the substrate 111, the wider a tail portion of a threshold voltage distribution may be. This means that a threshold voltage distribution may be widened.

Figures 11, 12:
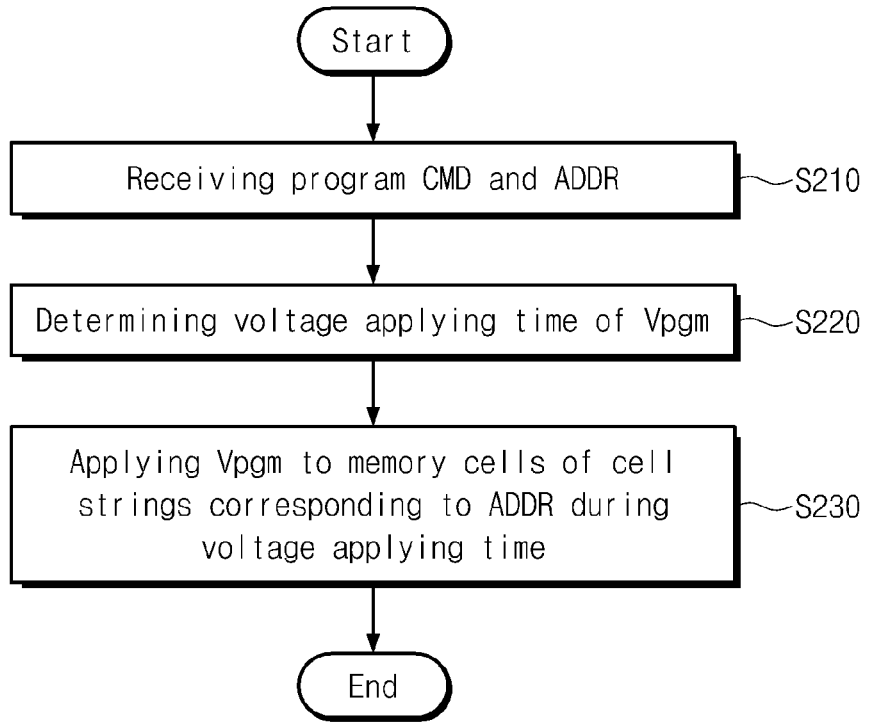
FIG. 11 is a flowchart illustrating program methods according to at least one example embodiment of the inventive concepts.
FIG. 12 is a table illustrating voltage applying times of a program voltage associated with respective word lines.

FIG. 11 is a flowchart illustrating program methods according to at least one example embodiment of the inventive concepts. Referring to FIGS. 2, 8, and 11, in operation S210, a program command CMD and an address ADDR may be received. In operation S220, a voltage applying time of a program voltage Vpgm may be determined.

An applying time controller 160 may reduce a voltage applying time of the program voltage Vpgm when a program speed increases, when an electric field applied to a memory cell to be programmed increases in strength, and when a tunneling current of a memory cell to be programmed increases. For example, the applying time controller 160 may determine a voltage applying time according to widths of pillars PL of memory cells MC corresponding to the input address ADDR. The applying time controller 160 may reduce a voltage applying time of the program voltage Vpgm when widths of pillars PL decrease.

In one cell string, if a distance from a substrate 111 increases, an address for selecting a word line may increase in value. The applying time controller 160 may reduce a voltage applying time of the program voltage Vpgm when a word line address of the input address ADDR decreases.

In one cell string, if a distance from a substrate 111 increases, an address for selecting a word line may decrease in value. The applying time controller 160 may reduce a voltage applying time of the program voltage Vpgm when a word line address of the input address ADDR increases.

The applying time controller 160 may determine a voltage applying time according to the number of memory cells MC stacked between the substrate 111 and a memory cell MC corresponding to the input address ADDR.

As the number of memory cells MC stacked between the substrate 111 and a memory cell MC corresponding to the input address ADDR decreases, a voltage applying time of the program voltage Vpgm may decrease under the control of the applying time controller 160. The applying time controller 160 may determine a voltage applying time based upon a predetermined table. The applying time controller 160 may adjust a voltage applying time adaptively according to a program result.

In operation S230, during the determined voltage applying time, the program voltage Vpgm may be applied to memory cells MC of cell strings corresponding to the input address ADDR. A voltage applying time of the program voltage Vpgm may be determined according to cross-sectional areas of pillars PL corresponding to memory cells MC to be programmed. Different program speeds of the word lines WL1-WL6 may be compensated by adjusting a voltage applying time of the program voltage Vpgm. This may enable a threshold voltage distribution of memory cells to be improved. Reliability of a nonvolatile memory device 100 may be improved.

FIG. 12 is a table illustrating voltage applying times of a program voltage associated with respective word lines. Referring to FIGS. 8 and 12, a voltage applying time corresponding to a sixth word line WL6 may be a time T6. If an input command is a program command and an input address ADDR indicates the sixth word line WL6, an applying time controller 160 may decide/select the time T6 as the voltage applying time.

A voltage applying time corresponding to a fifth word line WL5 may be a time T5. The time T5 may be less than the time T6. A voltage applying time corresponding to a fourth word line WL4 may be a time T4. The time T4 may be less than the time T5. A voltage applying time corresponding to a third word line WL3 may be a time T3. The time T3 may be less than the time T4. A voltage applying time corresponding to a second word line WL2 may be a time T2. The time T2 may be less than the time T3. A voltage applying time corresponding to a first word line WL1 may be a time T1. The time T1 may be less than the time T2.

As illustrated in FIGS. 5 and 6, in the event that a pillar width gradually decreases, the efficiency of the Fowler-Nordheim tunneling may be in inverse proportion to a distance from a substrate 111. As a distance from a substrate 111 decreases, the efficiency of the Fowler-Nordheim tunneling may increase. As a distance from a substrate 111 decreases, a voltage applying time of the program voltage Vpgm may decrease. It may be possible to level program speeds of memory cells within one cell string.

Figure 13:
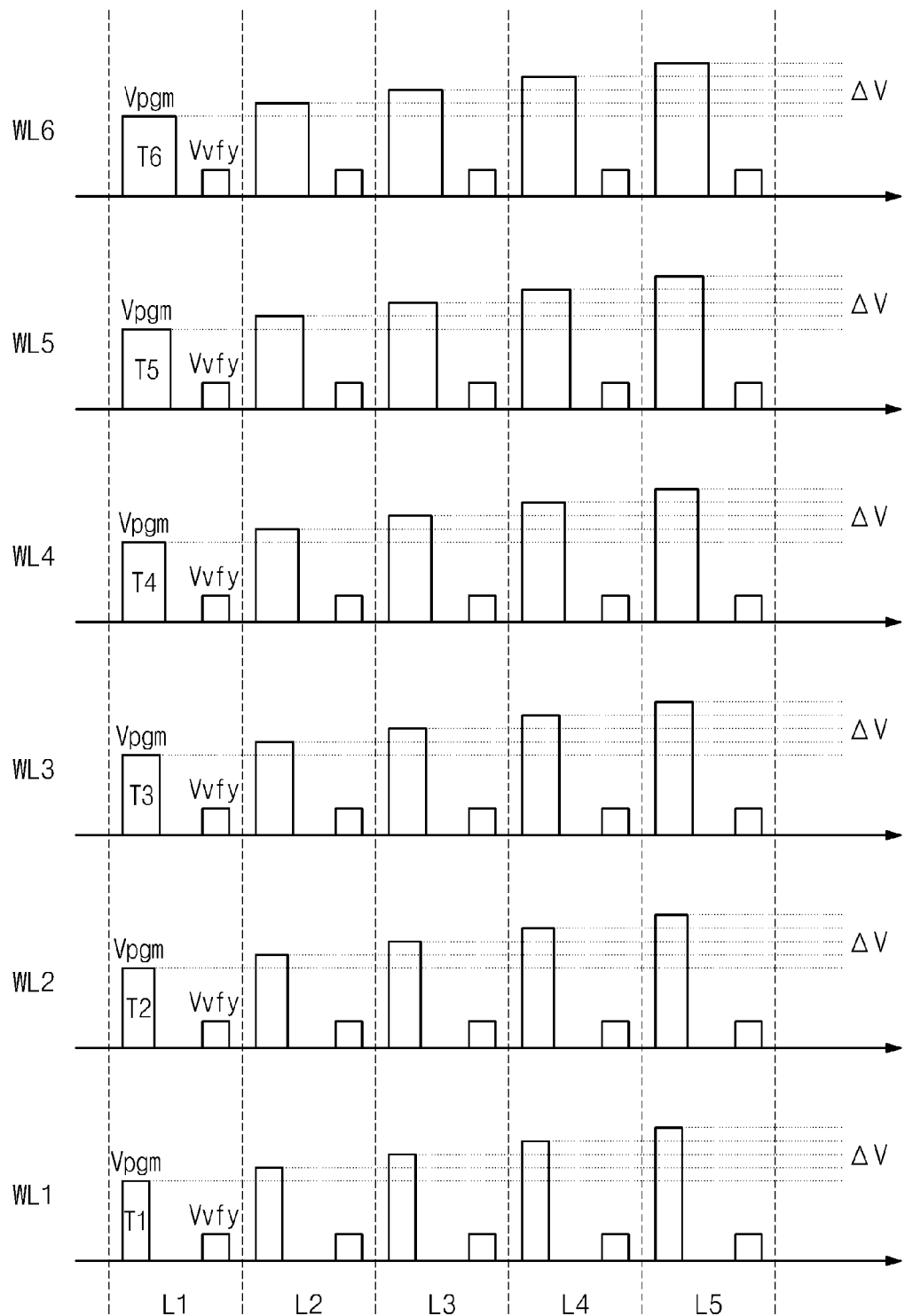
FIG. 13 is a diagram illustrating a program operation of a nonvolatile memory device according to example embodiments of the inventive concepts.

FIG. 13 is a diagram illustrating a program operation of a nonvolatile memory device according to example embodiments of the inventive concepts. As illustrated in FIG. 13, a program operation may be executed under the condition that a voltage applying time varies according a location of a selected word line. Waveforms corresponding to a first word line WL1 may indicate voltages applied to the first word line WL1 when the first word line WL1 is selected. Waveforms corresponding to each of second to sixth word lines WL2-WL6 may indicate voltages applied to each of the second to sixth word lines WL2-WL6 when each of the second to sixth word lines WL2-WL6 may be selected.

At programming, a verification voltage Vvfy may be applied following supplying of a program voltage Vpgm. Consecutive applying of the program and verification voltages Vpgm and Vvfy may form a program loop. At a first program loop L1, a program voltage Vpgm and a verification voltage Vvfy may be consecutively applied to a selected one of the first to sixth word lines WL1-WL6.

The program voltage Vpgm may be applied to the first word line WL1 as the selected word line during a time T1 being a voltage applying time. The program voltage Vpgm may be applied to the second word line WL2 as the selected word line during a time T2 being a voltage applying time. The program voltage Vpgm may be applied to the third word line WL3 as the selected word line during a time T3 being a voltage applying time. The program voltage Vpgm may be applied to the fourth word line WL4 as the selected word line during a time T4 being a voltage applying time. The program voltage Vpgm may be applied to the fifth word line WL5 as the selected word line during a time T5 being a voltage applying time. The program voltage Vpgm may be applied to the sixth word line WL6 as the selected word line during a time T6 being a voltage applying time.

In case of the first to sixth word lines WL1-WL6, a time taken to execute one program loop may be the same. Although voltage applying times about the word lines WL1-WL6 vary, a time between applying of the program voltage Vpgm to a specific word line and applying of the program voltage Vpgm of a next program loop (or, an interval between a start point of a program voltage pulse and a start point of a verify voltage pulse) may be identical. Second to fifth program loops L2-L5 may be executed. A level of the program voltage Vpgm may increase gradually at iteration of program loops. A program operation may be performed according to an incremental step pulse programming (ISPP) manner. An increment of the program voltage Vpgm may be $\Delta V$.

According to at least one example embodiment, the program voltage Vpgm applied to a word line may decrease by $\Delta V$ at iteration of program loops.

Figure 14:
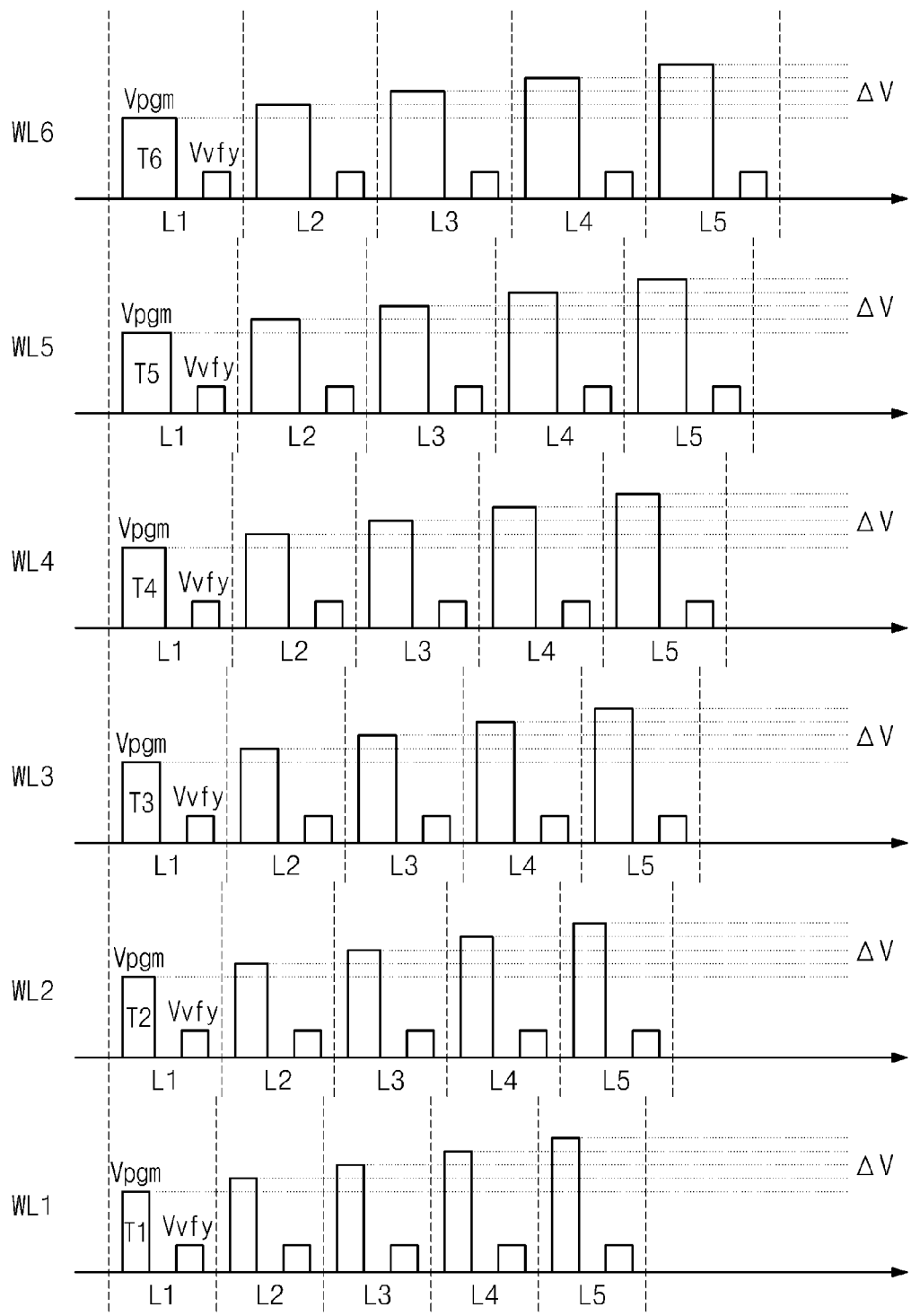
FIG. 14 is a diagram illustrating a program operation of a nonvolatile memory device according to other example embodiments of the inventive concepts.

FIG. 14 is a diagram illustrating a program operation of a nonvolatile memory device according to other example embodiments of the inventive concepts. As illustrated in FIG. 14, a program operation may be executed under the condition that a voltage applying time varies according a location of a selected word line. Waveforms corresponding to each of first to sixth word lines WL1-WL6 may indicate voltages applied to each of the first to sixth word lines WL1-WL6 when each of the first to sixth word lines WL1-WL6 may be selected.

Although voltage applying times with respect to word lines WL1-WL6 vary, a time between discharging of a program voltage Vpgm and applying of a verification voltage Vvfy (or, an interval between an end point of a program voltage pulse and a start point of a verify voltage pulse) may be constant. A time taken to execute a program loop may vary according to voltage applying times about the word lines WL1-WL6. A voltage applying time T1 corresponding to the first word line WL1 may be less than that of T6 corresponding to the sixth word line WL6. A time taken to execute a program loop about WL1 may be less than that taken to execute a program loop about WL6.

The number of program loops about the first to sixth word lines WL1-WL6 may be identical to one another. Programming of memory cells connected with the first word line WL1 may be completed in a shorter period of time as compared with that connected with the sixth word line WL6.

The program voltage Vpgm may increase gradually at iteration of program loops L1 to L5. The program voltage Vpgm may increase by $\Delta V$ at iteration of program loops L1 to L5.

Figure 15:
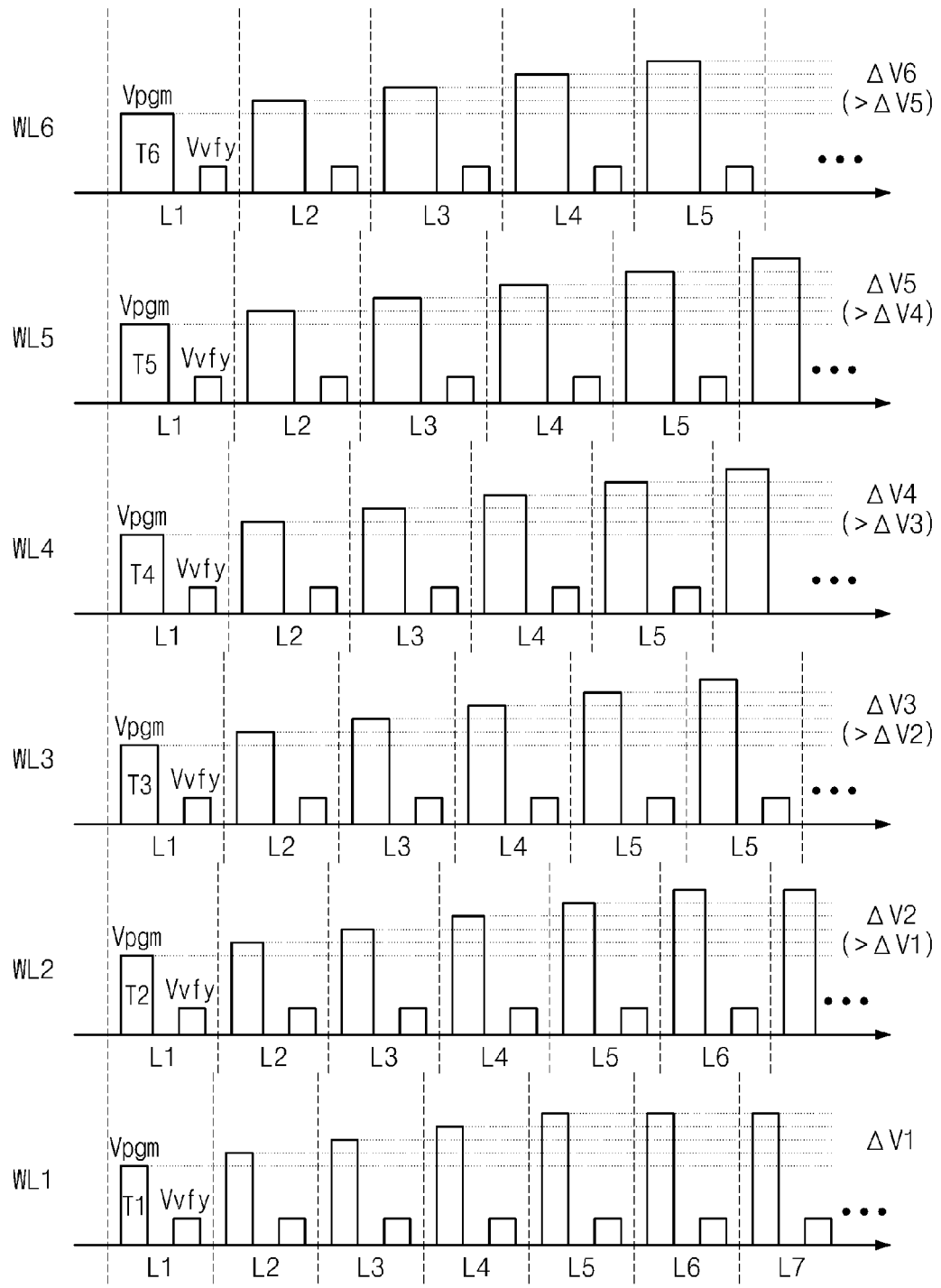
FIG. 15 is a diagram illustrating a program operation of a nonvolatile memory device according to still other example embodiments of the inventive concepts.

FIG. 15 is a diagram illustrating a program operation of a nonvolatile memory device according to still other example embodiments of the inventive concepts. As illustrated in FIG. 15, a program operation may be executed under the condition that a voltage applying time varies according to a location of a selected word line. Waveforms corresponding to each of first to sixth word lines WL1-WL6 may indicate voltages applied to each of the first to sixth word lines WL1-WL6 when each of the first to sixth word lines WL1-WL6 are selected.

Although voltage applying times about word lines WL1-WL6 vary, a time between discharging of a program voltage Vpgm and applying of a verification voltage Vvfy (or, an interval between an end point of a program voltage pulse and a start point of a verify voltage pulse) may be constant. A time taken to execute a program loop may vary according to voltage applying times about the word lines WL1-WL6. A voltage applying time T1 corresponding to the first word line WL1 may be shorter than that T6 corresponding to the sixth word line WL6. A time taken to execute a program loop about the word line WL1 may be shorter than that about the word line WL6.

A specific response time may be allowed until a program command is assigned to a nonvolatile memory device 100 and a program operation is completed. If times taken to execute program loops are different according to the word lines WL1-WL6, the number of program loops capable of being executed during the specific response time may be different according to the word lines WL1-WL6. For example, a maximum program loop number of the first word line WL1 may be more than that of the sixth word line WL6. If a maximum program loop number increases, an increment of a program voltage Vpgm may decrease. This means that a threshold voltage distribution of programmed memory cells MC may be improved. A greater number of program loops at a smaller voltage increment may result in finer programming than fewer loops with larger voltage increments.

In connection with the first word line WL1, first to seventh program loops L1-L7 are illustrated in FIG. 15. A program voltage Vpgm applied to the first word line WL1 may increase by $\Delta V1$ at iteration of program loops.

First to sixth program loops L1-L6 are illustrated in connection with the second word line WL2. A program voltage Vpgm applied to the second word line WL2 may increase ΔV2 at iteration of program loops. The voltage increment ΔV2 may be greater than ΔV1. A maximum number of program loops of the second word line WL2 may be less than that of the first word line WL1. In connection with the third word line WL3, first to fifth program loops L1-L5 are illustrated in FIG. 15. A program voltage Vpgm applied to the third word line WL3 may increase by ΔV3 at iteration of program loops. A voltage increment ΔV3 may be greater than ΔV2. A maximum number of program loops of the third word line WL3 may be less than that of the second word line WL2.

In connection with the fourth word line WL4, first to fifth program loops L1-L5 are illustrated in FIG. 15. A program voltage Vpgm applied to the fourth word line WL4 may increase by ΔV4 at iteration of program loops. A voltage increment ΔV4 may be greater than ΔV3. A maximum number of program loops of the fourth word line WL4 may be less than that of the third word line WL3. First to fifth program loops L1-L5 are illustrated in connection with the fifth word line WL5. A program voltage Vpgm applied to the fifth word line WL5 may increase by ΔV5 at iteration of program loops. A voltage increment ΔV5 may be greater than ΔV4. A maximum number of program loops of the fifth word line WL5 may be less than that of the fourth word line WL4.

In connection with the sixth word line WL6, first to fifth program loops L1-L5 are illustrated in FIG. 15. A program voltage Vpgm applied to the sixth word line WL6 may increase by ΔV6 at iteration of program loops. A voltage increment ΔV6 may be greater than ΔV5. A maximum number of program loops of the sixth word line WL6 may be less than that of the fifth word line WL5.

An applying time controller 160 may judge whether to adjust a voltage applying time of a program voltage Vpgm according to an input address ADDR. For example, if the input address ADDR indicates a least significant bit (LSB), the applying time controller 160 may not adjust a voltage applying time. If the input address ADDR indicates an upper bit of a least significant bit, for example, a central significant bit (CSB) or a most significant bit (MSB), the applying time controller 160 may adjust a voltage applying time. When the input address ADDR indicates a specific program state of the CSB or MSB, the applying time controller 160 may judge whether to adjust a voltage applying time.

FIG. 16 is a table illustrating word line groups according to at least one example embodiment of the inventive concepts. The first to sixth word lines WL1-WL6 may be classified into a plurality of word line groups. A voltage applying time of a program time Vpgm may be varied according to a plurality of word line groups. An example of word line groups is illustrated in FIG. 16.

Referring to FIGS. 8 and 16, first and second word lines WL1 and WL2 may constitute a first word line group. The same program voltage Vpgm may be applied to the first and second word lines WL1 and WL2 of the first word line group. For example, program voltages having the same level, the same voltage applying time, the same increment, and the same program loop number may be applied to the first and second word lines WL1 and WL2. Third and fourth word lines WL3 and WL4 may constitute a second word line group. The same program voltage Vpgm may be applied to the third and fourth word lines WL3 and WL4 of the second word line group. Fifth and sixth word lines WL5 and WL6 may constitute a third word line group. The same program voltage Vpgm may be applied to the fifth and sixth word lines WL5 and WL6 of the third word line group.

Figure 17:
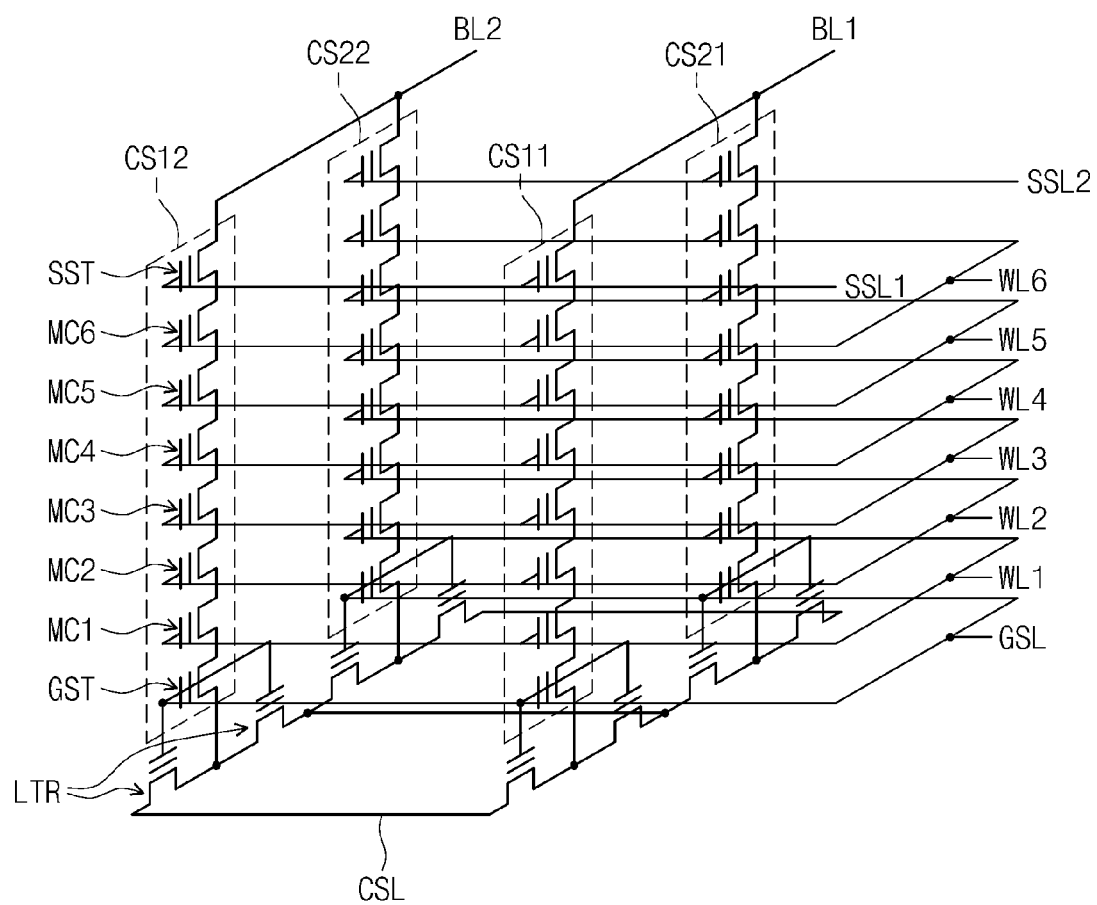
FIG. 17 is a circuit diagram illustrating an equivalent circuit of a part EC of the plan view in FIG. 4 according to other example embodiments of the inventive concepts.

FIG. 17 is a circuit diagram illustrating an equivalent circuit of a part EC of the plan view in FIG. 4 according to other example embodiments of the inventive concepts. An equivalent circuit BLKa2 in FIG. 17 may be different from the equivalent circuit BLKa1 of FIG. 8 in that lateral transistors LTR may be illustrated in each cell string.

Referring to FIGS. 4, 7, and 17, lateral transistors LTR in each cell string may be connected between a ground selection transistor GST and a common source line CSL. Gates of the lateral transistors LTR in each cell string may be connected to a ground selection line GSL together with a gate (or, a control gate) of a ground selection transistor GST.

Channel films 114 may operate as vertical bodies of first conductive materials CM1. The first conductive materials CM1 may constitute vertical transistors together with the channel films 114. The first conductive materials CM1 may constitute ground selection transistors GST adjacent to a substrate 111 together with the channel films 114. Information storage films 116 may be provided between the substrate 111 and the first conductive materials CM1. The substrate 111 may act as a horizontal body of the first conductive materials CM1. The first conductive materials CM1 may be the vertical transistors LTR together with the substrate 111.

When a voltage is applied to the first conductive materials CM1, an electric field may be forced between the first conductive materials CM1 and the channel films 114. The electric field may induce formation of the channels at the channel films 114. When a voltage is applied to the first conductive materials CM1, an electric field may be forced between the first conductive materials CM1 and the substrate 111. The electric field may induce channels at the substrate 111. Channels formed at the substrate 111 may be coupled with common source regions CSR and the channel films 114. When a voltage is applied to the ground selection line GSL, the ground selection transistors GST and the lateral transistors LTR may be turned on. This may facilitate connection of cell strings CS11, CS12, CS21, and CS22 with a common source line CSL.

Figure 18:
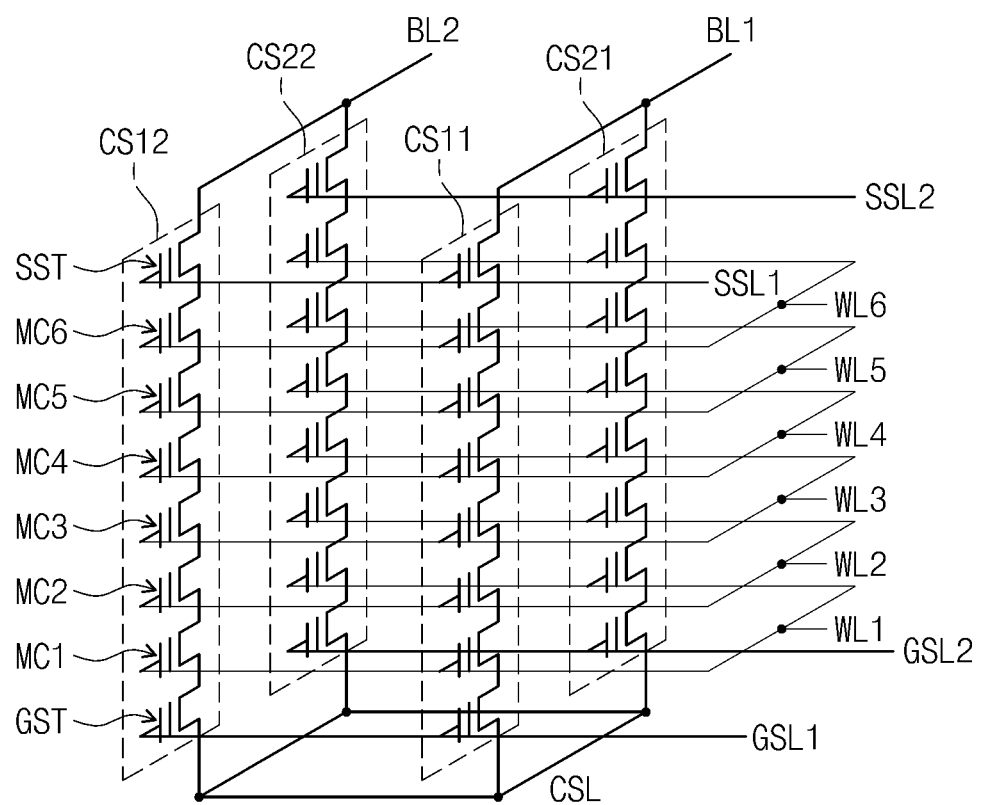
FIG. 18 is a circuit diagram illustrating an equivalent circuit of a part EC of the plan view in FIG. 4 according to still other example embodiments of the inventive concepts.

FIG. 18 is a circuit diagram illustrating an equivalent circuit of a part EC of the plan view in FIG. 4 according to still other example embodiments of the inventive concepts. An equivalent circuit BLKa3 in FIG. 18 may be different from the equivalent circuit BLKa1 of FIG. 8 in that ground selection transistors GST may be connected with first and second ground selection lines GSL1 and GSL2. Referring to FIGS. 4, 7 and 18, first conductive materials CM1 may constitute the first and second ground selection lines GSL1 and GSL2.

Memory cells may be programmed in the same manner as described with reference to FIGS. 11-16. When memory cells MC are programmed, the same voltage may be applied to the first and second ground selection lines GSL1 and GSL2. A turn-off voltage Voff may be applied to the first and second ground selection lines GSL1 and GSL2. As described with reference to FIG. 17, lateral transistors LTR can be provided to the equivalent circuit BLKa3.

Figure 19:
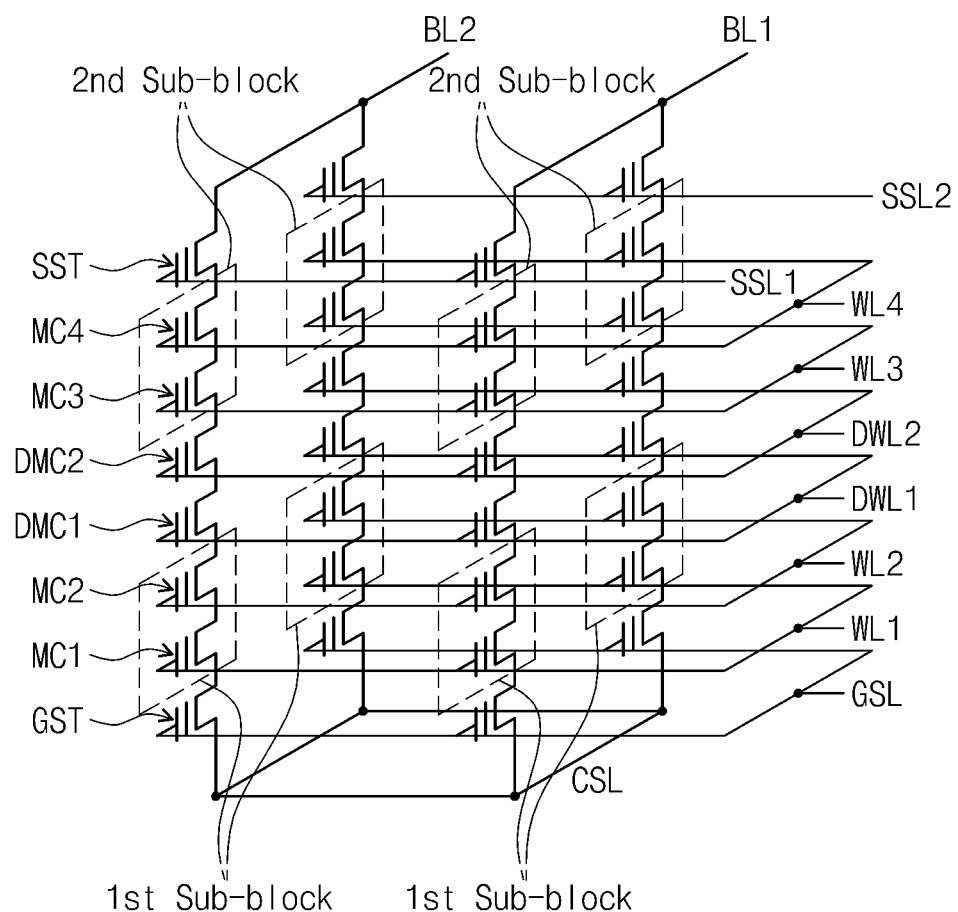
FIG. 19 is a circuit diagram illustrating an equivalent circuit of a part EC of the plan view in FIG. 4 according to yet other example embodiments of the inventive concepts.

FIG. 19 is a circuit diagram illustrating an equivalent circuit of a part EC of the plan view in FIG. 4 according to yet other example embodiments of the inventive concepts. According to at least one example embodiment, in an equivalent circuit BLKa3, second and third conductive materials CM2 and CM3 may constitute first and second memory cells MC1 and MC2, which may be used as a first sub block. Sixth and seventh conductive materials CM6 and CM7 may constitute third and fourth memory cells MC3 and MC4, which may be used as a second sub block. Fourth and fifth conductive materials CM4 and CM5 may constitute first and second dummy memory cells DMC1 and DMC2 between the first and second sub blocks. The first and second sub blocks may be programmed, read, and erased independently from each other.

Memory cells may be programmed in the same manner as described with reference to FIGS. 11-16. As described with reference to FIG. 17, lateral transistors LTR may be provided to the equivalent circuit BLKa4. As described with reference to FIG. 18, a plurality of ground selection lines may be provided to the equivalent circuit BLKa4.

Figures 20, 21:
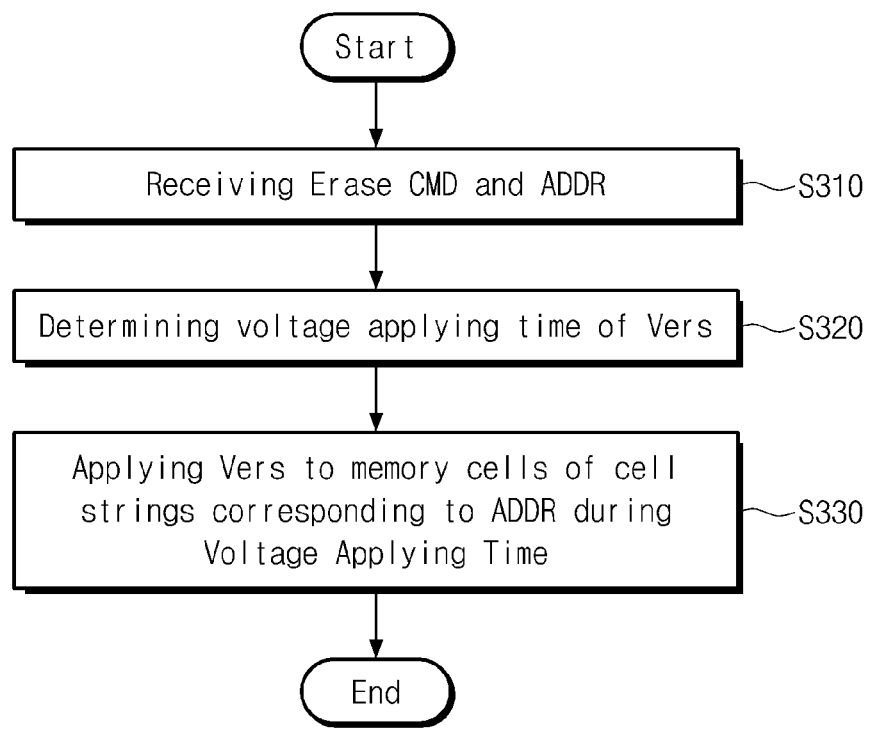
FIG. 20 is a table illustrating voltages supplied to a memory block at an erase operation and an erase-verify operation.
FIG. 21 is a flowchart illustrating erase methods according to at least one example embodiment of the inventive concepts.

FIG. 20 is a table illustrating voltages supplied to a memory block at an erase operation and an erase-verify operation. Referring to FIGS. 4-7, 19, and 20, at an erase operation, bit lines BL1 and BL2 may be floated or supplied with a voltage V4. String selection lines SSL1 and SSL2 may be floated or supplied with a voltage V5. A ground voltage VSS may be applied to word lines WL1-WL6, and a ground selection line GSL may be floated or supplied with a voltage V6. A common source line CSL may be floated or supplied with a voltage V7, and an erase voltage Vers may be supplied to a substrate 111.

At an erase-verify operation, a pre-charge voltage Vpre may be applied to a selected bit line, and a ground voltage GND may be applied to an unselected bit line. For example, the selected bit line may be a bit line connected with erase-failed memory cells, and the unselected bit line may be a bit line connected with erase-passed memory cells. A turn-on voltage Von4 may be supplied to a selected string selection line. The turn-on voltage Von4 may be a non-selection read voltage Vread. A turn-off voltage Voff4 may be supplied to an unselected string selection line. The turn-off voltage Voff4 may be a ground voltage VSS. An erase-verify voltage Vvfye may be provided to word lines WL1-WL6, respectively. A turn-on voltage Von5 may be supplied to a ground selection line GSL. The turn-on voltage Von5 may be the non-selection read voltage Vread. A common source line CSL and a substrate 111 may be grounded.

The erase voltage Vers may be supplied to channel films 114 of pillars PL via the substrate 111. The erase voltage Vers supplied to the channel films 114 may generate an electric field. The electric field thus generated may be distributed to first to third sub insulation films 117-119. The electric field distributed to the first sub insulation film 117 may cause the Fowler-Nordheim tunneling. Memory cells MC may be erased by the electric field distributed to the first sub insulation film 117.

A cross-sectional area of a pillar PL corresponding to a first sub block may be different from that corresponding to a second sub block. For example, a cross-sectional area of a pillar PL corresponding to the first sub block may be less than that corresponding to the second sub block. As a cross-sectional area of a pillar decreases, a ratio of the electric field distributed to the first sub insulation film 117 may increase. The Fowler-Nordheim tunneling may be generated well according to a decrease in a pillar area. This means that an erasing efficiency may be improved. Because a cross-sectional area of a pillar PL corresponding to the first sub block may be different from that corresponding to the second sub block, an erasing efficiency of the first sub block may be different from that of the second sub block. If the same erase voltage Vers is applied to the first and second sub blocks, a tail portion of a threshold voltage distribution of erased memory cells MC may occur.

FIG. 21 is a flowchart illustrating erase methods according to at least one example embodiment of the inventive concepts. Referring to FIGS. 2, 19 and 21, in operation S310, an erase command CMD and an address ADDR may be received. In operation S320, a voltage applying time of an erase voltage Vers may be determined. For example, an applying time controller 160 may determine a voltage applying time according to widths of pillars PL of memory cells corresponding to the input address ADDR. In each cell string, a sub block address may increase when a distance from a substrate 111 increases.

The applying time controller 160 may determine a voltage applying time according to a sub block address of the input address ADDR. The applying time controller 160 may determine a voltage applying time according to the number of sub blocks stacked between a sub block corresponding to the input address ADDR and the substrate 111. In operation S330, during the determined voltage applying time, an erase voltage Vers may be applied to memory cells MC of a sub block corresponding to the input address ADDR.

An erase voltage applying time may be determined according to cross-sectional areas of pillars PL corresponding to memory cells MC to be erased. Different erase speeds of sub blocks may be compensated by adjusting a voltage applying time of the erase voltage Vers. This may facilitate an improved threshold voltage distribution of memory cells. Reliability of a nonvolatile memory device 100 may be improved.

Figures 22, 23:
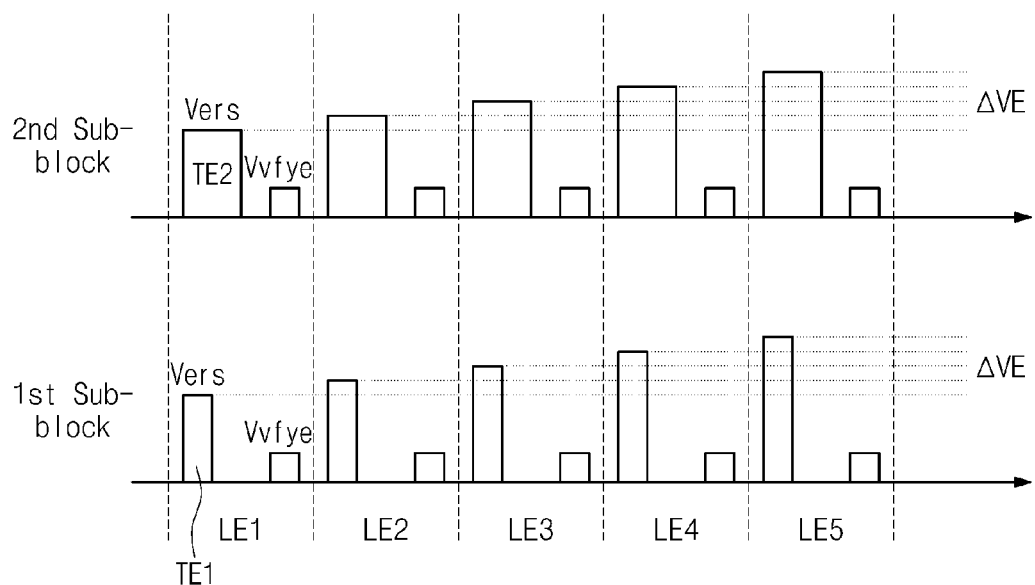
FIG. 22 is a table illustrating a voltage applying time of an erase voltage according to at least one example embodiment of the inventive concepts.
FIG. 23 is a diagram illustrating an erase operation of a nonvolatile memory device according to example embodiments of the inventive concepts.

FIG. 22 is a table illustrating a voltage applying time of an erase voltage according to at least one example embodiment of the inventive concepts. Referring to FIGS. 19 and 22, a second sub block may be erased during an erase time TE2 as a voltage applying time. A first sub block may be erased during an erase time TE1 as a voltage applying time. The erase time TE1 may be less than the erase time TE2. In the event that a pillar width gradually decreases as illustrated in FIGS. 5 and 6, as a distance from a substrate 111 decreases, a Fowler-Nordheim tunneling efficiency of memory cells MC may increase. It may be possible to level erase speeds of memory cells MC in each cell string by increasing/decreasing a voltage applying time of an erase voltage Vers according to an increase/decrease in a distance from the substrate 111.

According to at least one example embodiment, an increment of an erase voltage Vers applied to a sub block may decrease at iteration of erase loops.

FIG. 23 is a diagram illustrating an erase operation of a nonvolatile memory device according to example embodiments of the inventive concepts. As illustrated in FIG. 23, an erase operation may be executed under the condition that a voltage applying time varies according to sub blocks. Waveforms corresponding to a first sub block may indicate voltages applied to memory cells MC of the first sub block when the first sub block is selected. Waveforms corresponding to a second sub block may indicate voltages applied to memory cells MC of the second sub block when the second sub block is selected.

At erasing, applying of an erase-verify voltage Vvfye may follow applying of an erase voltage Vers. Consecutive applying of the erase voltage Vers and the erase-verify voltage Vvfye may constitute an erase loop. At a first erase loop LE1, the erase voltage Vers may be applied to the first and second sub blocks, and then an erase-verify voltage Vvfye may be applied thereto. The first sub block may be supplied with the erase voltage Vers during a first erase time TE1 as a voltage applying time, and the second sub block may be supplied with the erase voltage Vers during a second erase time TE2 as a voltage applying time.

In connection with the first and second sub blocks, a time taken to execute one erase loop may be identical. Although a voltage applying time varies according to sub blocks, an interval between start points of erase voltage pulses of two consecutive erase loops may be identical. Second to fifth erase loops LE2-LE5 may be executed. The erase voltage Vers may increase gradually by an increment $\Delta VE$ at iteration of erase loops. An erase operation may be performed according to an incremental step pulse erasing (ISPE) manner.

Figure 24:
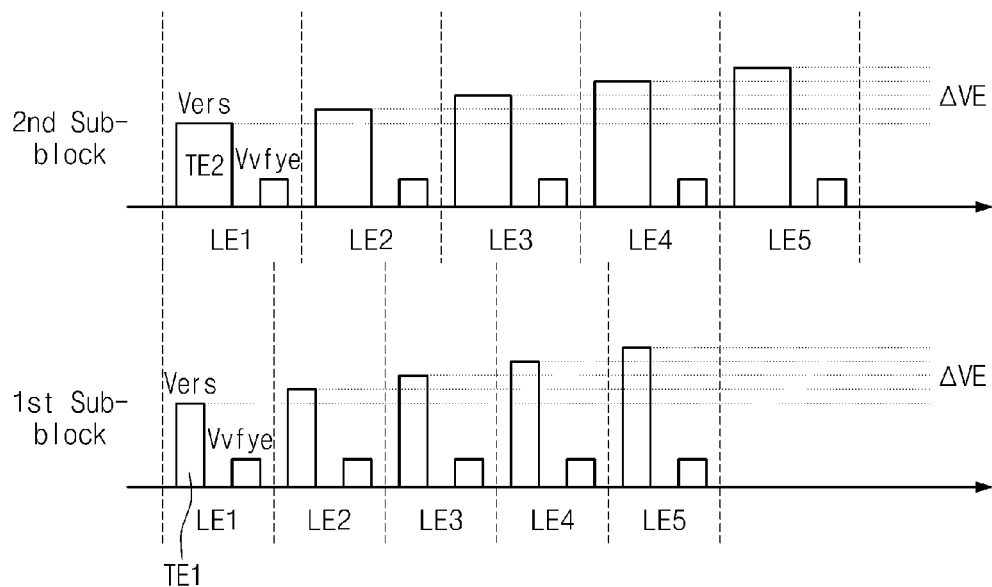
FIG. 24 is a diagram illustrating an erase operation of a nonvolatile memory device according to other example embodiments of the inventive concepts.

FIG. 24 is a diagram illustrating an erase operation of a nonvolatile memory device according to other example embodiments of the inventive concepts. As illustrated in FIG. 24, an erase operation may be executed under the condition that a voltage applying time varies according to sub blocks. Waveforms corresponding to each of first and second sub blocks may indicate voltages applied to memory cells MC of each of the first and second sub blocks when each of the first and second sub blocks is selected. Although a voltage applying time varies according to sub blocks, an interval between an end point of an erase voltage pulse and a start point of an erase-verify voltage pulse in each erase loop may be identical.

A time taken to execute an erase loop may vary according to sub blocks, by varying voltage applying times. A voltage applying time corresponding to the first sub block may be less than that corresponding to the second sub block. An erase loop time of the first sub block may be shorter than that of the second sub block.

An erase loop number of the first sub block may be identical to that of the second sub block. Memory cells MC in the first erase block may be erased quicker as compared with memory cells MC in the second erase block. The erase voltage Vers may increase gradually by an increment ΔVE at iteration of erase loops LE1-LE5.

Figure 25:
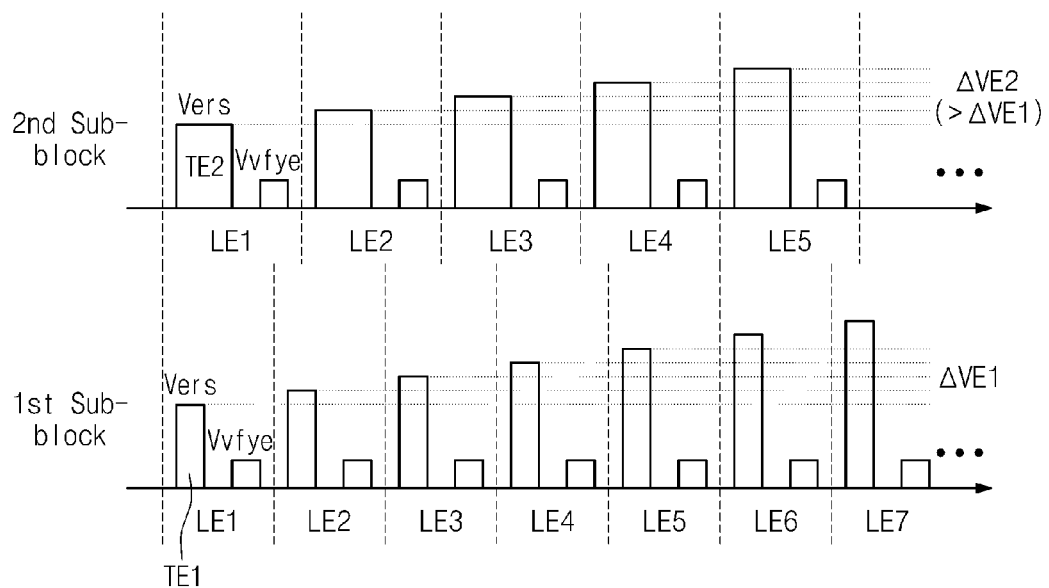
FIG. 25 is a diagram illustrating an erase operation of a nonvolatile memory device according to still other example embodiments of the inventive concepts.

FIG. 25 is a diagram illustrating an erase operation of a nonvolatile memory device according to still other example embodiments of the inventive concepts. As illustrated in FIG. 25, an erase operation may be executed under the condition that a voltage applying time varies according to sub blocks. Waveforms corresponding to each of first and second sub blocks may indicate voltages applied to memory cells MC of each of the first and second sub blocks when each of the first and second sub blocks is selected.

Although a voltage applying time varies according to sub blocks, an interval between an erase voltage pulse and an erase-verify voltage pulse in each erase loop may be identical. A time taken to execute an erase loop may vary according to sub blocks, by variations of voltage applying times. A voltage applying time corresponding to the first sub block may be less than that corresponding to the second sub block. An erase loop time of the first sub block may be less than that of the second sub block.

A specific response time may be allowed until an erase command may be assigned to a nonvolatile memory device 100 and an erase operation is completed. If times taken to execute erase loops are different according to sub blocks, the number of erase loops capable of being executed during the specific response time may be different according to the sub blocks. For example, a maximum erase loop number of the first sub block may be more than that of the second sub block. If a maximum erase loop number increases, an increment of an erase voltage Vers may decrease. A threshold voltage distribution of erased memory cells MC may be improved.

In connection with the first sub block, first to seventh erase loops LE1-LE7 are illustrated in FIG. 25. An erase voltage Vers applied to the first sub block may increase by ΔVE1. In connection with the second sub block, first to fifth erase loops LE1-LE5 are illustrated in FIG. 25. An erase voltage Vers applied to the second sub block may increase by ΔVE2. The increment ΔVE2 may be greater than the increment ΔVE1. A maximum erase loop number of the second sub block may be less than that of the first sub block.

Figure 26:
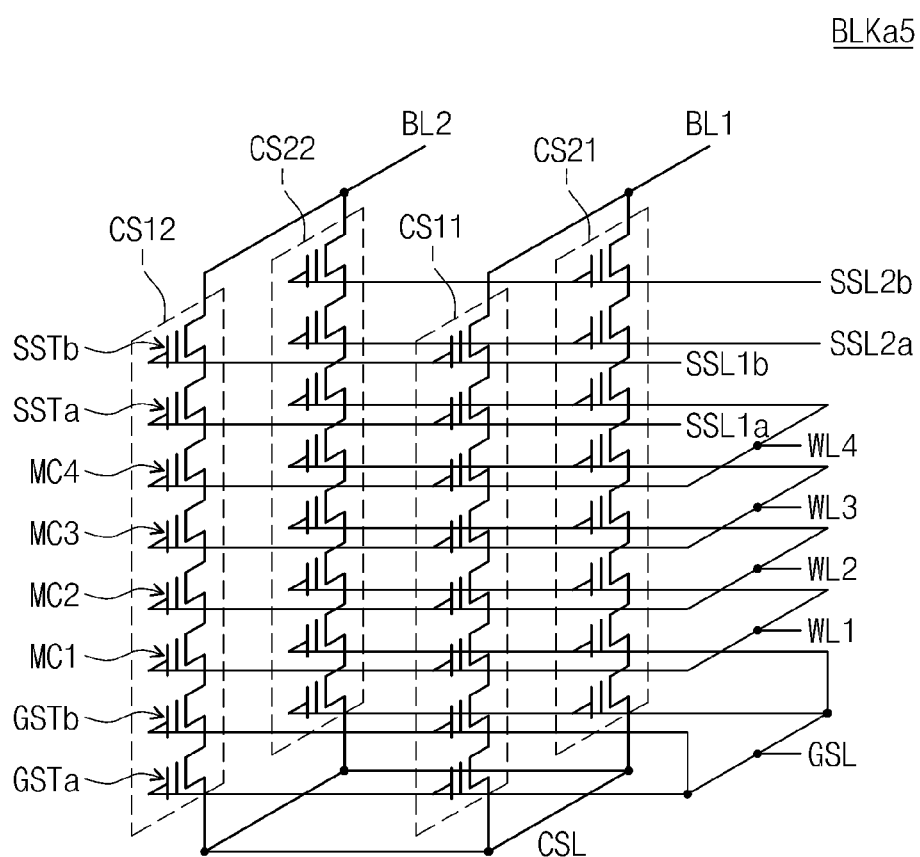
FIG. 26 is a circuit diagram illustrating an equivalent circuit of a part EC of the plan view in FIG. 4 according to further example embodiments of the inventive concepts.

FIG. 26 is a circuit diagram illustrating an equivalent circuit of a part EC of the plan view in FIG. 4 according to further example embodiments of the inventive concepts. Referring to FIGS. 4, 7 and 26, first and second conductive materials CM1 and CM2 may constitute ground selection transistors GSTa and GSTb having first and second heights. Seventh and eighth conductive materials CM7 and CM8 may constitute string selection transistors SSTa and SSTb having seventh and eighth heights. Third to sixth conductive materials CM3-CM6 may constitute first to fourth memory cells MC1-MC4.

The first and second conductive materials CM1 and CM2 may be connected in common to form a ground selection line GSL. The first conductive material CM1 may be connected in common to form a ground selection line having a first height. The second conductive material CM2 may be connected in common to form a ground selection line having a second height. Similar to an equivalent circuit BLKa2 described with reference to FIG. 17, lateral transistors LTR may be provided to the equivalent circuit BLKa5 (not shown). Similar to an equivalent circuit BLKa3 described with reference to FIG. 18, cell strings CS11 and CS12 may be connected with one ground selection line, and cell strings CS21 and CS22 may be connected with another ground selection line. Similar to an equivalent circuit BLKa4 described with reference to FIG. 19, memory cells MC may constitute a plurality of sub blocks.

The cell strings CS11 and CS12 may be connected with two ground selection lines having the first and second heights and including the first and second conductive materials CM1 and CM2. The cell strings CS21 and CS22 may be connected with two ground selection lines having the first and second heights. Conductive materials each corresponding to at least three heights can form ground selection transistors.

The cell strings CS11 and CS12 may be connected with two string selection lines SSL1a and SSL1b having the seventh and eighth heights and including the seventh and eighth conductive materials CM7 and CM8. The cell strings CS21 and CS22 may be connected with two string selection lines SSL2a and SSL2b having the seventh and eighth heights and formed by the seventh and eighth conductive materials CM7 and CM8. Conductive materials each corresponding to at least three heights may form string selection transistors.

Memory cells MC may be programmed according to at least one of the methods described with reference to FIGS. 11-16. Memory cells MC may be erased according to at least one of the methods described with reference to FIGS. 21-25.

Figure 27:
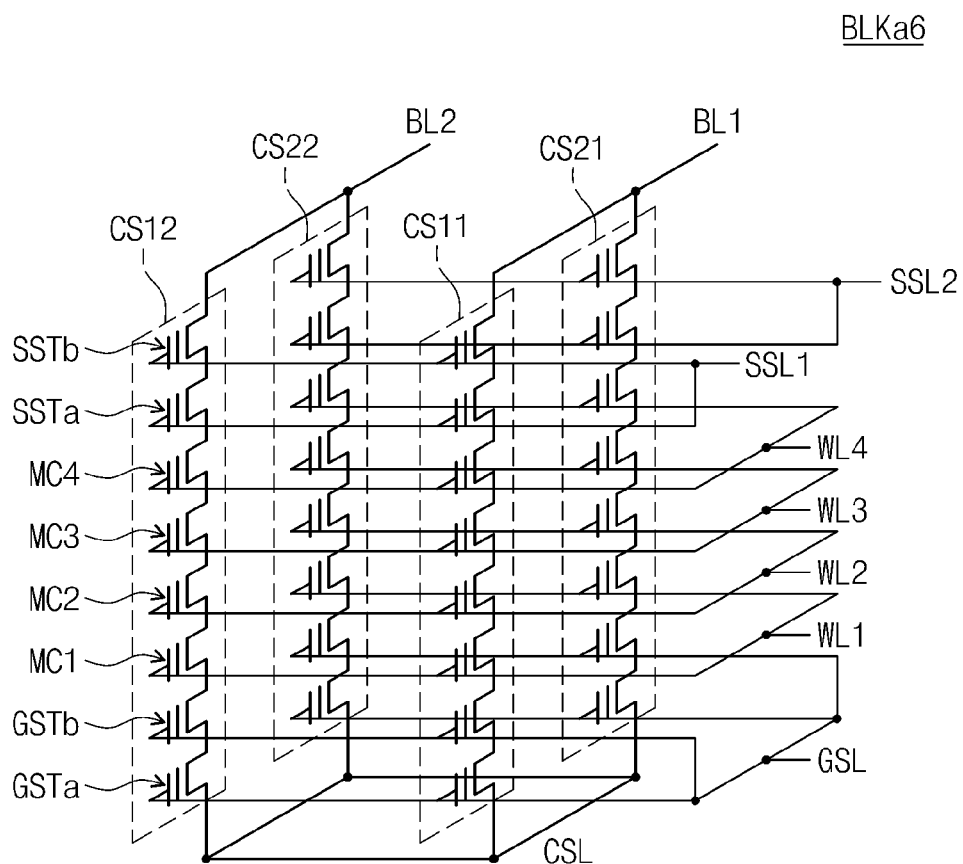
FIG. 27 is a circuit diagram illustrating an equivalent circuit of a part EC of the plan view in FIG. 4 according to yet other example embodiments of the inventive concepts.

FIG. 27 is a circuit diagram illustrating an equivalent circuit of a part EC of the plan view in FIG. 4 according to yet other example embodiments of the inventive concepts. An equivalent circuit BLKa6 in FIG. 27 may be different from BLKa5 of FIG. 26 in that string selection transistors SSTa and SSTb may share a string selection line. String selection transistors SSTa and SSTb in cell strings CS11 and CS12 may be connected in common to a first string selection line SSL1, and string selection transistors SSTa and SSTb in cell strings CS21 and CS22 may be connected in common to a second string selection line SSL2. Similar to an equivalent circuit BLKa2 described with reference to FIG. 17, lateral transistors LTR may be provided to the equivalent circuit BLKa5.

Similar to an equivalent circuit BLKa3 described with reference to FIG. 18, cell strings CS11 and CS12 may be connected with one ground selection line, and cell strings CS21 and CS22 may be connected with another ground selection line. Similar to an equivalent circuit BLKa4 described with reference to FIG. 19, memory cells MC may constitute a plurality of sub blocks. Memory cells MC may be programmed according to at least one method described with reference to FIGS. 11-16. Memory cells MC may be erased according to at least one method described with reference to FIGS. 21-25.

Figure 28:
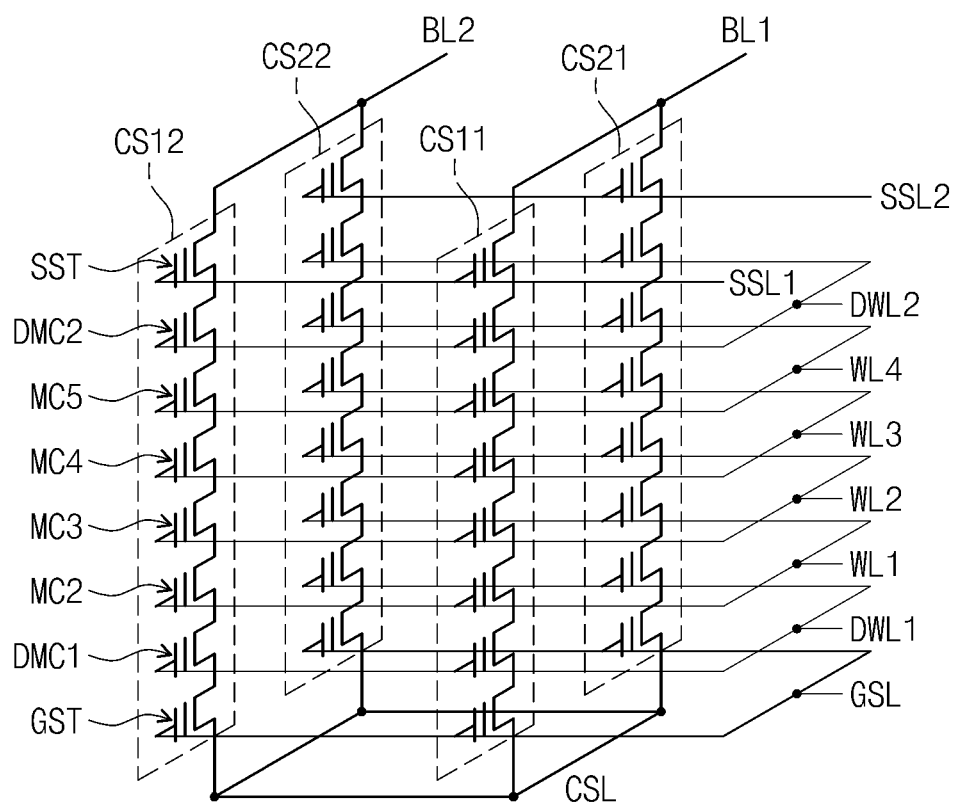
FIG. 28 is a circuit diagram illustrating an equivalent circuit of a part EC of the plan view in FIG. 4 according to yet still other example embodiments of the inventive concepts.

FIG. 28 is a circuit diagram illustrating an equivalent circuit of a part EC of the plan view in FIG. 4 according to yet still other example embodiments of the inventive concepts. Referring to FIGS. 4, 7 and 28, second conductive materials CM2 may constitute first dummy memory cells DMC1 and first dummy word lines DWL1, and seventh conductive materials CM7 may constitute second dummy memory cells DMC2 and second dummy word lines DWL2. Conductive materials corresponding to one or more heights may constitute dummy memory cells disposed between memory cells and a ground selection transistor GST. Conductive materials corresponding to one or more heights may constitute dummy memory cells disposed between memory cells and a string selection transistor SST. Dummy memory cells may be adjacent to any one of the ground and string selection transistors GST and SST.

Similar to an equivalent circuit BLKa2 described with reference to FIG. 17, lateral transistors LTR may be provided to the equivalent circuit BLKa7. Similar to an equivalent circuit BLKa3 described with reference to FIG. 18, cell strings CS11 and CS12 may be connected with one ground selection line, and cell strings CS21 and CS22 may be connected with another ground selection line. Similar to an equivalent circuit BLKa4 described with reference to FIG. 19, memory cells MC may constitute a plurality of sub blocks. Memory cells MC may be programmed according to at least one method described with reference to FIGS. 11-16. Memory cells MC may be erased according to at least one method described with reference to FIGS. 21-25.

Figure 29:
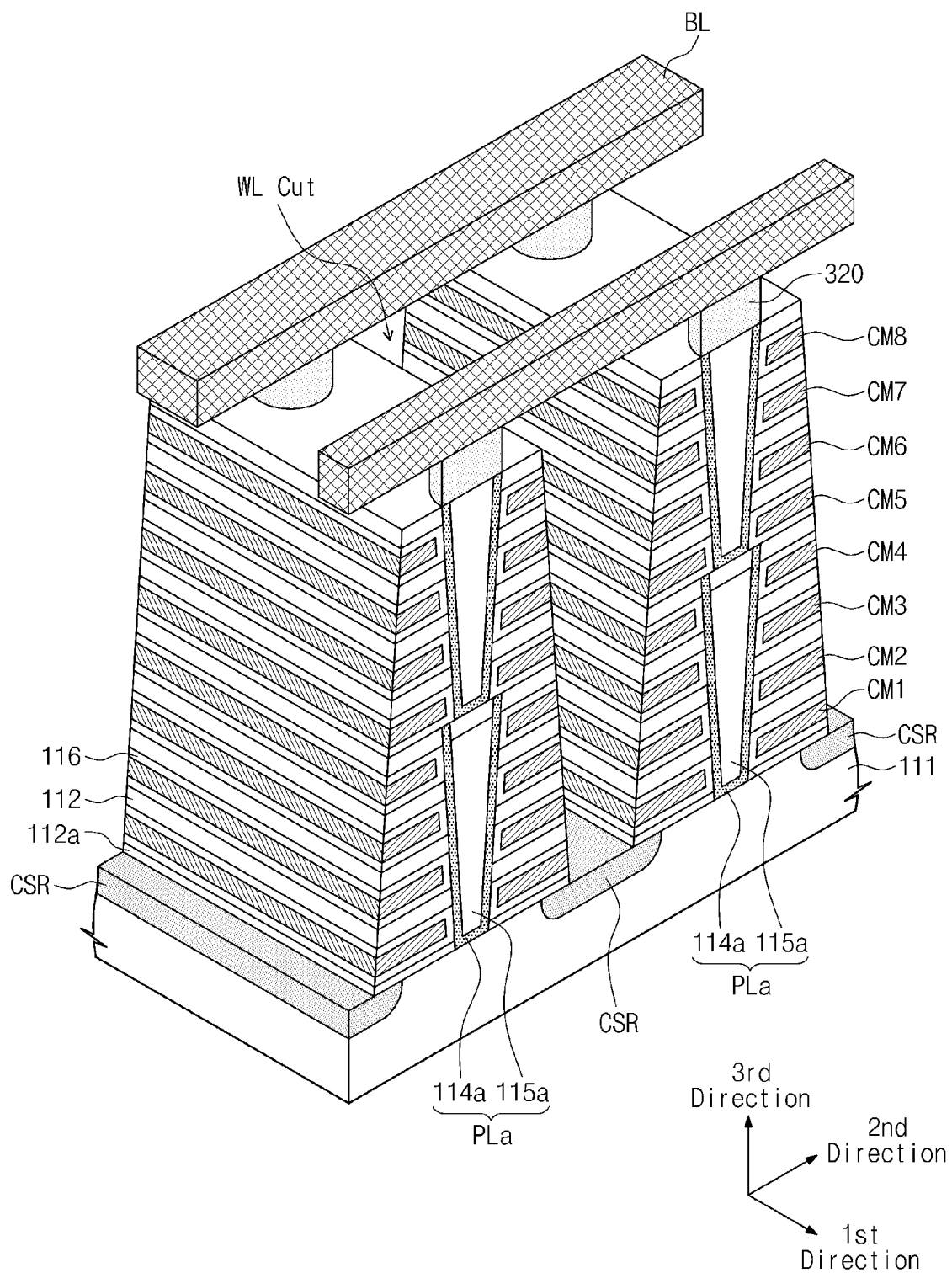
FIG. 29 is a perspective diagram taken along a line V-V' of FIG. 4 according to other example embodiments of the inventive concepts.
Figure 30:
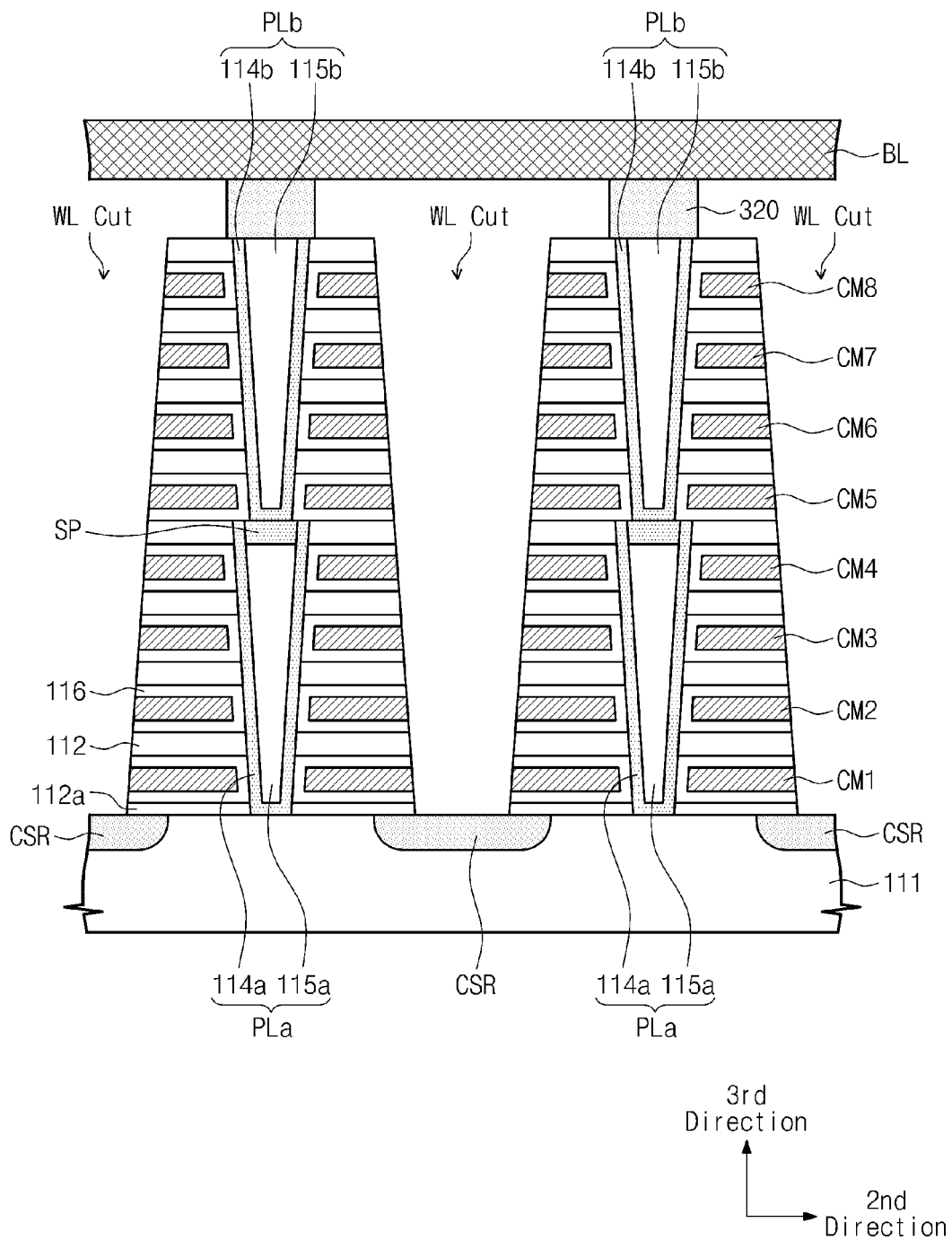
FIG. 30 is a cross-sectional diagram taken along a line V-V' of FIG. 4 according to still other example embodiments of the inventive concepts.

FIG. 29 is a perspective diagram taken along a line V-V' of FIG. 4 according to other example embodiments of the inventive concepts. FIG. 30 is a cross-sectional diagram taken along a line V-V' of FIG. 4 according to still other example embodiments of the inventive concepts. Referring to FIGS. 4, 29 and 30, lower pillars PLa and upper pillars PLb may be stacked in a direction perpendicular to a substrate 111. The lower pillars PLa may penetrate insulation films 112 and 112a along a third direction to contact the substrate 111. Each of the lower pillars PLa may include a lower channel film 114a and a lower inner material 115a. The lower channel films 114a may include a semiconductor material or an intrinsic semiconductor having the same conductivity type as the substrate 111. The lower channel films 114a may act as vertical bodies of first to fourth conductive materials CM1-CM4, respectively. The lower inner materials 115a may include an insulation material.

The upper pillars PLb may be provided on the lower pillars PLa, respectively. The upper pillars PLb may penetrate the insulation films 112 along a third direction to contact with upper surfaces of the lower pillars PLa. Each of the upper pillars PLb may include an upper channel film 114b and an upper inner material 115b. The upper channel films 114b may include a semiconductor material or an intrinsic semiconductor having the same conductivity type as the substrate 111. The upper channel films 114b may act as vertical bodies of fifth to eighth conductive materials CM5-CM8, respectively. The upper inner materials 115b may include an insulation material.

The lower channel films 114a and the upper channel films 114b may be connected to act as a vertical body. For example, semiconductor pads SP may be provided on the lower pillars PLa, respectively. The semiconductor pads SP may include a semiconductor material or an intrinsic semiconductor having the same conductivity type as the lower channel films 114a. The lower channel films 114a and the upper channel films 114b may be interconnected via the semiconductor pads SP.

According to at least one example embodiment, among the first to eighth conductive materials CM1-CM8, conductive materials adjacent to the semiconductor pads SP may constitute dummy word lines and dummy memory cells. For example, the fourth conductive material CM4, the fifth conductive material CM5, or the fourth and fifth conductive materials CM4 and CM5 may constitute dummy word lines and dummy memory cells. An equivalent circuit of a memory block described with reference to FIGS. 4, 29 and 30 may be identical to an equivalent BLKa1 described with reference to FIG. 8.

Figure 31:
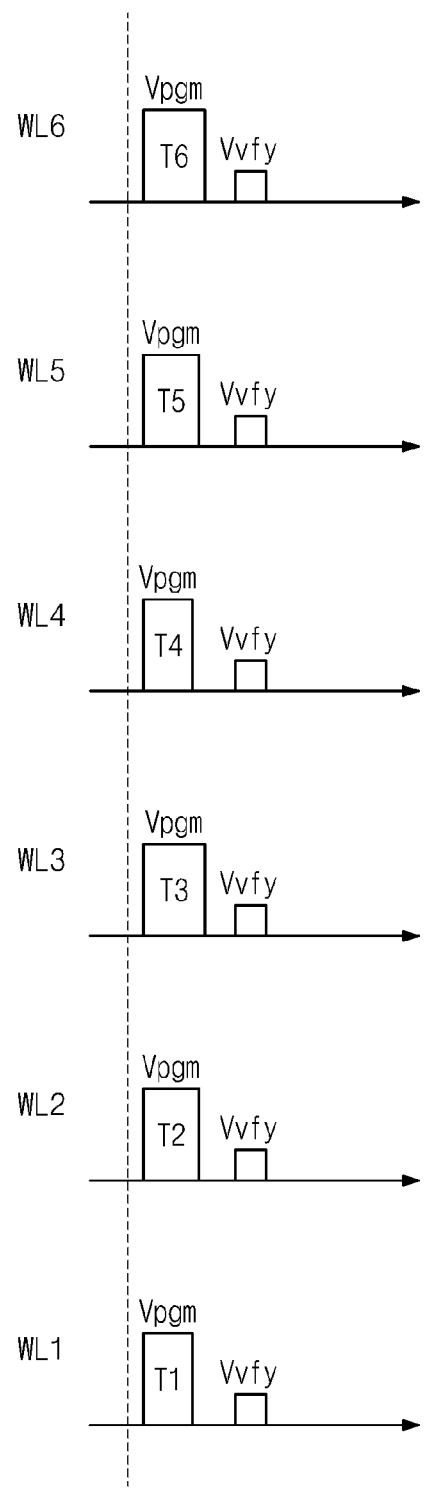
FIG. 31 is a diagram illustrating voltages supplied to a memory block of FIGS. 4, 29 and 30 at a program operation.

FIG. 31 is a diagram illustrating voltages supplied to a memory block in FIGS. 4, 29, and 30 at a program operation. In FIG. 31, waveforms corresponding to each of first to sixth word lines WL1-WL6 may indicate voltages applied to each of the first to sixth word lines WL1-WL6 when each of the first to sixth word lines WL1-WL6 is selected. In FIG. 31, there is illustrated one program loop with respect to each word line as an example.

As illustrated in FIGS. 29 and 30, as a distance from a substrate 111 decreases, a cross-sectional area of pillars PLa and PLb may gradually decrease, increase, and gradually decrease. An applying time controller 160 may control an applying time of a program voltage Vpgm according to cross-sectional areas of pillars PLa and PLb. For example, as a distance between a word line and the substrate 111 becomes close, the applying time controller 160 may gradually decrease, increase, and gradually decrease a voltage applying time of the program voltage Vpgm.

A program voltage Vpgm may be supplied to a sixth word line WL6 during a time T6 as a voltage applying time. The program voltage Vpgm may be supplied to a fifth word line WL5 during a time T5 as a voltage applying time. The time T5 may be less than the time T6. The program voltage Vpgm may be supplied to a fourth word line WL4 during a time T4 as a voltage applying time. The time T4 may be less than the time T5. The program voltage Vpgm may be supplied to a third word line WL3 during a time T3 as a voltage applying time. The program voltage Vpgm may be supplied to a second word line WL2 during a time T2 as a voltage applying time. The program voltage Vpgm may be supplied to a first word line WL1 during a time T1 as a voltage applying time.

A voltage applying time of the first word line WL1 may be identical to that of the fourth word line WL4, a voltage applying time of the second word line WL2 may be identical to that of the fifth word line WL5, and a voltage applying time of the third word line WL3 may be identical to that of the sixth word line WL6. The voltage applying times may satisfy, for example, $T1=T4<T2=T5<T3=T6$. As described with reference to FIG. 14, a program loop time may be differentiated according to word lines. As described with reference to FIG. 15, an increment of a program voltage Vpgm may be differentiated according to word lines.

Figure 32:
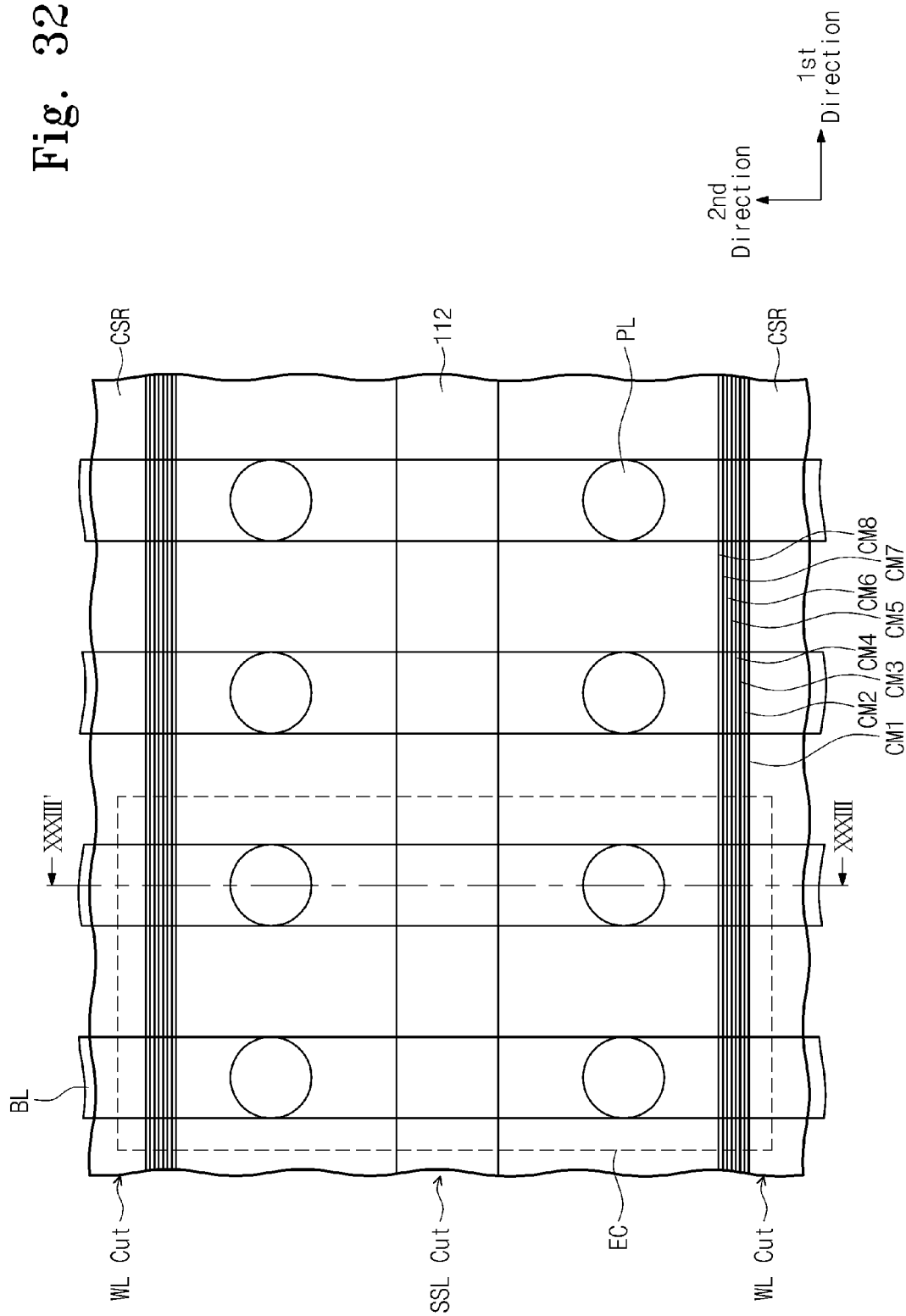
FIG. 32 is a plan diagram illustrating one of memory blocks of FIG. 3 according to further example embodiments of the inventive concepts.
Figure 33:
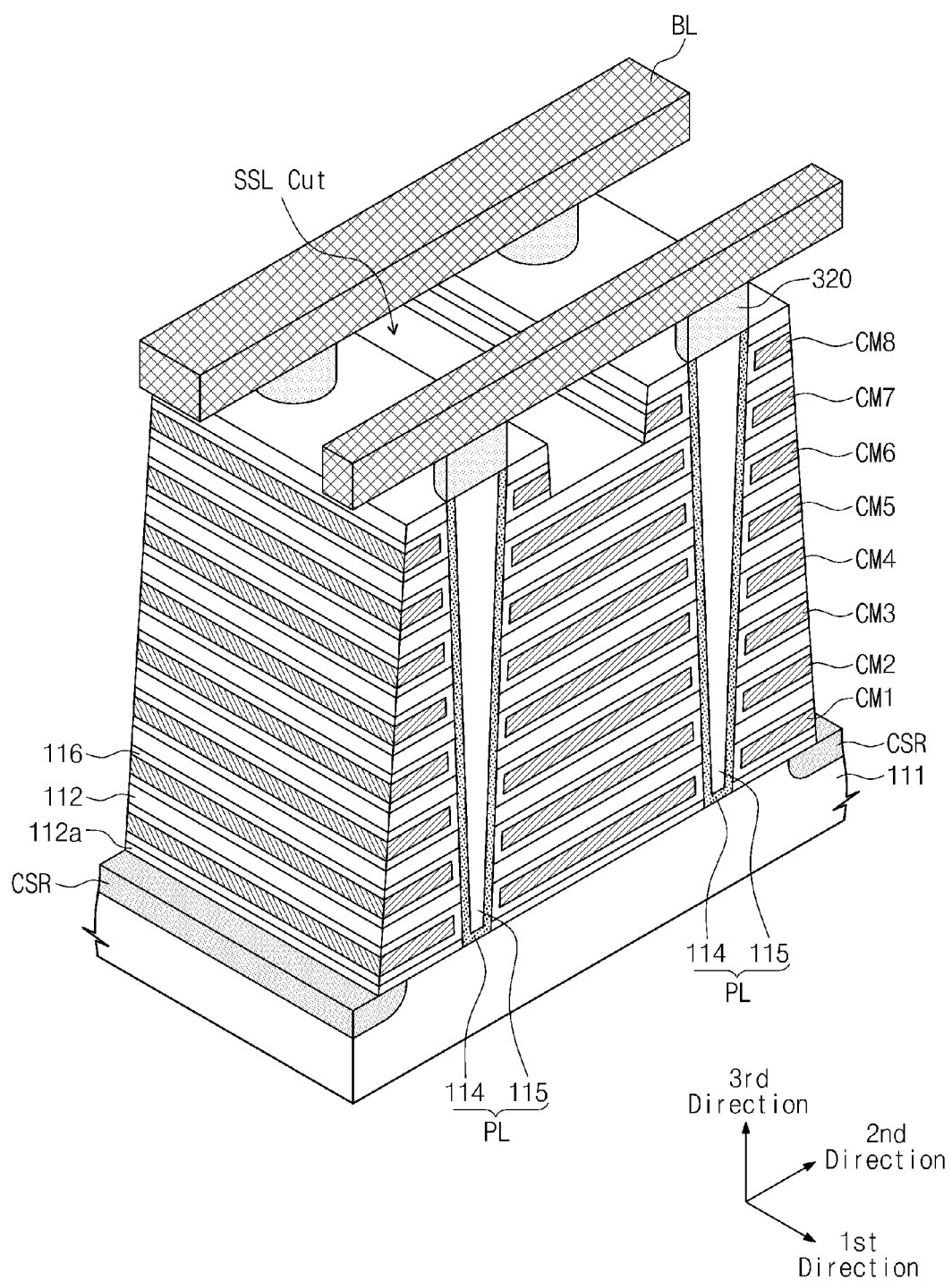
FIG. 33 is a perspective diagram taken along a line XXXIII-XXXIII' of FIG. 32.
Figure 34:
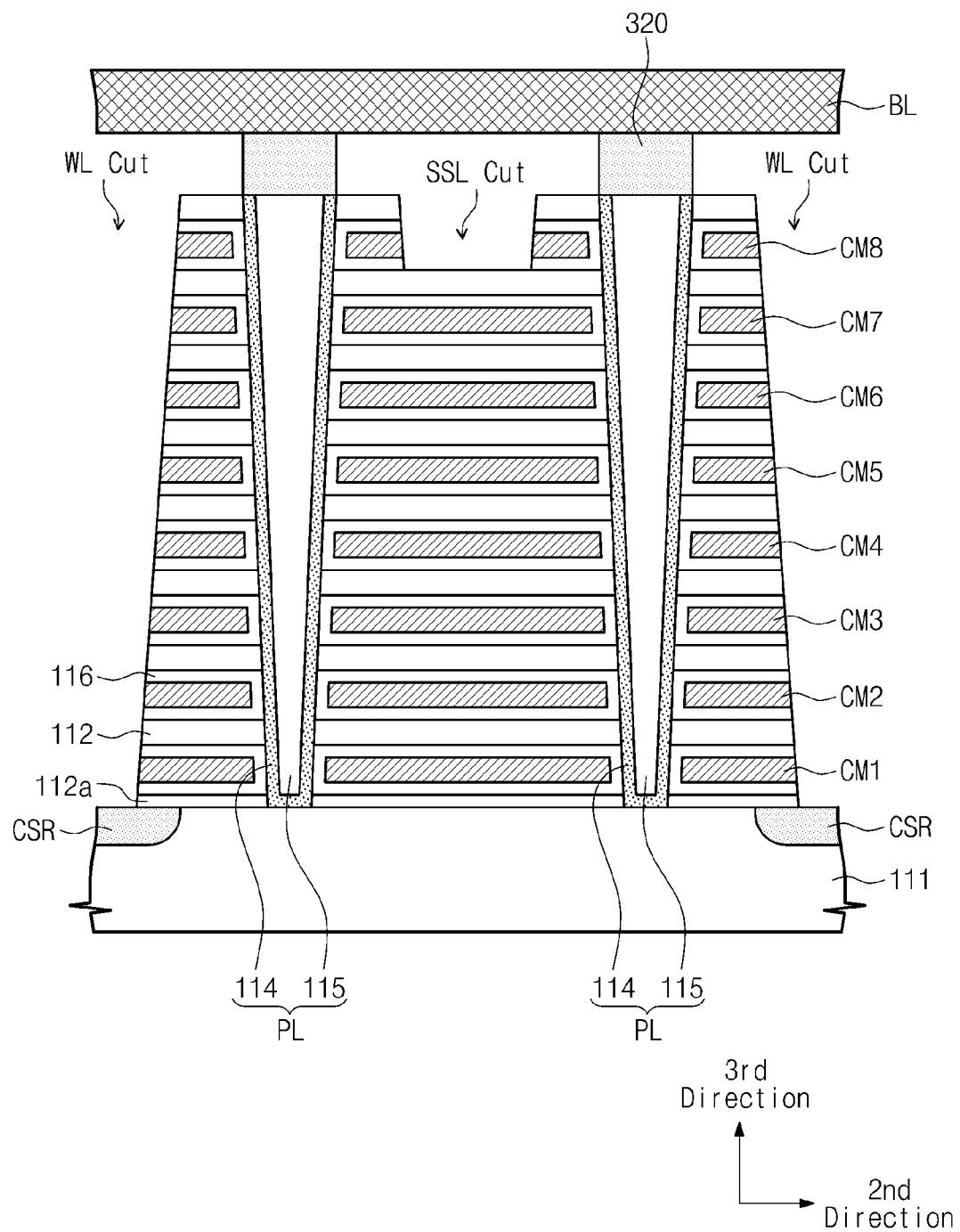
FIG. 34 is a cross-sectional diagram taken along a line XXXIII-XXXIII' of FIG. 32.

FIG. 32 is a plan diagram illustrating one of memory blocks of FIG. 3 according to further example embodiments of the inventive concepts. FIG. 33 is a perspective diagram taken along a line XXXIII-XXXIII' of FIG. 32. FIG. 34 is a cross-sectional diagram taken along a line XXXIII-XXXIII' of FIG. 32. As compared with a memory block BLKa described with reference to FIGS. 4-7, a string selection line cut SSL Cut and a word line cut WL Cut extending along a first direction may be provided in turn in a second direction. Common source regions CSR may be provided at a substrate 111 exposed by the word line cuts WL Cut.

Pillars PL may be in two lines along the first direction between two adjacent common source regions CSR, that is, two adjacent word line cuts WL Cut. The string selection line cut SSL Cut may be formed between two lines of pillars PL. The string selection line cut SSL Cut may separate eighth conductive lines CM8 constituting string selection transistors SST. When conductive lines of two or more heights constitute string selection transistors SST, the string selection line cut SSL Cut may separate conductive materials of two or more heights.

According to at least one example embodiment, pillars PL may be lower pillars and upper pillars as described in FIGS. 29 and 30. A part EC of a plan diagram in FIG. 32 may correspond to one of above-described equivalent circuits BLKa1-BLKa7. Memory cells MC may be programmed according to at least one method described with reference to FIGS. 11-16 or FIG. 31. Memory cells MC may be erased according to at least one method described with reference to FIGS. 21-25.

Figure 35:
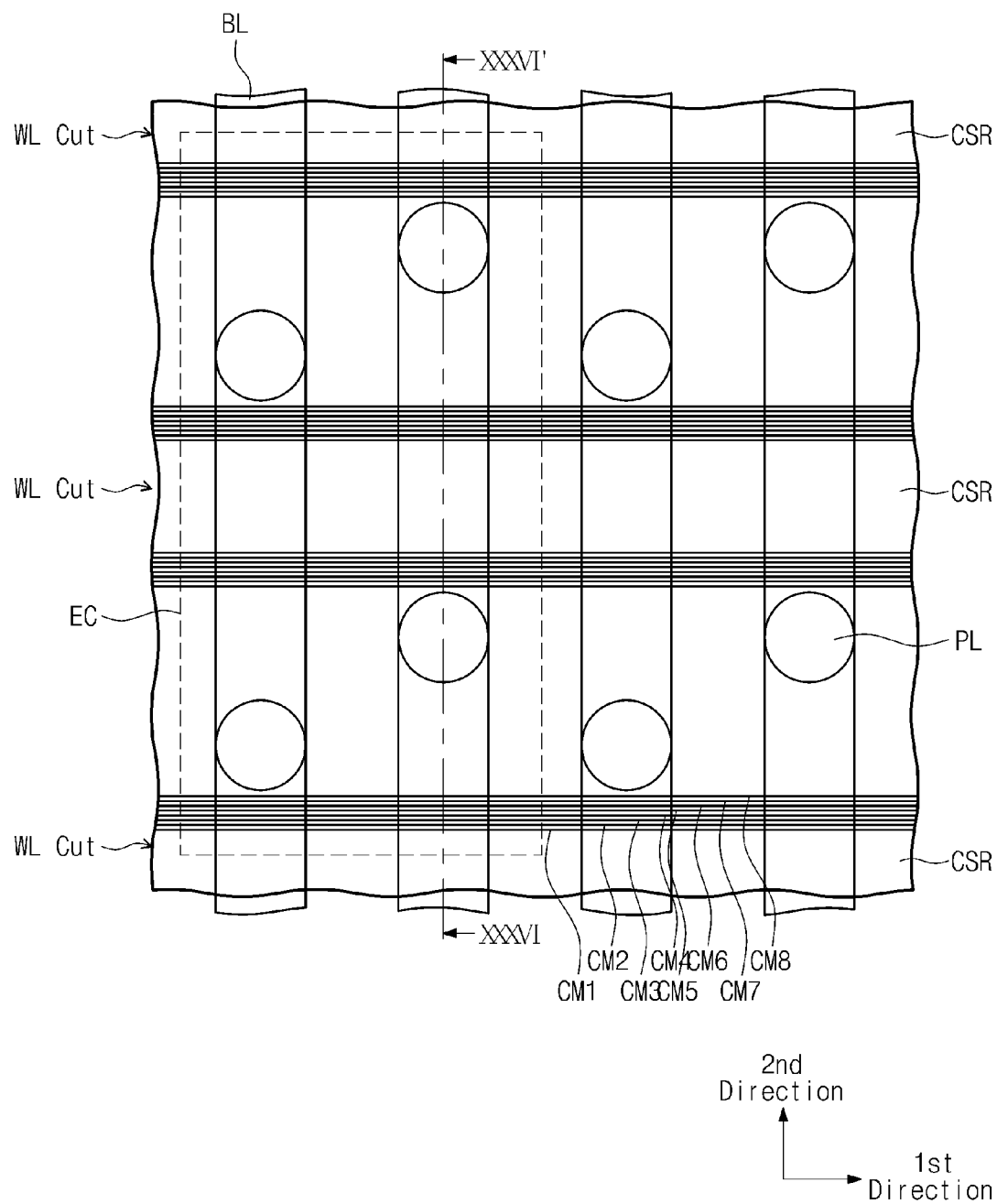
FIG. 35 is a plan diagram illustrating a memory block of FIG. 3 according to still further example embodiments of the inventive concepts.
Figure 36:
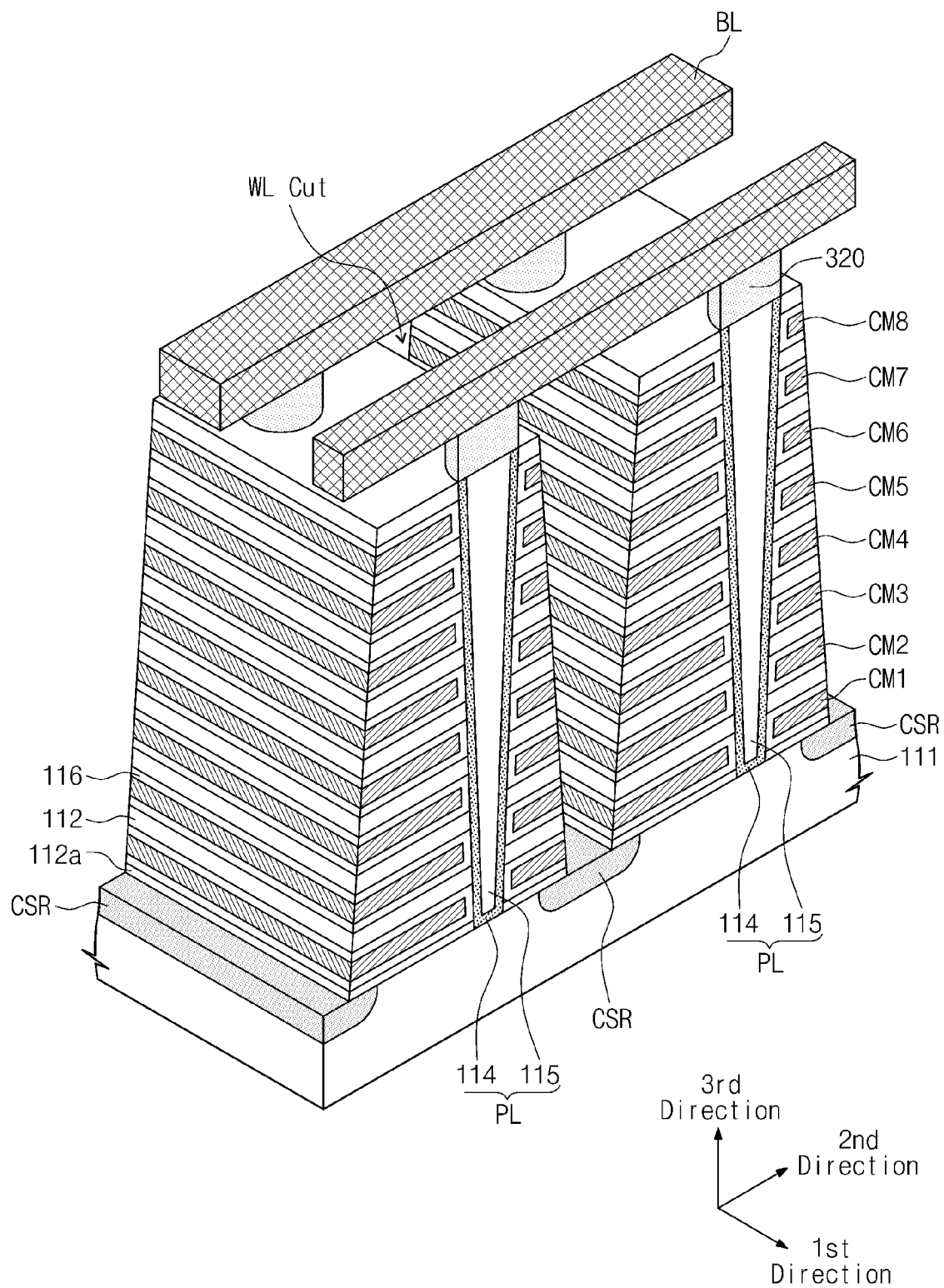
FIG. 36 is a perspective diagram taken along a line XXXVI-XXXVI' of FIG. 35.
Figure 37:
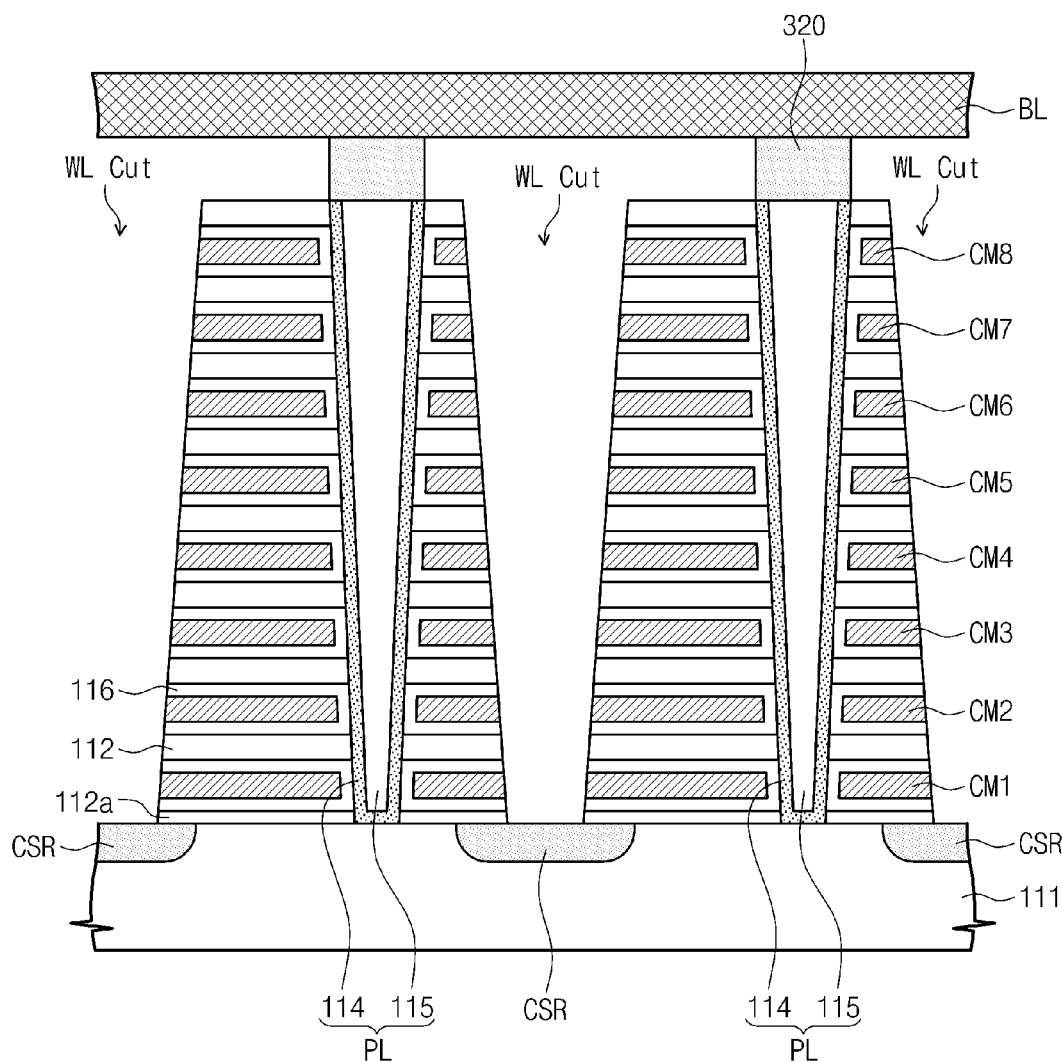
FIG. 37 is a cross-sectional diagram taken along a line XXXVI-XXXVI' of FIG. 35.

FIG. 35 is a plan diagram illustrating a memory block of FIG. 3 according to still further example embodiments of the inventive concepts. FIG. 36 is a perspective diagram taken along a line XXXVI-XXXVI' of FIG. 35. FIG. 37 is a cross-sectional diagram taken along a line XXXVI-XXXVI' of FIG. 35. As compared with a memory block BLKa described in FIGS. 4-7, pillars provided between adjacent common source regions may be disposed in a zigzag pattern along a first direction.

As described with respect to FIGS. 29 and 30, pillars PL may be lower pillars and upper pillars. As described in FIGS. 32 to 34, a string selection line cut SSL Cut may be provided. One line of pillars disposed in a zigzag shape along the first direction may be provided between word line and string selection line cuts WL Cut and SSL Cut which may be adjacent to each other. A part EC of the plan diagram in FIG. 35 may correspond to one of above-described equivalent circuits BLKa1-BLKa7. Memory cells MC may be programmed according to at least one method described with reference to FIGS. 11-16 or FIG. 31. Memory cells MC may be erased according to at least one method described with reference to FIGS. 21-25.

Figure 38:
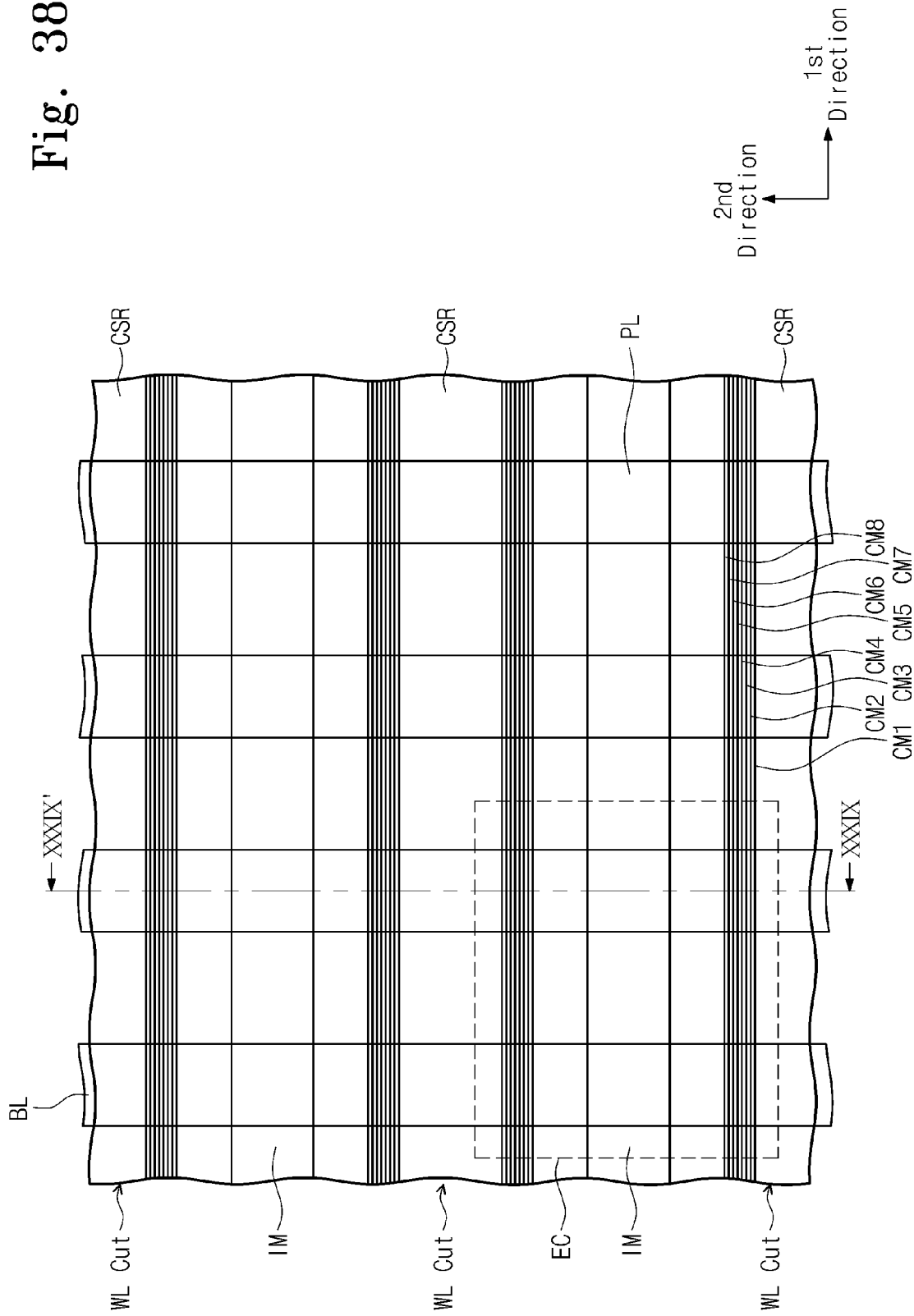
FIG. 38 is a plan diagram illustrating a memory block of FIG. 3 according to yet still other example embodiments of the inventive concepts.
Figure 39:
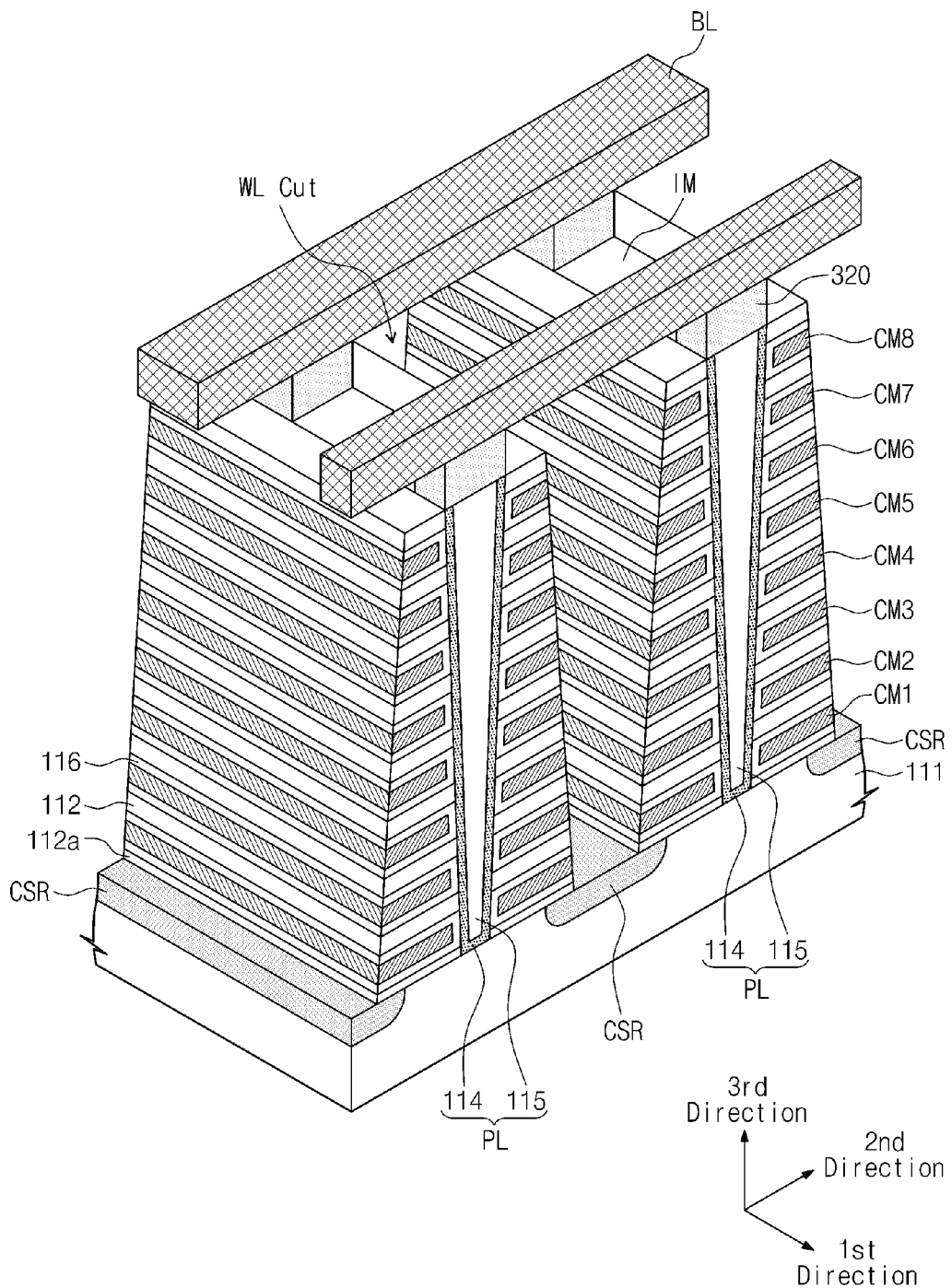
FIG. 39 is a perspective diagram taken along a line XXXIX-XXXIX' of FIG. 38.

FIG. 38 is a plan diagram illustrating a memory block of FIG. 3 according to yet still other example embodiments of the inventive concepts. FIG. 39 is a perspective diagram taken along a line XXXIX-XXXIX' of FIG. 38. A cross-sectional diagram taken along a line XXXIX-XXXIX' in FIG. 38 may be identical to that in FIG. 6, and description thereof may be omitted. As compared with a memory block BLKa described in FIGS. 4-6, a memory block may include square pillars PL. Insulation materials IM may be provided between pillars PL disposed in a line along a first direction between adjacent common source regions CSR. The insulation materials IM may extend along a third direction so as to contact with a substrate 111.

Each of the pillars PL may include a channel film 114 and an inner material 115. For example, the channel film 114 may be provided on two sides adjacent to conductive materials CM1-CM8 among four sides of a corresponding pillar, and not surrounding the corresponding pillar. A channel film on one side of each pillar may constitute a cell string together with conductive materials CM1-CM8 and information storage films 116. A channel film on the other side of each pillar may constitute another cell string together with conductive materials CM1-CM8 and information storage films 116. One pillar may be used to form two cell strings.

As described in FIGS. 29 and 30, pillars PL may be formed of lower pillars and upper pillars. As described in FIGS. 32 to 34, a string selection line cut SSL Cut may be provided. As described in FIGS. 35 to 37, pillars PL may be disposed in a zigzag pattern along the first direction. A part EC of a plane diagram in FIG. 38 may correspond to one of above-described equivalent circuits BLKa1-BLKa7. Memory cells MC may be programmed according to at least one method described with reference to FIGS. 110-16 or FIG. 31. Memory cells MC may be erased according to at least one method described with reference to FIGS. 21-25.

Figure 40:
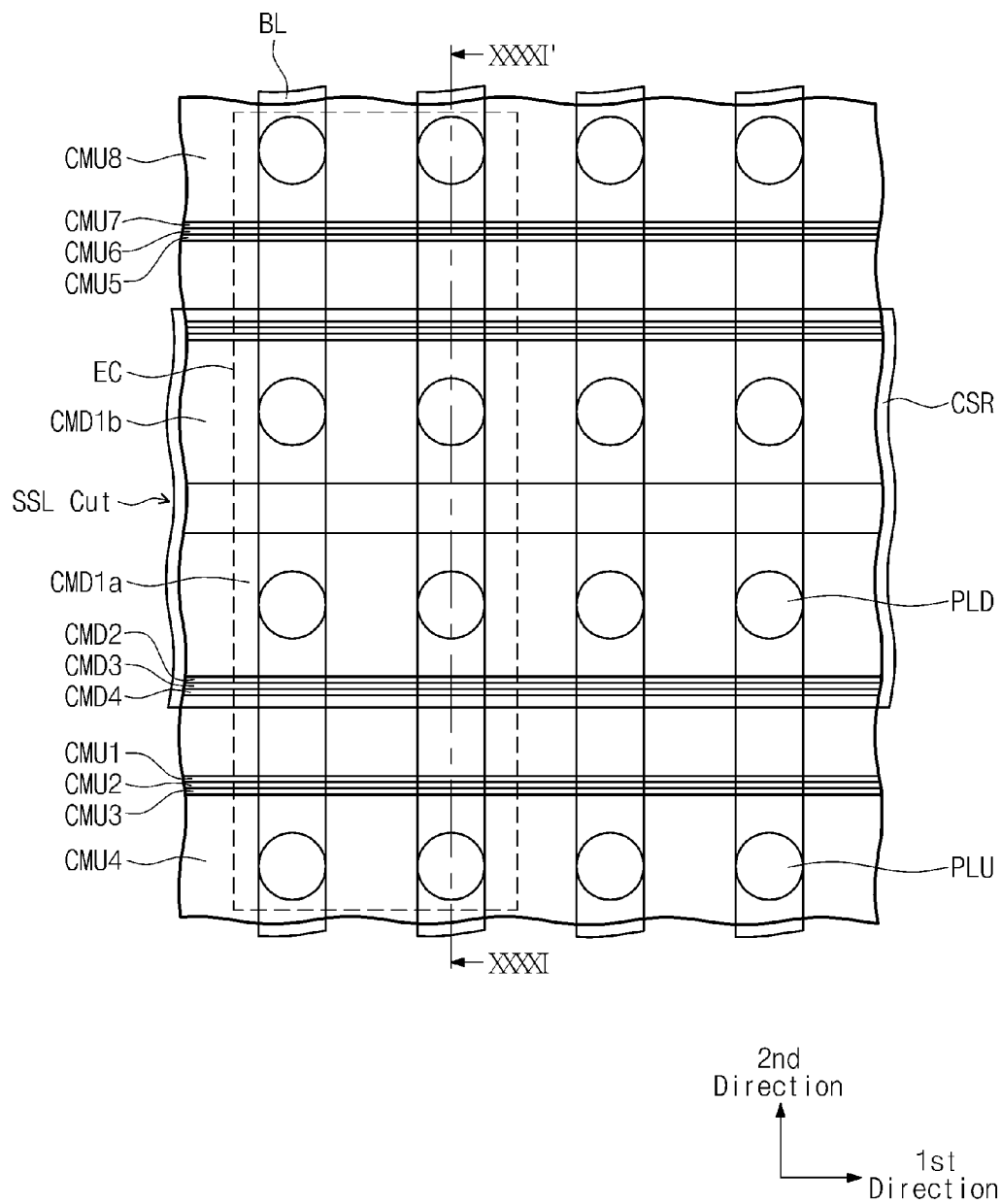
FIG. 40 is a plan diagram illustrating a memory block of FIG. 3 according to still yet other example embodiments of the inventive concepts.
Figure 41:
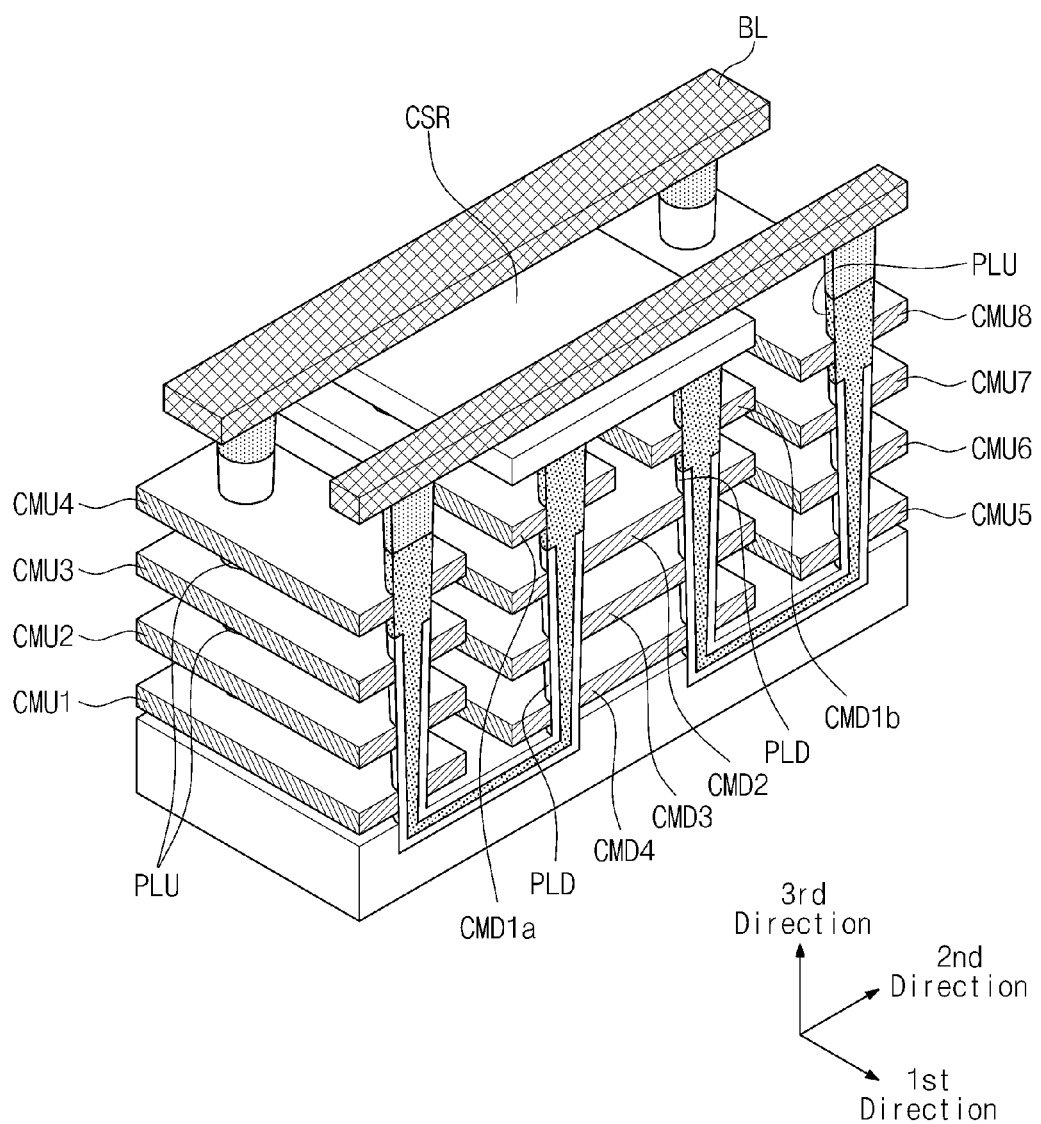
FIG. 41 is a perspective diagram taken along a line XXXXI-XXXXI' of FIG. 40.
Figure 42:
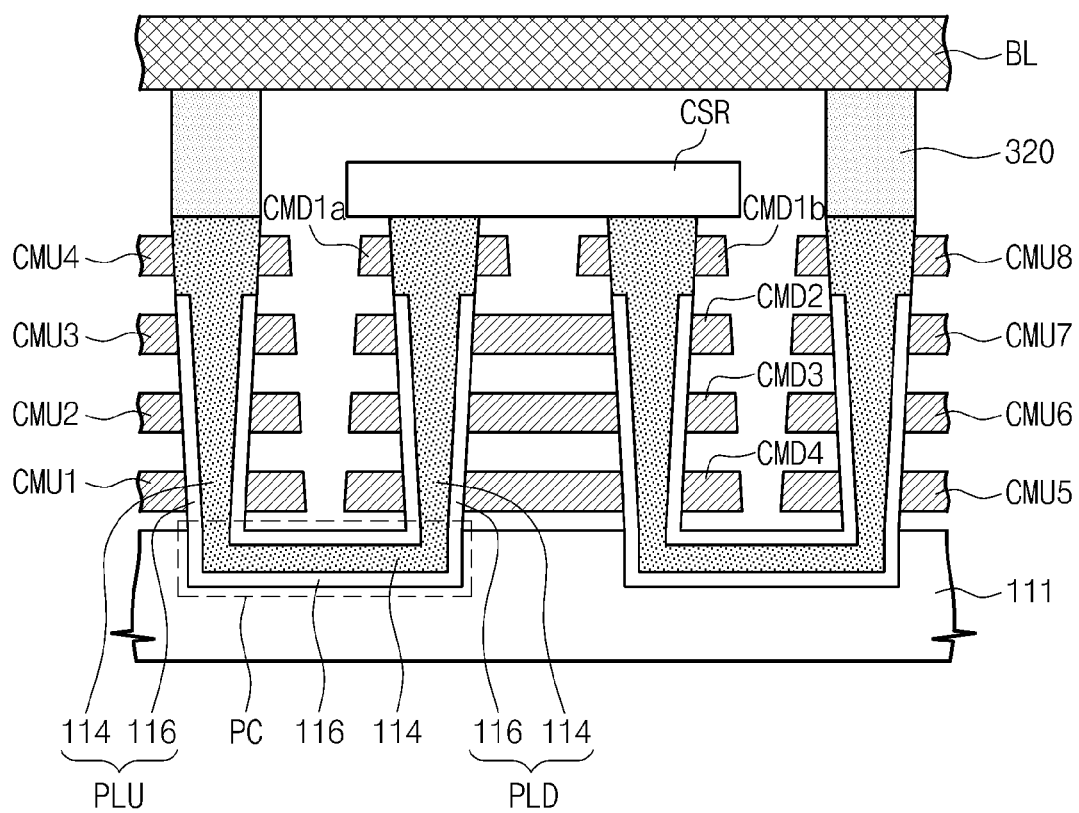
FIG. 42 is a cross-sectional diagram taken along a line XXXXI-XXXXI' of FIG. 40.

FIG. 40 is a plan diagram illustrating a memory block of FIG. 3 according to still yet other example embodiments of the inventive concepts. FIG. 41 is a perspective diagram taken along a line XXXXI-XXXXI' of FIG. 40. FIG. 42 is a cross-sectional diagram taken along a line XXXXI-XXXXI' of FIG. 40. Referring to FIGS. 40 to 42, first to eighth upper conductive materials CMU1-CMU8 extending along a first direction may be provided on a substrate 111. The first to fourth upper conductive materials CMU1-CMU4 may be stacked in a direction perpendicular to the substrate 111 and spaced apart from one another in a direction perpendicular to the substrate 111. The fifth to eighth upper conductive materials CMU5-CMU8 may be stacked in a direction perpendicular to the substrate 111 and spaced apart from one another in a direction perpendicular to the substrate 111. A group of the first to fourth upper conductive materials CMU1-CMU4 may be spaced apart from a group of the fifth to eighth upper conductive materials CMU5-CMU8 along a second direction.

Lower conductive materials CMD1a and CMD1b and CMD2-CMD4 extending along the first direction may be provided between the first to fourth upper conductive materials CMU1-CMU4 and the fifth to eighth upper conductive materials CMU5-CMU8. The lower conductive materials CMD2-CMD4 may be stacked in a direction perpendicular to the substrate 111 and spaced apart from one another in a direction perpendicular to the substrate 111. The lower conductive materials CMD1a and CMD1b may be spaced apart along the second direction.

A plurality of upper pillars PLU may be configured to penetrate the first to fourth upper conductive materials CMU1-CMU4 or the fifth to eighth upper conductive materials CMU5-CMU8 in a direction perpendicular to the substrate 111. The upper pillars PLU may contact the substrate 111. In the first upper conductive materials CMU1, upper pillars may be disposed in a line along the first direction and spaced apart along the first direction. In the eighth upper conductive materials CMU8, upper pillars may be disposed in line along the first direction and spaced apart along the first direction.

Each of the upper pillars PLU may include information storage film 116 and a channel film 114. The information storage film 116 may store information by trapping and/or discharging charges. The information storage film 116 may include a tunneling insulation film, a charge trap film, and a blocking insulation film. The channel films 114 may act as vertical bodies of the upper pillars PLU. The channel films 114 may include an intrinsic semiconductor, respectively. The channel films 114 may include semiconductor having the same conductivity type (e.g., p-type) as the substrate 111.

A plurality of lower pillars PLD may be formed. The plurality of lower pillars PLD may penetrate the lower conductive materials CMD2-CMD4 and the lower conductive material CMD1a or CMD1b in a direction perpendicular to the substrate 111 so as to contact the substrate 111. In the lower conductive materials CMD1a, lower pillars may be disposed in line along the first direction and spaced apart along the first direction. In the lower conductive materials CMD1b, lower pillars may be disposed in line along the first direction and spaced apart along the first direction. Each of the lower pillars PLD may include information storage film 116 and a channel film 114. The information storage film 116 may store information by trapping and/or discharging charges. The information storage film 116 may include a tunneling insulation film, a charge trap film and a blocking insulation film.

The channel films 114 may act as vertical bodies of the lower pillars PLD. The channel films 114 may include an intrinsic semiconductor, respectively. The channel films 114 may include semiconductor having the same conductivity type (e.g., p-type) as the substrate 111.

A plurality of pipeline contacts PC may be provided at the substrate 111. The pipeline contacts PC may extend in a bit line direction so as to connect lower surfaces of upper pillars PLU formed at the first upper conductive material CMU1 with lower surfaces of lower pillars PLD formed at the lower conductive material CMD1a. The pipeline contacts PC may extend in a bit line direction so as to connect lower surfaces of upper pillars PLU formed at the eighth upper conductive material CMU8 with lower surfaces of lower pillars PLD formed at the lower conductive material CMD1b.

According to at least one example embodiment, each of the pipeline contacts PC may include a channel film 114 and information storage film 116. The channel films 114 of the pipeline contacts PC may interconnect the channel films 114 of the upper pillars PLU and channel films of the lower pillars PLD. The information storage films 116 of the pipeline contacts PC may interconnect the information storage films 116 of the upper pillars PLU and the information storage films 116 of the lower pillars PLD.

A common source region CSR extending along the first direction may be provided on the lower pillars PLD. The common source region CSR may extend along the first direction so as to be connected with the plurality of lower pillars PLD. The common source region CSR may form a common source line CSL. The common source region CSR may include a metallic material. The common source region CSR may have a conductivity type different from the substrate 111. Drains 320 may be provided on the upper pillars PLU. The drains 320 may include a semiconductor material having a conductivity type (e.g., n-type) different from the substrate 111. Bit lines BL may be on the drains 320. The bit lines BL may be spaced apart along the first direction. The bit lines BL may extend along the second direction so as to be connected with the drains 320.

According to at least one example embodiment, the bit lines BL and the drains 320 may be connected via contact plugs, and the common source region CSR and the lower pillars PLD may be connected via contact plugs.

One cell string may include a lower pillar and an upper pillar connected to each other via one pipeline contact.

As described in FIGS. 35 to 37, the upper pillars PLU and the lower pillars PLD may be disposed in a zigzag pattern along the first direction. A part EC of the plan diagram in FIG. 40 may correspond to one of above-described equivalent circuits BLKa1-BLKa7. Memory cells MC may be erased according to a method described with reference to FIGS. 21-25.

Figure 43:
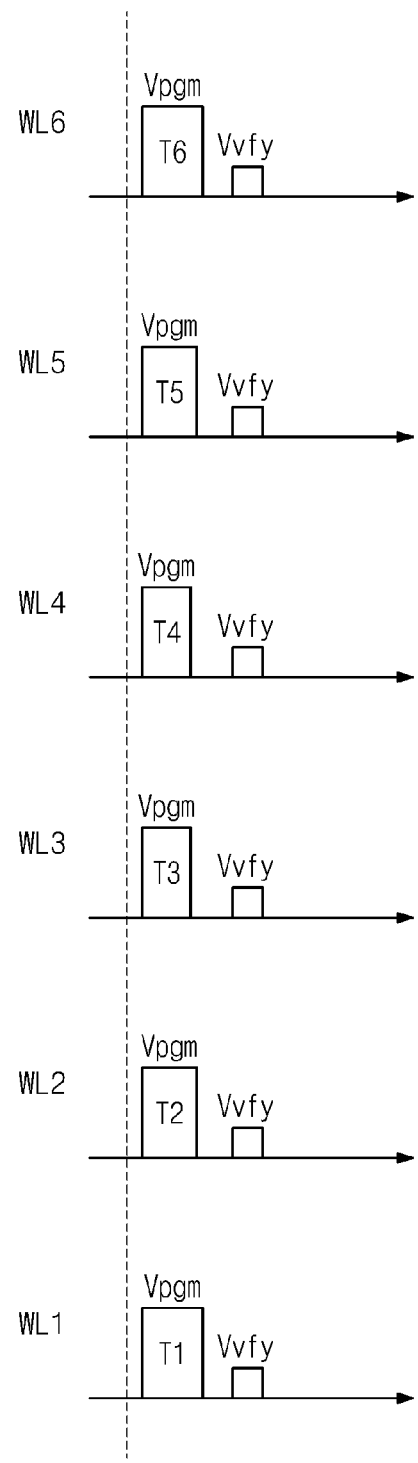
FIG. 43 is a diagram illustrating voltages supplied to a memory block in FIGS. 40-42 at a program operation.

FIG. 43 is a diagram illustrating voltages supplied to a memory block in FIGS. 40-42 at a program operation. In FIG. 43, waveforms corresponding to each of first to sixth word lines WL1-WL6 may indicate voltages applied to each of the first to sixth word lines WL1-WL6 when each of the first to sixth word lines WL1-WL6 is selected. In FIG. 43, one program loop may be illustrated with respect to each word line. In FIG. 43, the first, second, and third word lines WL1, WL2, and WL3 may correspond to lower conductive materials CMD2, CMD3, and CMD4, respectively. The fourth, fifth, and sixth word lines WL4, WL5, and WL6 may correspond to upper conductive materials CMU1/5, CMU2/6, and CMU3/7, respectively.

As illustrated in FIGS. 41 and 42, as a distance from a substrate 111 decreases, a cross-sectional area of pillars PLU and PLD may gradually decrease. As a distance from the common source line CSL decreases, a cross-sectional area of pillars PLU and PLD may gradually decrease and then gradually increase. An applying time controller 160 may control an applying time of a program voltage Vpgm according to a cross-sectional area of pillars PLU and PLD. For example, as a distance between a word line and the substrate 111 decreases, the applying time controller 160 may gradually decrease a voltage applying time of the program voltage Vpgm. Based upon a distance between a word line and the common source line CSL, the applying time controller 160 may gradually decrease a voltage applying time of the program voltage Vpgm and then gradually increase it.

A program voltage Vpgm may be supplied to a sixth word line WL6 during a time T6 as a voltage applying time. The program voltage Vpgm may be supplied to a fifth word line WL5 during a time T5 as a voltage applying time. The time T5 may be less than the time T6. The program voltage Vpgm may be supplied to a fourth word line WL4 during a time T4 as a voltage applying time. The time T4 may be less than the time T5. The program voltage Vpgm may be supplied to a third word line WL3 during a time T3 as a voltage applying time. The program voltage Vpgm may be supplied to a second word line WL2 during a time T2 as a voltage applying time. The program voltage Vpgm may be supplied to a first word line WL1 during a time T1 as a voltage applying time.

A voltage applying time of the first word line WL1 may be identical to that of the sixth word line WL6, a voltage applying time of the second word line WL2 may be identical to that of the fifth word line WL5, and a voltage applying time of the third word line WL3 may be identical to that of the fourth word line WL6. The voltage applying times may satisfy, for example, $T1=T6<T2=T5<T3=T4$. As described with reference to FIG. 14, a program loop time may be differentiated according to word lines. As described with reference to FIG. 15, an increment of a program voltage Vpgm may differentiate according to word lines.

Figure 44:
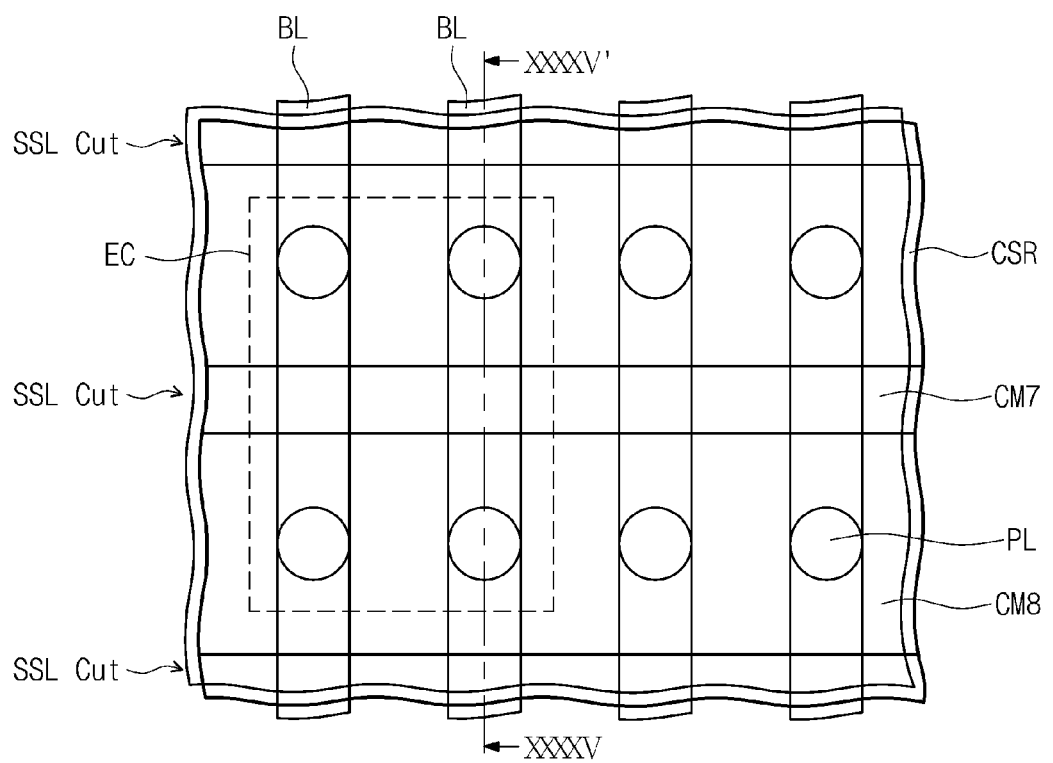
FIG. 44 is a plan diagram illustrating a memory block of FIG. 3 according to yet still further example embodiment of the inventive concepts.
Figure 45:
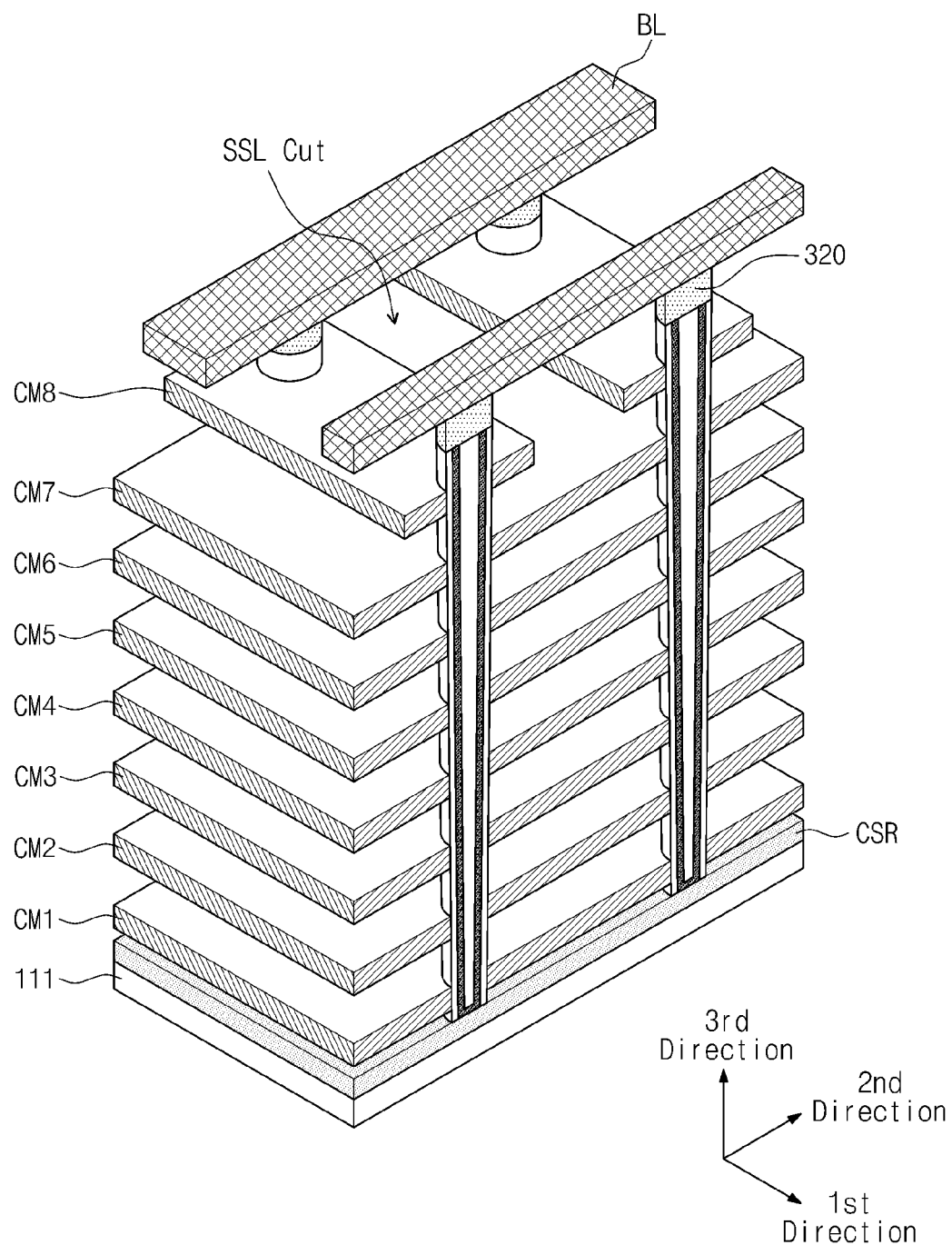
FIG. 45 is a perspective diagram taken along a line XXXXV-XXXXV' of FIG. 44.
Figure 46:
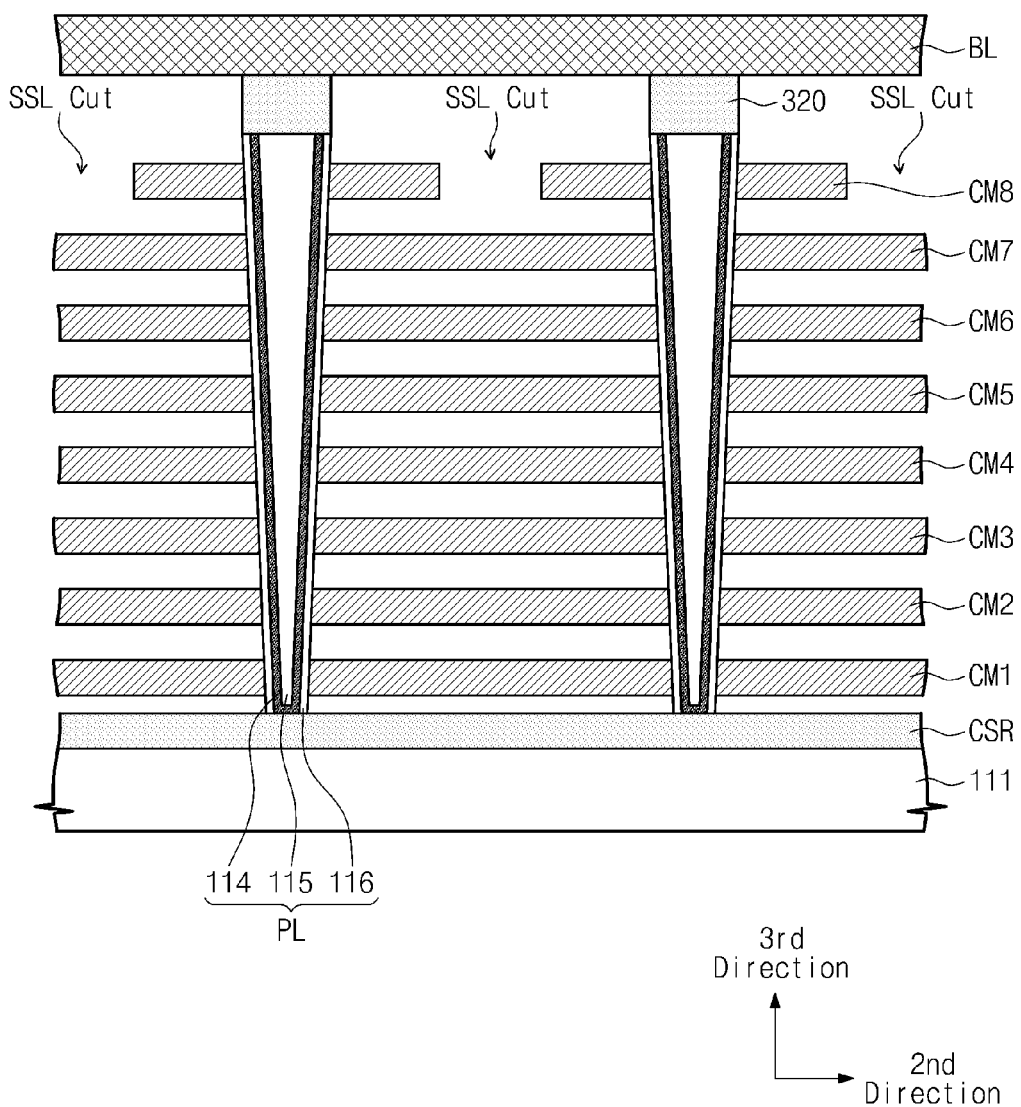
FIG. 46 is a cross-sectional diagram taken along a line XXXXV-XXXXV' of FIG. 44.

FIG. 44 is a plan diagram illustrating a memory block of FIG. 3 according to yet still further example embodiment of the inventive concepts. FIG. 45 is a perspective diagram taken along a line XXXXV-XXXXV' of FIG. 44. FIG. 46 is a cross-sectional diagram taken along a line XXXXV-XXXXV' of FIG. 44. Referring to FIGS. 44-46, a common source region CSR may be formed at a substrate 111. The common source region CSR may be formed of one doping region, for example. The common source region CSR may constitute a common source line CSL.

First to eighth conductive materials CM1-CM8 may be formed on the common source region CSR. The first to eighth conductive materials CM1-CM8 may be stacked in a direction perpendicular to the substrate 111 and spaced apart in a direction perpendicular to the substrate 111. Among the first to eighth conductive materials CM1-CM8, conductive materials constituting string selection transistors SST may be separated by string selection line cuts SSL Cut. The string selection line cuts SSL Cut may extend along the first direction and be spaced apart along a second direction. Remaining conductive materials (not used for the string selection transistors) may be formed on the common source region CSR to have a plate shape extending along the first and second directions.

For example, the first to seventh conductive lines CM1-CM7 may have a plate shape, and the eighth conductive materials CM8 may be separated by the string selection line cuts SSL Cut. The eighth conductive materials CM8 may extend along the first direction and spaced apart along the second direction. A plurality of pillars PL may be provided to penetrate the first to eighth conductive materials CM1-CM8 in a direction perpendicular to the substrate 111 and to contact with the substrate 111. In one of the eighth conductive materials CM8, pillars PL may be provided in line along the first direction. Each of the pillars PL may include an information storage film 116, a channel film 114, and an inner material 115.

The information storage films 116 may store information by trapping and/or discharging charges. The information storage films 116 may include a tunneling insulation film, a charge trap film and a blocking insulation film. The channel films 114 may act as vertical bodies of the pillars PL. The channel films 114 may include intrinsic semiconductor. The channel films 114 may include a semiconductor material (e.g., silicon) having the same type as the substrate 111. The inner materials 115 may include an insulation material and/or air gap. As described in FIGS. 29 and 30, pillars PL may be formed of upper pillars and lower pillars. As described in FIGS. 35-37, pillars PL may be disposed in a zigzag pattern along the first direction.

Figure 47:
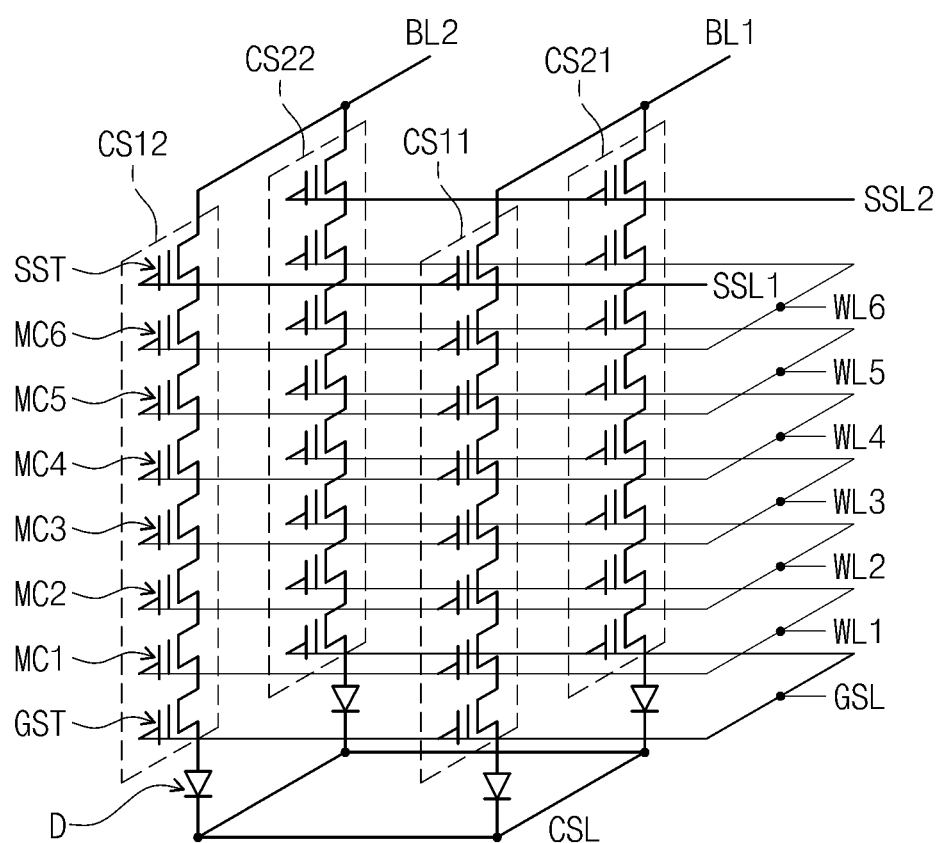
FIG. 47 is a circuit diagram illustrating an equivalent circuit of a part EC of the plan view in FIG. 44 according to at least one example embodiment of the inventive concepts.

FIG. 47 is a circuit diagram illustrating an equivalent circuit of a part EC of the plan view in FIG. 44 according to at least one example embodiment of the inventive concepts. Referring to FIGS. 44-47, a common source region CSR may be formed between pillars PL and a substrate 111. Channels films 114 may be p-type, and the common source region CSR may be n-type. A portion corresponding to ground selection transistors GST among the channel films 114 may be p-type, and the common source region CSR may be n-type. The channel film 114 and the common source region CSR may form a PN junction.

Diodes D may be between cell strings CS11, CS12, CS21, and CS22 formed of pillars PL and a common source line formed of the common source region CSR. An equivalent circuit BLKf1 in FIG. 47 may be identical to that in FIG. 8 except that the diodes D may be provided therein. The equivalent circuit BLKf1 may be applied with above-described equivalent circuits BLKa2-BLKa7. Memory cells MC may be programmed according to at least one method described with respect to FIGS. 11-16 or FIG. 31.

Figure 48:
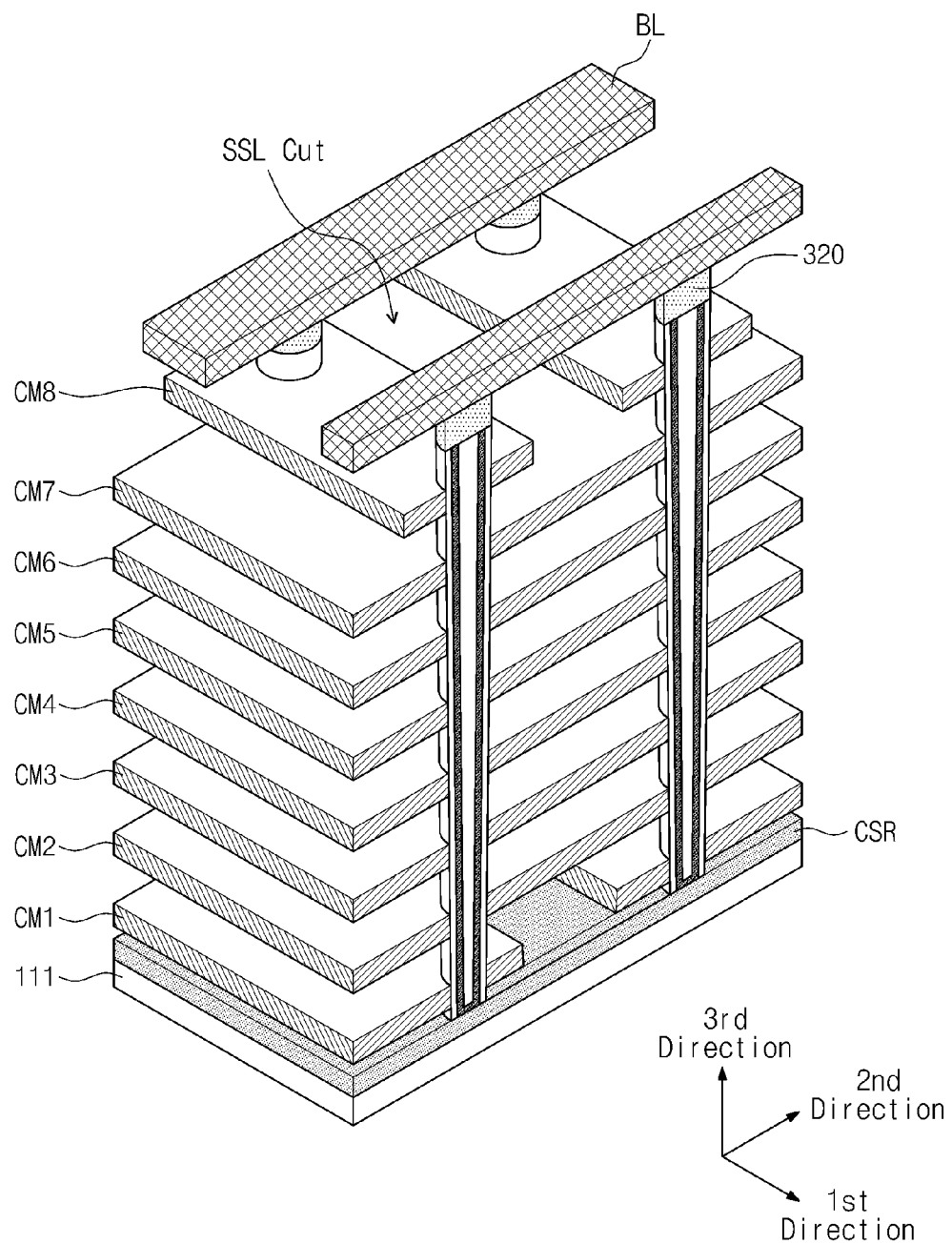
FIG. 48 is a perspective diagram taken along a line XXXX-VIII-XXXXVIII' of FIG. 44.
Figure 49:
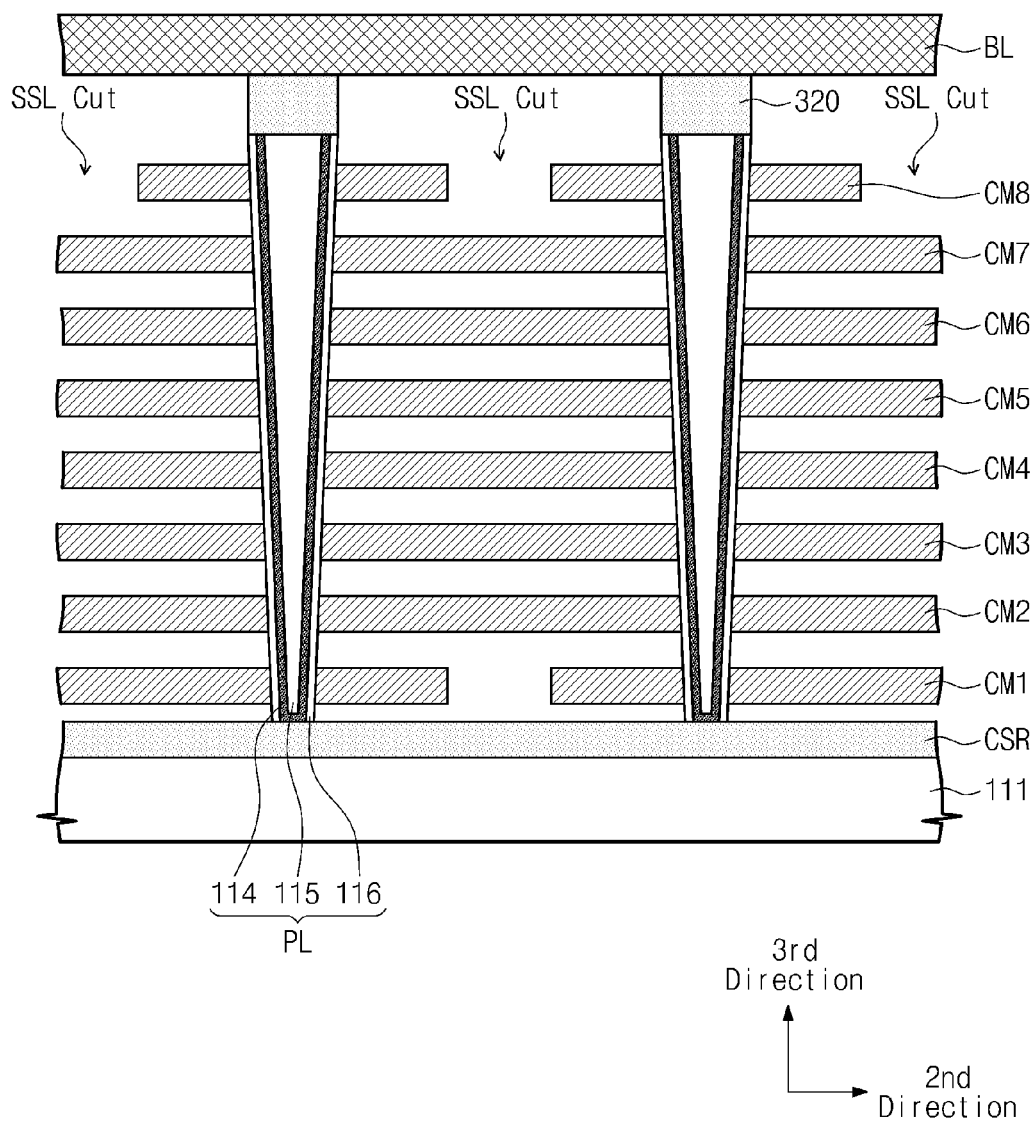
FIG. 49 is a cross-sectional diagram taken along a line XXXXVIII-XXXXVIII' of FIG. 44.

FIG. 48 is a perspective diagram taken along a line XXXXVIII-XXXXVIII' of FIG. 44. FIG. 49 is a cross-sectional diagram taken along a line XXXXVIII-XXXXVIII' of FIG. 44. Referring to FIGS. 44, 48 and 49, among first to eighth conductive materials CM1-CM8, conductive materials constituting ground selection transistors GST may extend along a first direction and spaced apart along a second direction. The conductive materials constituting ground selection transistors GST may have the same structure as conductive materials constituting string selection transistors SST. For example, the first conductive materials CM1 may have the same structure as the eighth conductive materials CM8.

Figure 50:
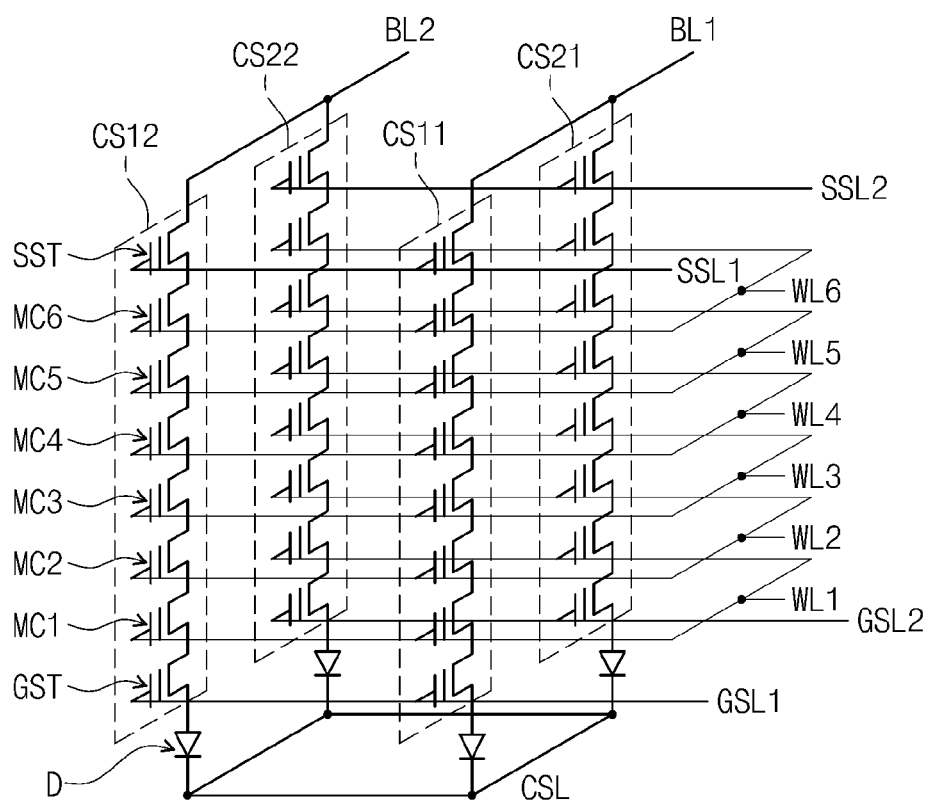
FIG. 50 is a circuit diagram illustrating an equivalent circuit of a part EC of the plan view in FIG. 44 according to other example embodiments of the inventive concepts.

FIG. 50 is a circuit diagram illustrating an equivalent circuit of a part EC of the plan view in FIG. 44 according to other example embodiments of the inventive concepts. Referring to FIGS. 44, 48 and 50, diodes D may be between cell strings CS11, CS12, CS21, and CS22 and a common source line CSL. Ground selection transistors GST may be connected with a plurality of ground selection lines GSL1 and GSL2. For example, ground selection transistors of the cell strings CS11 and CS12 may be connected with a first ground selection line GSL1, and ground selection transistors of the cell strings CS21 and CS22 may be connected with a second ground selection line GSL2. The equivalent circuit BLKf2 may be applied with above-described equivalent circuits BLKa2-BLKa7. Memory cells MC may be programmed according to at least one method described with respect to FIGS. 11-16 or FIG. 31.

Figure 51:
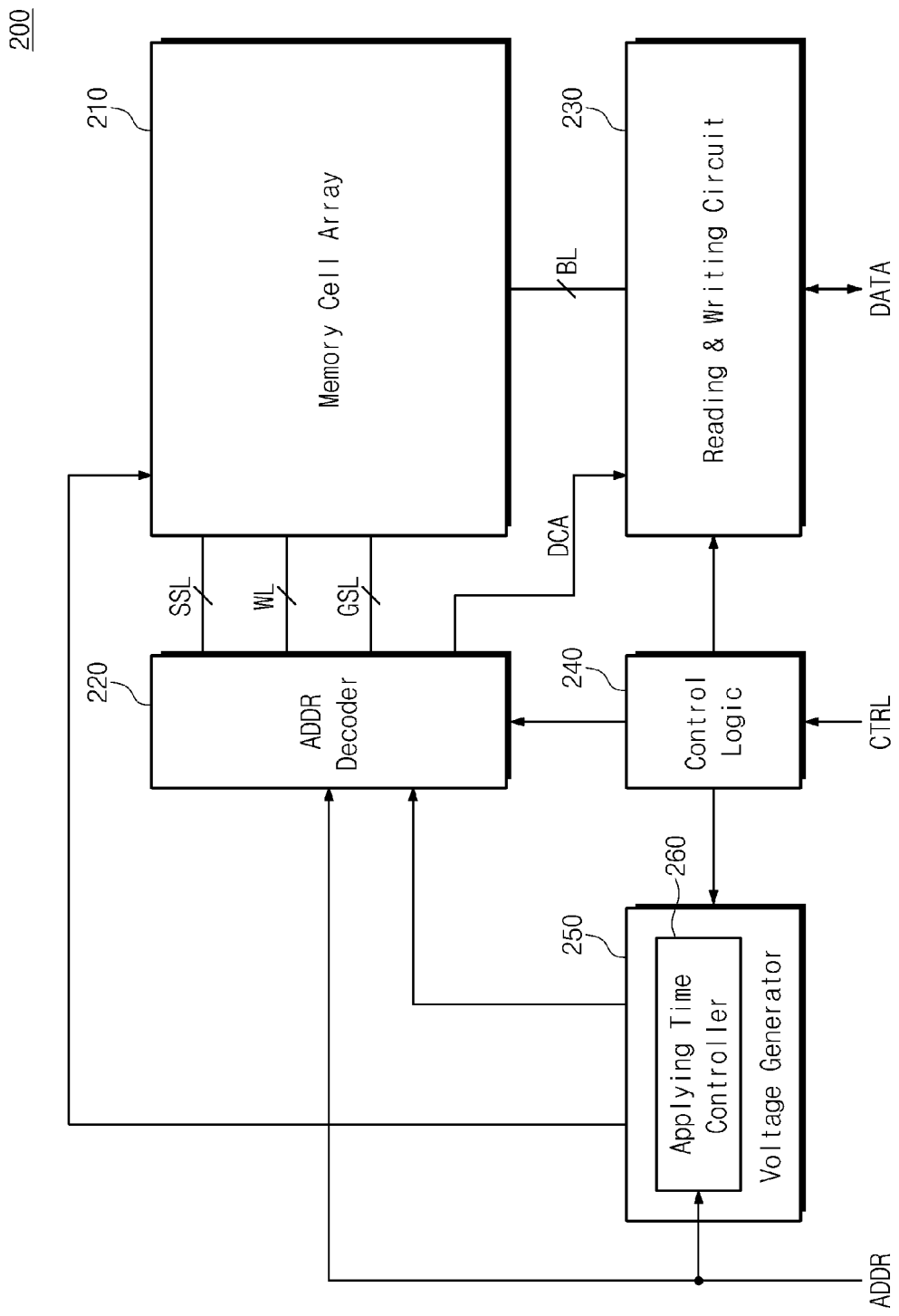
FIG. 51 is a block diagram illustrating nonvolatile memory devices according to other example embodiments of the inventive concepts.

FIG. 51 is a block diagram illustrating nonvolatile memory devices according to other example embodiments of the inventive concepts. Referring to FIG. 51, a nonvolatile memory device 200 may include a memory cell array 210, an address decoder 220, a reading/writing circuit 230, control logic 240 and a voltage generator 250. A nonvolatile memory device 200 in FIG. 51 may be different from that in FIG. 2 in that an applying time controller 260 may be included within the voltage generator 250. The voltage generator 250 may output a program voltage Vpgm or an erase voltage Vers during a voltage applying time determined by the applying time controller 260.

The applying time controller 260 may determine a voltage applying time in response to an address ADDR input from an external device. The applying time controller 260 may be determine a voltage applying time in response to an address input from the address decoder 220. For example, the applying time controller 260 may determine a row address decoded by the address decoder 220, a row address, or a block address.

Figure 52:
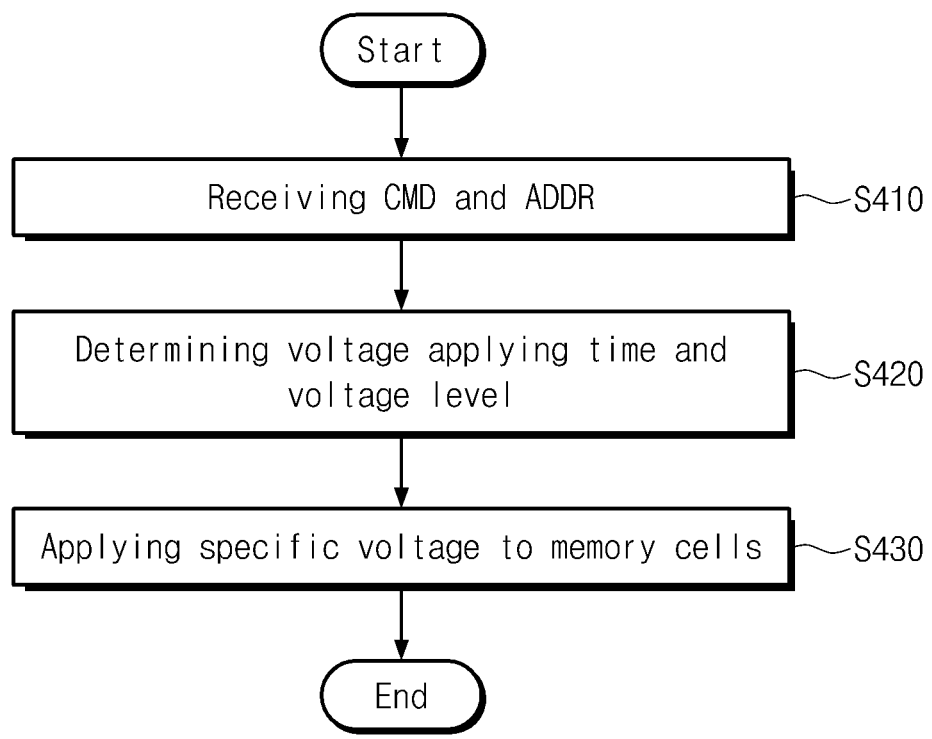
FIG. 52 is a flowchart illustrating methods of operating nonvolatile memory devices according to other example embodiments of the inventive concepts.

FIG. 52 is a flowchart illustrating methods of operating nonvolatile memory devices according to other example embodiments of the inventive concepts. Referring to FIG. 52, in operation S410, a command CMD and an address ADDR may be received. The command CMD may be a program command and/or an erase command. The address ADDR may indicate memory cells to be programmed and/or memory cells to be erased. In operation S420, a voltage applying time and a voltage level may be determined. For example, a voltage applying time and a voltage level may be determined according to the command CMD and the address ADDR input in operation S410.

In operation S430, a specific voltage may be applied to memory cells. For example, during the determined voltage applying time, a voltage having the determined voltage level may be applied to memory cells corresponding to the input address ADDR in response to the input command CMD. When the input command CMD is a program command, the specific voltage may be a program voltage, and memory cells corresponding to the input address ADDR may be programmed. When the input command CMD is an erase command, the specific voltage may be an erase voltage, and memory cells corresponding to the input address ADDR may be erased.

Figure 53:
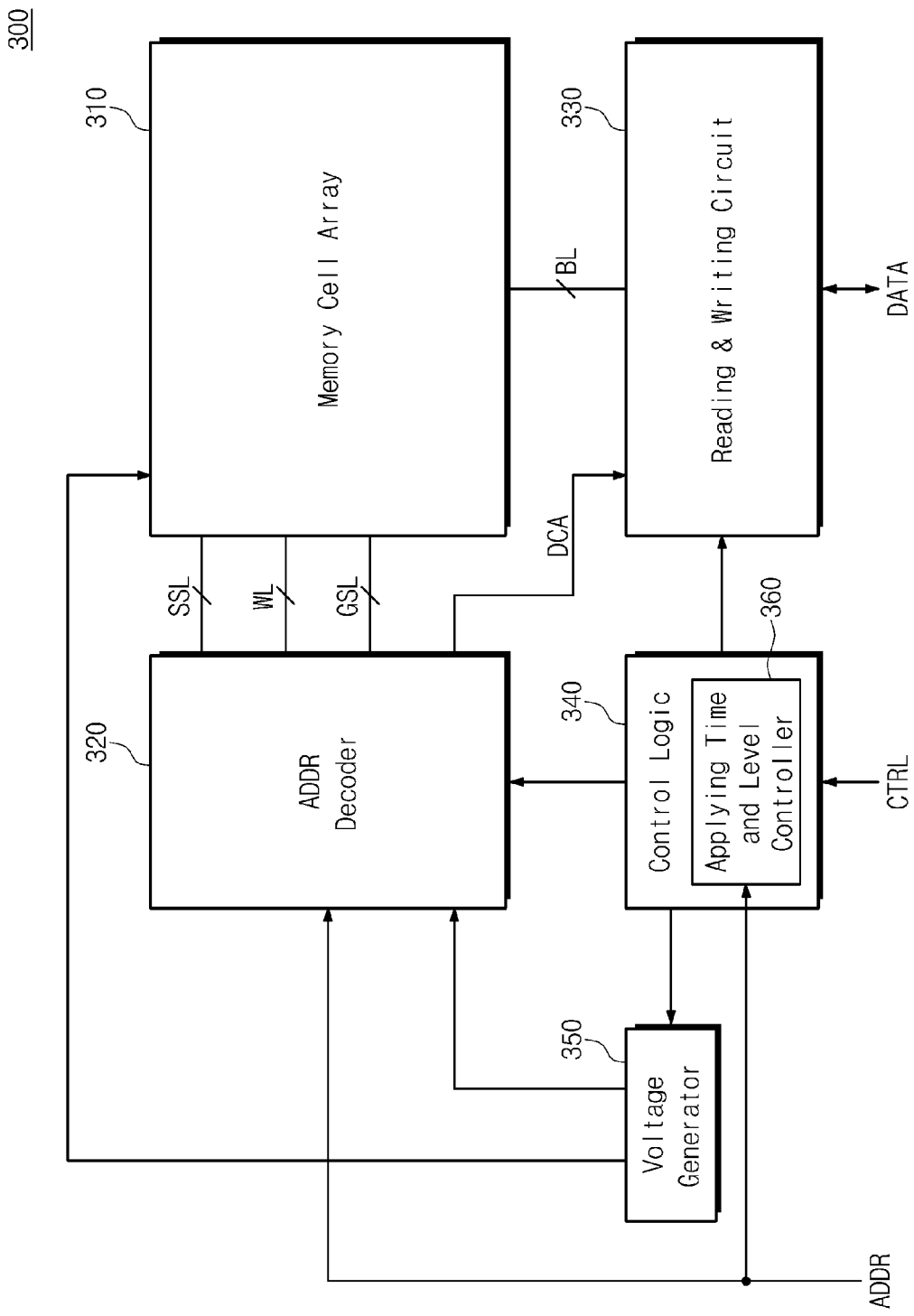
FIG. 53 is a block diagram illustrating nonvolatile memory devices according to still other example embodiments of the inventive concepts.

FIG. 53 is a block diagram illustrating nonvolatile memory devices according to still other example embodiments of the inventive concepts. Referring to FIG. 53, a nonvolatile memory device 300 may include a memory cell array 310, an address decoder 320, a reading/writing circuit 330, control logic 340 and a voltage generator 350.

The nonvolatile memory device 300 in FIG. 53 may be identical to that in FIG. 1 except that the control logic 340 may include an applying time and level controller 360, and description thereof may be omitted. The applying time and level controller 360 may determine a voltage applying time and a voltage level of a specific voltage. The applying time and level controller 360 may control an applying time and a level of a program or erase voltage according to the control of the control logic 340.

The applying time and level controller 360 may decrease a voltage applying time and a voltage level of a program voltage Vpgm, for example, when a program speed increases, when the strength of an electric field forced to a memory cell to be programmed increases, when a tunneling current of a memory cell to be programmed increases, when widths of pillars PL decrease, when a word line address of an input address ADDR decreases or increases, and when the number of memory cells MC stacked between a substrate 111 and memory cells MC corresponding to an input address ADDR decreases.

Figure 54:
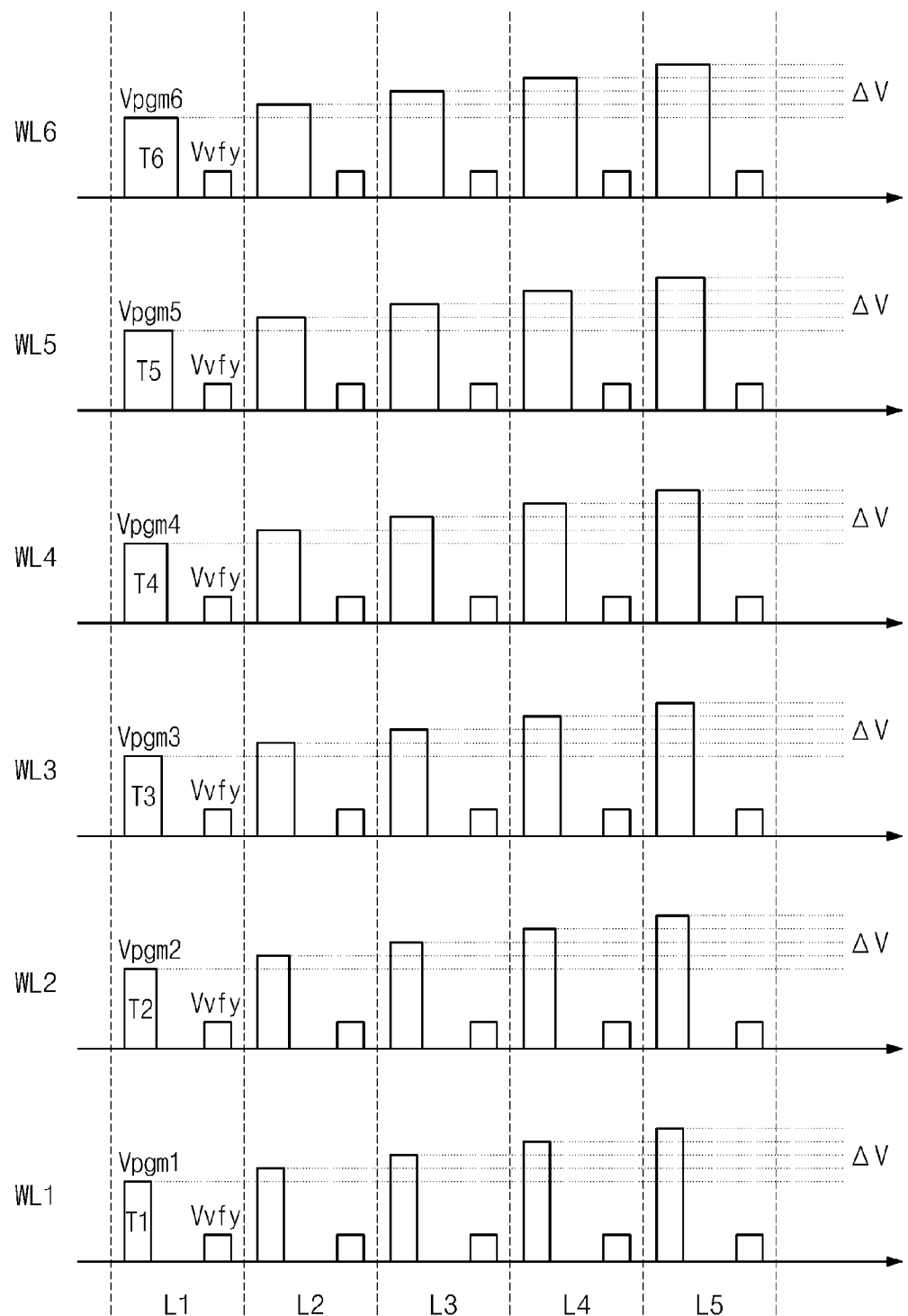
FIG. 54 is a diagram illustrating a program operation of a nonvolatile memory device according to example embodiments of the inventive concepts.

FIG. 54 is a diagram illustrating a program operation of a nonvolatile memory device according to example embodiments of the inventive concepts. As illustrated in FIG. 54, a program operation may be executed under the condition that a voltage applying time and a level may vary according to a location of a selected word line. As compared with FIG. 13, program voltages Vpgm1-Vpgm6 having different levels may be applied to word lines WL1-WL6.

A level of a program voltage Vpgm may decrease, for example, when a program speed increases, when the strength of an electric field forced to a memory cell to be programmed increases, when a tunneling current of a memory cell to be programmed increases, when widths of pillars PL decrease, when a word line address of an input address ADDR decreases or increases, and when the number of memory cells MC stacked between a substrate 111 and memory cells MC corresponding to an input address ADDR decreases. Although a voltage applying time and a level of the program voltage Vpgm may vary, a time taken to execute one program loop, that is, an interval between start points of program and verify voltage pulses may be constant.

Figure 55:
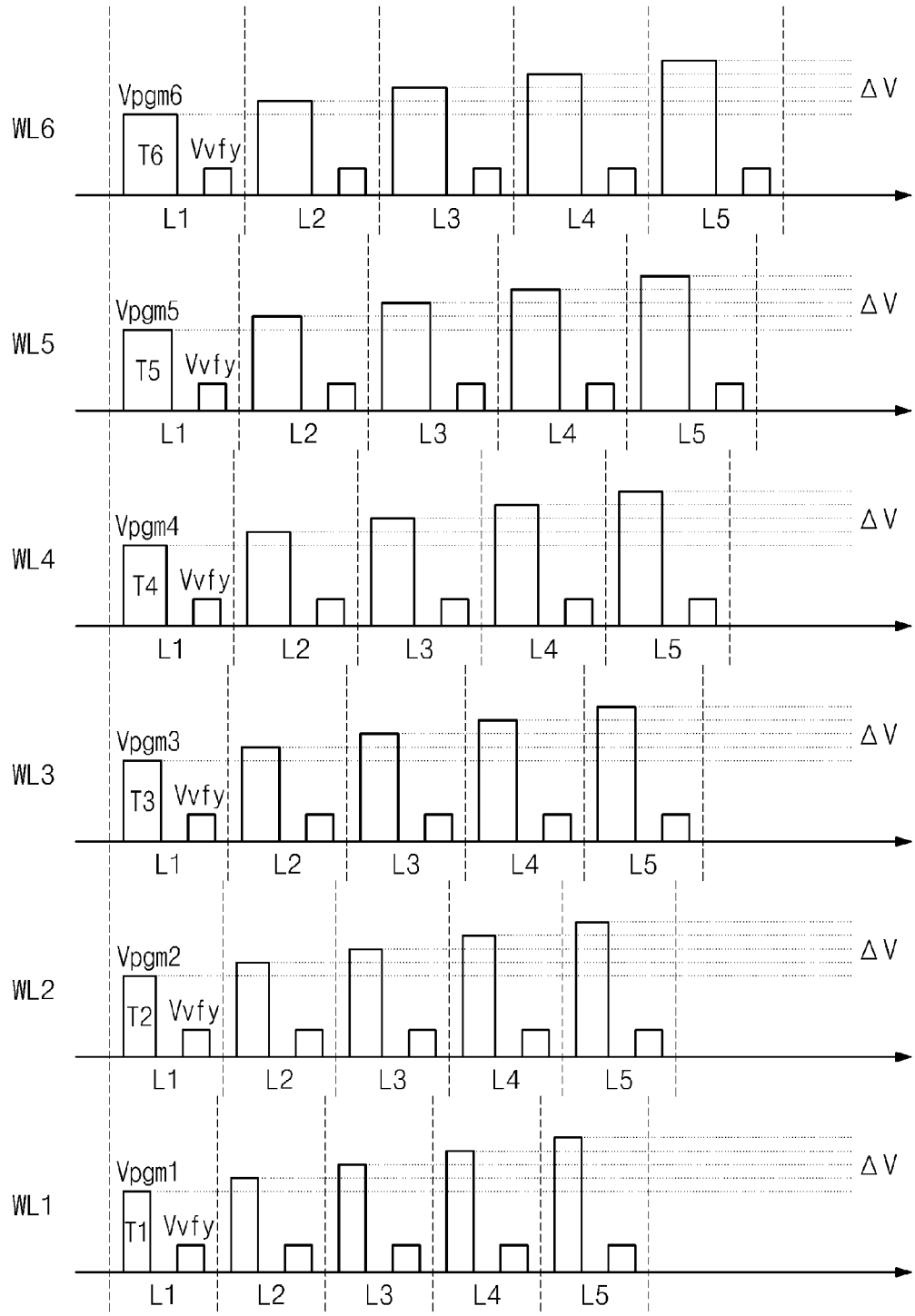
FIG. 55 is a diagram illustrating a program operation of a nonvolatile memory device according to other example embodiments of the inventive concepts.

FIG. 55 is a diagram illustrating a program operation of a nonvolatile memory device according to other example embodiments of the inventive concepts. As illustrated in FIG. 55, a program operation may be executed under the condition that a voltage applying time and a voltage level vary according a location of a selected word line. As compared with FIG. 14, program voltages Vpgm1-Vpgm6 having different levels may be applied to word lines WL1-WL6. A level and a voltage applying time of a program voltage Vpgm may decrease, for example, when a program speed increases, when the strength of an electric field forced to a memory cell to be programmed increases, when a tunneling current of a memory cell to be programmed increases, when widths of pillars PL decrease, when a word line address of an input address ADDR decreases or increases, and when the number of memory cells MC stacked between a substrate 111 and memory cells MC corresponding to an input address ADDR decreases. As a voltage applying time and a level of the program voltage Vpgm vary, a time taken to execute one program loop may vary. For example, an interval between an end point of a program voltage pulse and a start point of a verify voltage pulse may be constant.

Figure 56:
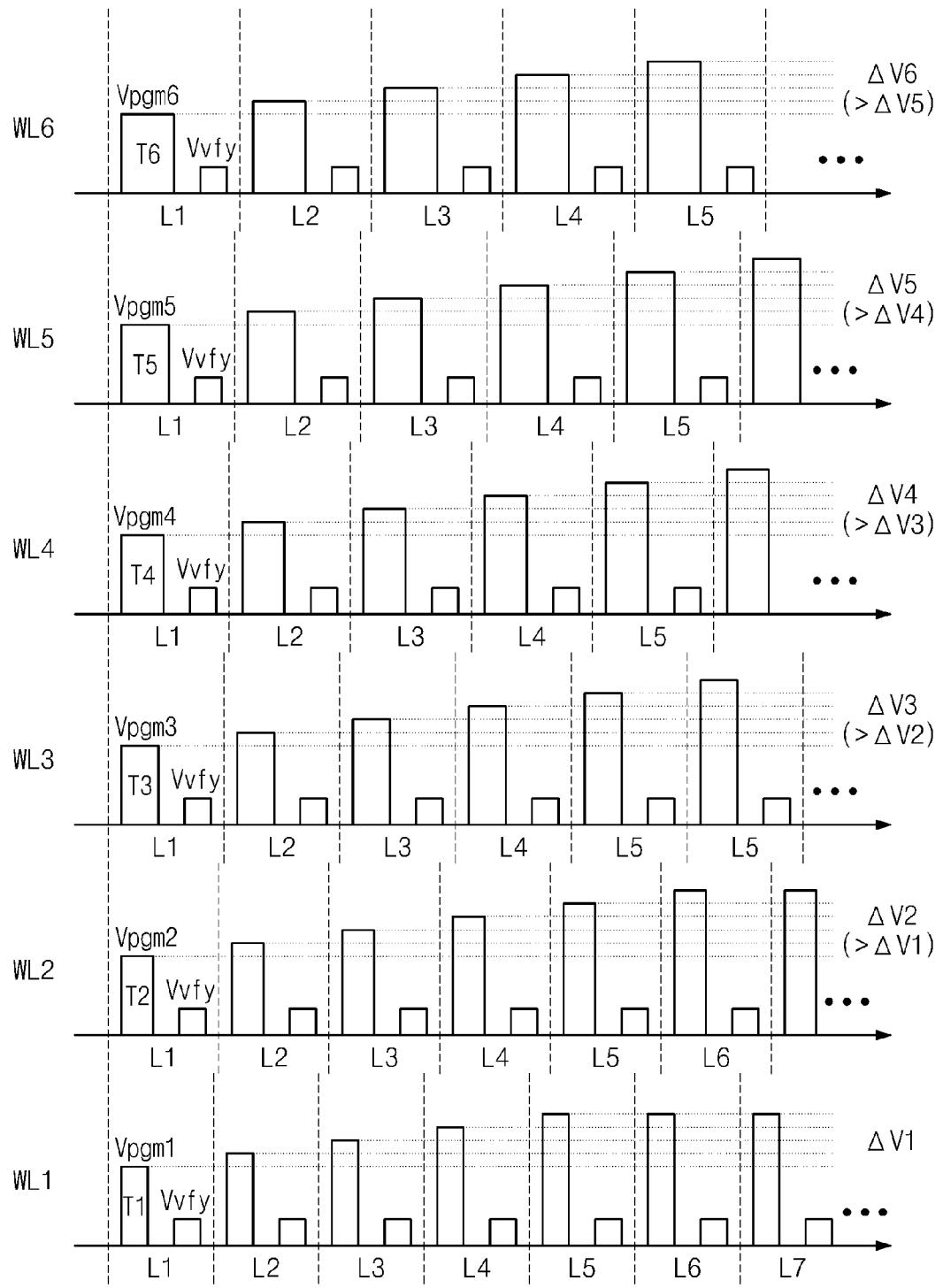
FIG. 56 is a diagram illustrating a program operation of a nonvolatile memory device according to at still other example embodiments of the inventive concepts.

FIG. 56 is a diagram illustrating a program operation of a nonvolatile memory device according to at still other example embodiments of the inventive concepts. As illustrated in FIG. 56, a program operation may be executed under the condition that a voltage applying time and a voltage level may vary according a location of a selected word line. As compared with FIG. 15, program voltages Vpgm1-Vpgm6 having different levels may be applied to word lines WL1-WL6. An increment, an applying time, and a level of a program voltage Vpgm may decrease, for example, when a program speed increases, when the strength of an electric field forced to a memory cell to be programmed increases, when a tunneling current of a memory cell to be programmed increases, when widths of pillars PL decrease, when a word line address of an input address ADDR decreases or increases, and when the number of memory cells MC stacked between a substrate 111 and memory cells MC corresponding to an input address ADDR decreases. As an applying time and a level of the program voltage Vpgm vary, a program loop number may vary. For example, when a time taken to execute one program loop decreases, the number of program loops may increase.

FIG. 57 is a table illustrating word line groups according to yet other example embodiments of the inventive concepts. As compared with FIG. 16, different program voltages (e.g., Vpgm1-Vpgm3) may be applied to word line groups. An applying time and a level of a program voltage may decrease, for example, when a program speed increases, when the strength of an electric field forced to a memory cell to be programmed increases, when a tunneling current of a memory cell to be programmed increases, when widths of pillars PL decrease, when a word line address of an input address ADDR decreases or increases, and when the number of memory cells MC stacked between a substrate 111 and memory cells MC corresponding to an input address ADDR decreases.

Figure 58:
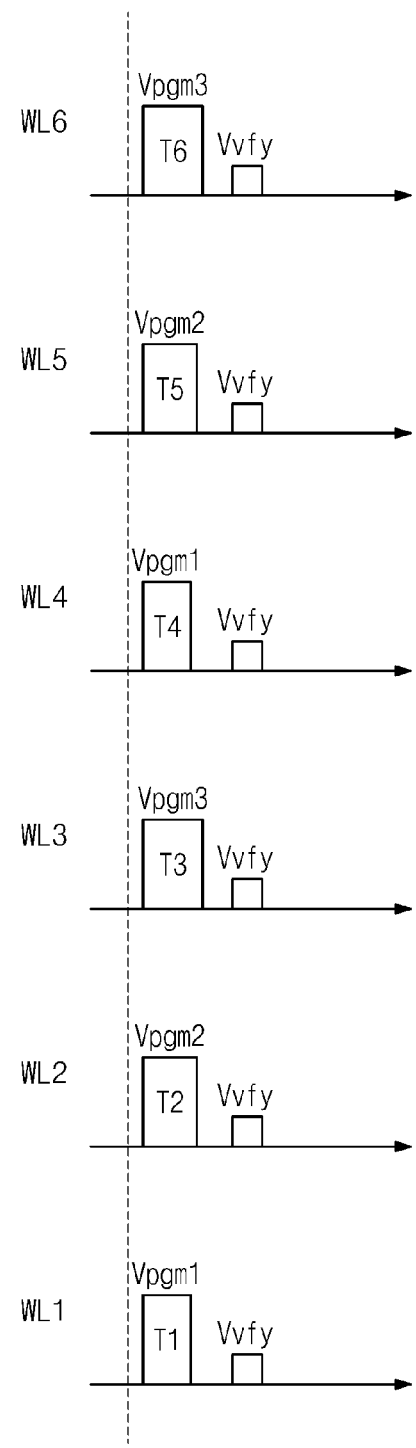
FIG. 58 is a diagram illustrating a program operation of a nonvolatile memory device according to yet still other example embodiments of the inventive concepts.

FIG. 58 is a diagram illustrating a program operation of a nonvolatile memory device according to yet still other example embodiments of the inventive concepts. As illustrated in FIG. 58, a program operation may be executed under the condition that a voltage applying time and a voltage level vary. As compared with FIG. 31, program voltages Vpgm1-Vpgm3 having different levels may be applied to word lines WL1-WL6.

An applying time and a voltage level of a program voltage may decrease, for example, when a program speed increases, when the strength of an electric field forced to a memory cell to be programmed increases, when a tunneling current of a memory cell to be programmed increases, when widths of pillars PLa and PLb decrease, when a word line address of an input address ADDR decreases or increases, and when the number of memory cells MC stacked between a substrate 111 and memory cells MC corresponding to an input address ADDR decreases.

As an applying time and a level of a program voltage vary, a program loop time and a program loop number may vary. For example, as a time taken to execute one program loop decreases, the number of program loops may increase.

Figure 59:
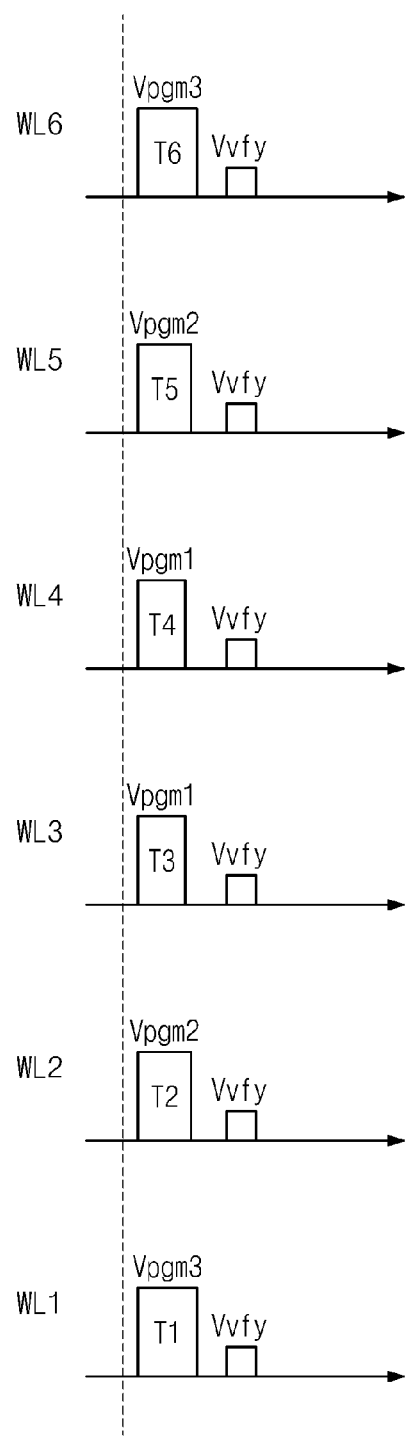
FIG. 59 is a diagram illustrating a program operation of a nonvolatile memory device according to still yet other example embodiments of the inventive concepts.

FIG. 59 is a diagram illustrating a program operation of a nonvolatile memory device according to still yet other example embodiments of the inventive concepts. As illustrated in FIG. 59, a program operation may be executed under the condition that a voltage applying time and a level vary. As compared with FIG. 43, program voltages Vpgm1-Vpgm3 having different levels may be applied to word lines WL1-WL6. An applying time and a level of a program voltage may decrease, for example, when a program speed increases, when the strength of an electric field forced to a memory cell to be programmed increases, when a tunneling current of a memory cell to be programmed increases, when widths of pillars PLU and PLD decrease, when a word line address of an input address ADDR decreases or increases, and when the number of memory cells MC stacked between a substrate 111 and memory cells MC corresponding to an input address ADDR decreases.

As an applying time and a level of a program voltage vary, a program loop time and the number of program loops may vary. For example, as a time taken to execute one program loop decreases, a number of program loops may increase.

Figure 60:
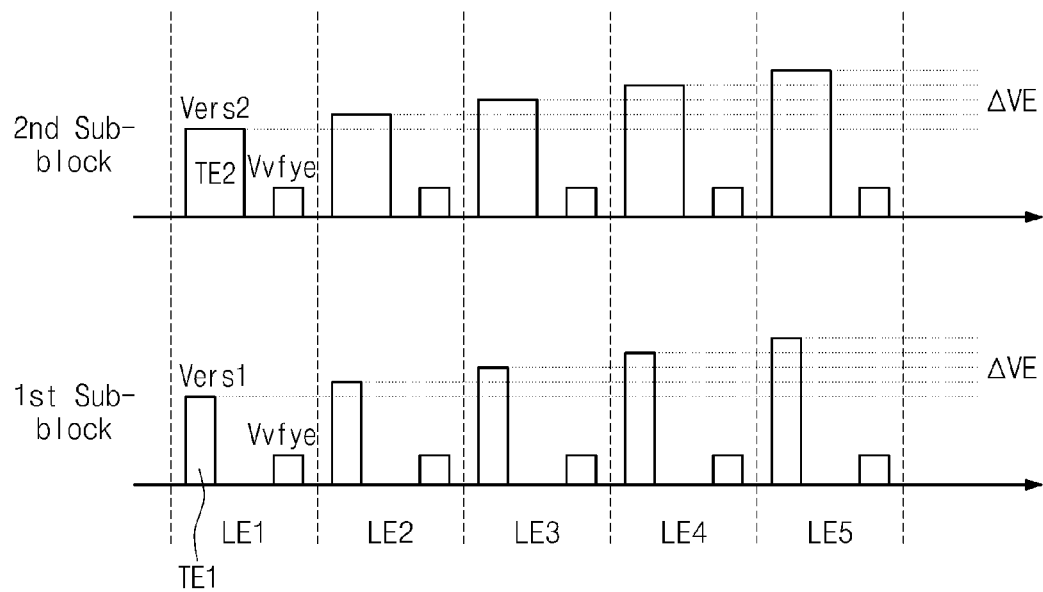
FIG. 60 is a diagram illustrating an erase operation of a nonvolatile memory device according to example embodiments of the inventive concepts.

FIG. 60 is a diagram illustrating an erase operation of a nonvolatile memory device according to example embodiments of the inventive concepts. As illustrated in FIG. 60, an erase operation may be executed under the condition that a voltage applying time and a level of an erase voltage vary. As compared with FIG. 43, erase voltages Vers1 and Vers2 having different levels may be applied to sub blocks. An applying time and a level of an erase voltage may decrease, for example, when an erase speed increases, when the strength of an electric field forced to a memory cell to be erased increases, when a tunneling current of a memory cell to be erased increases, when widths of pillars PLU and PLD decrease, when a word line address of an input address ADDR decreases or increases, and when the number of memory cells MC stacked between a substrate 111 and memory cells MC corresponding to an input address ADDR decreases.

Figure 61:
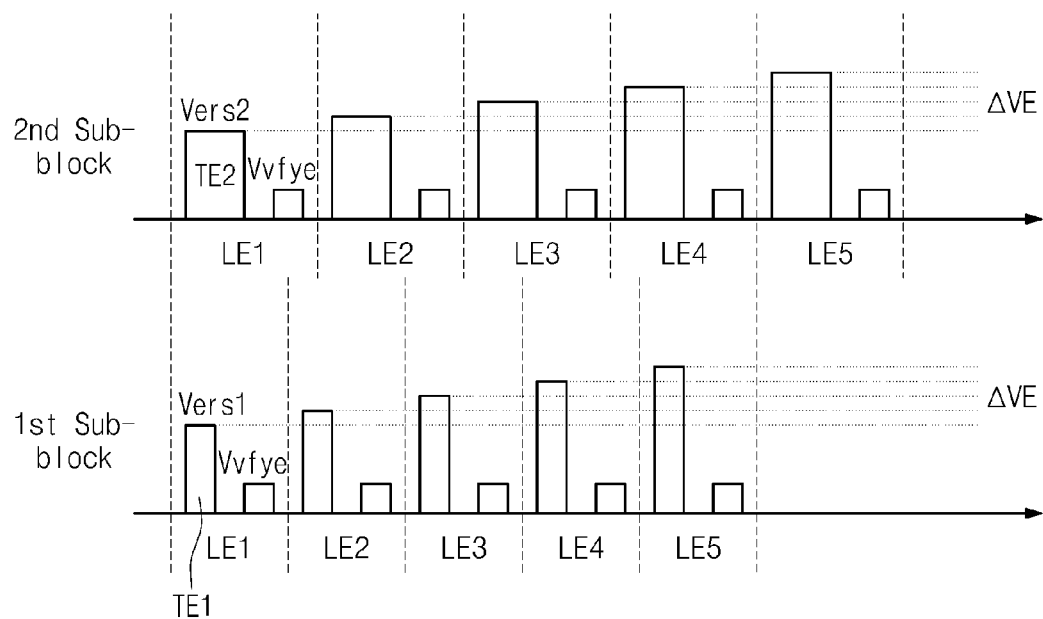
FIG. 61 is a diagram illustrating an erase operation of a nonvolatile memory device according to other example embodiments of the inventive concepts.

FIG. 61 is a diagram illustrating an erase operation of a nonvolatile memory device according to other example embodiments of the inventive concepts. As illustrated in FIG. 61, an erase operation may be executed under the condition that a voltage applying time and a level of an erase voltage vary. As compared with FIG. 24, erase voltages Vers1 and Vers2 having different levels may be applied to sub blocks. An applying time and a level of an erase voltage may decrease, for example, when an erase speed increases, when the strength of an electric field forced to a memory cell to be erased increases, when a tunneling current of a memory cell to be erased increases, when widths of pillars PL decrease, when a word line address of an input address ADDR decreases or increases, and when the number of memory cells MC stacked between a substrate 111 and memory cells MC corresponding to an input address ADDR decreases. As an applying time and a level of an erase voltage vary, a time taken to execute one erase loop may vary. For example, an internal between an end point of an erase voltage pulse and a start point of an erase-verify voltage pulse may be constant.

Figure 62:
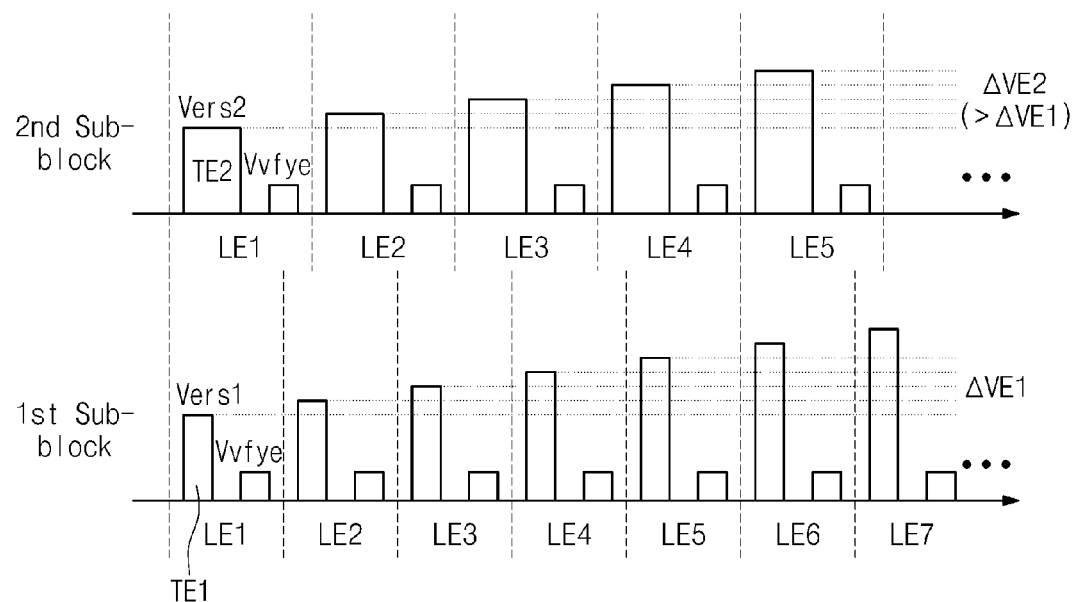
FIG. 62 is a diagram illustrating an erase operation of a nonvolatile memory device according to yet other example embodiments of the inventive concepts.

FIG. 62 is a diagram illustrating an erase operation of a nonvolatile memory device according to yet other example embodiments of the inventive concepts. As illustrated in FIG. 62, an erase operation may be executed under the condition that a voltage applying time and a voltage level of an erase voltage vary. As compared with FIG. 25, erase voltages Vers1 and Vers2 having different voltage levels may be applied to sub blocks. An applying time and a level of an erase voltage may decrease, for example, an erase speed increases, when the strength of an electric field forced to a memory cell to be erased increases, when a tunneling current of a memory cell to be erased increases, when widths of pillars PL decrease, when a word line address of an input address ADDR decreases or increases, and when the number of memory cells MC stacked between a substrate 111 and memory cells MC corresponding to an input address ADDR decreases. As an applying time and a level of an erase voltage vary, a number of erase loops may vary. For example, as a time taken to execute one erase loop decreases, the number of erase loops may increase.

Figure 63:
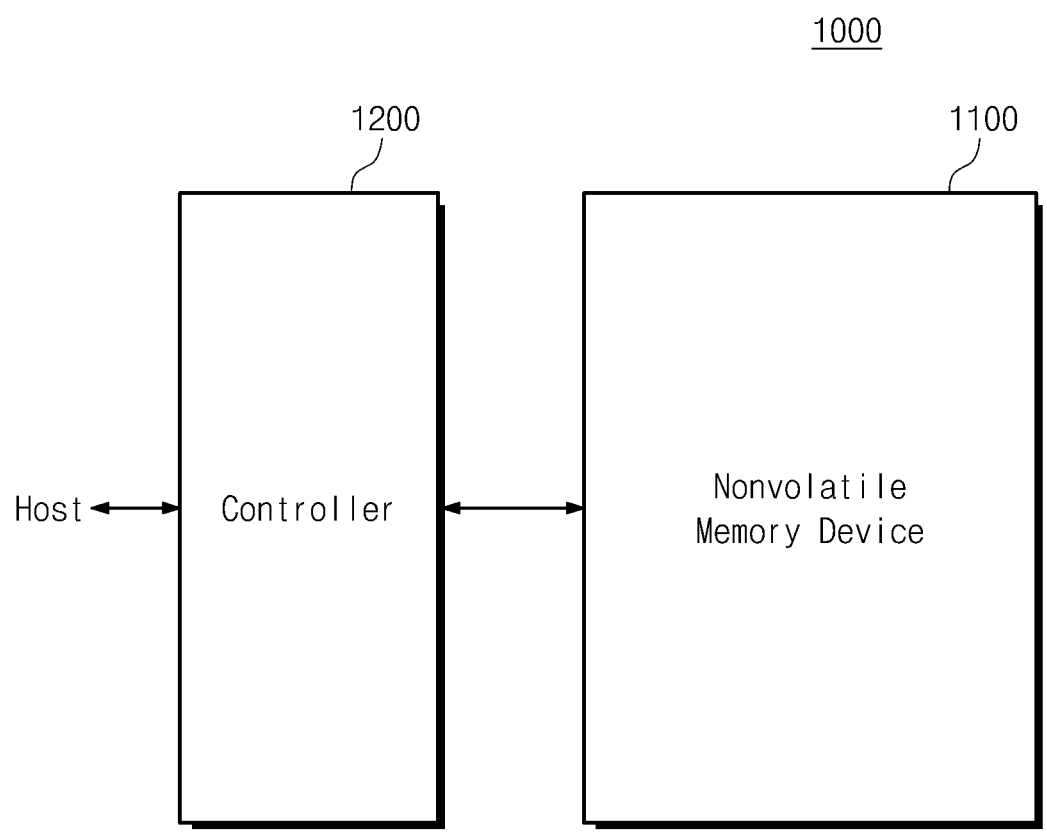
FIG. 63 is a block diagram illustrating memory systems according to example embodiments of the inventive concepts.

FIG. 63 is a block diagram illustrating memory systems according to example embodiments of the inventive concepts. Referring to FIG. 63, a memory system 1000 may include a nonvolatile memory device 1100 and a controller 1200. The nonvolatile memory device 1100 may have the same structure as one of nonvolatile memory devices 100, 200, and 300 according to example embodiments described with respect to FIGS. 1-62. The nonvolatile memory device 1100 may include a plurality of cell strings CS11, CS12, CS21 and CS22 provided on a substrate 111. Each of the cell strings CS11, CS12, CS21 and CS22 may include a plurality of cell transistors CT stacked in a direction perpendicular to the substrate 111. The nonvolatile memory device 1100 may control a voltage applying time of a specific voltage and/or a voltage applying time and a voltage level, according to input command and address. The specific voltage may be a program voltage Vpgm and/or an erase voltage Vers.

The controller 1200 may be coupled with a host Host and the nonvolatile memory device 1100. The controller 1200 may be configured to access the nonvolatile memory device 1100 in response to a request from the host Host. The controller 1200 may be configured to control read, program, erase, and background operations of the nonvolatile memory portion 1100, for example. The controller 1200 may be configured to provide an interface between the nonvolatile memory portion 1100 and the host. The controller 1200 may be configured to drive firmware for controlling the nonvolatile memory portion 1100.

The controller 1200 may be configured to provide a control signals CTRL and an address ADDR to the nonvolatile memory portion 1100. The nonvolatile memory portion 1100 may perform read, program, and erase operations according to the control signal CTRL and the address ADDR provided from the controller 1200. The controller 1200 may further include a RAM, a processing unit, a host interface and a memory interface. The RAM may be used as at least one of a working memory of the processing unit, a cache memory between the nonvolatile memory portion 1100 and the host Host and/or a buffer memory between the nonvolatile memory portion 1100 and the host Host. The processing unit may control an overall operation of the controller 1200.

The host interface may include the protocol for executing data exchange between the host Host and the controller 1200. For example, the host interface may communicate with an external device (e.g., the host Host) via at least one of various protocols (e.g., a USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and/or an IDE (Integrated Drive Electronics) protocol). The memory interface may interface with the nonvolatile memory device 1100. The memory interface may include a NAND interface or a NOR interface.

The memory system 1000 may further include an ECC block. The ECC block may be configured to detect and correct an error of data read from the nonvolatile memory device 1100 using ECC. The ECC block may be provided as an element of the controller 1200 and/or as an element of the nonvolatile memory device 1100. The controller 1200 and the nonvolatile memory device 1100 may be integrated into a single semiconductor device. The controller 1200 and the nonvolatile memory device 1100 may be integrated into a single semiconductor device to be, for example, a memory card. For example, the controller 1200 and the nonvolatile memory device 1100 may be integrated into a single semiconductor device to be, for example, a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and/or the like.

The controller 1200 and the nonvolatile memory device 1100 may be integrated into a single semiconductor device to form a solid state drive (SSD). The SSD may include a storage device configured to store data in a semiconductor memory. If the memory system 1000 is used as the SSD, it may be possible to remarkably improve an operating speed of a host Host coupled with the memory system 1000.

According to some example embodiments, the memory system 1000 may be used as, for example, a computer, portable computer, Ultra Mobile PC (UMPC), workstation, netbook, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, and/or one of various electronic devices constituting a computing system.

A nonvolatile memory device 1100 or a memory system 1000 may be packed by various types of packages, for example, PoP(Package on Package), Ball grid arrays(BGAs), Chip scale packages(CSPs), Plastic Leaded Chip Carrier (PLCC), Plastic Dual In-Line Package(PDI2P), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline (SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), and/or the like.

Figure 64:
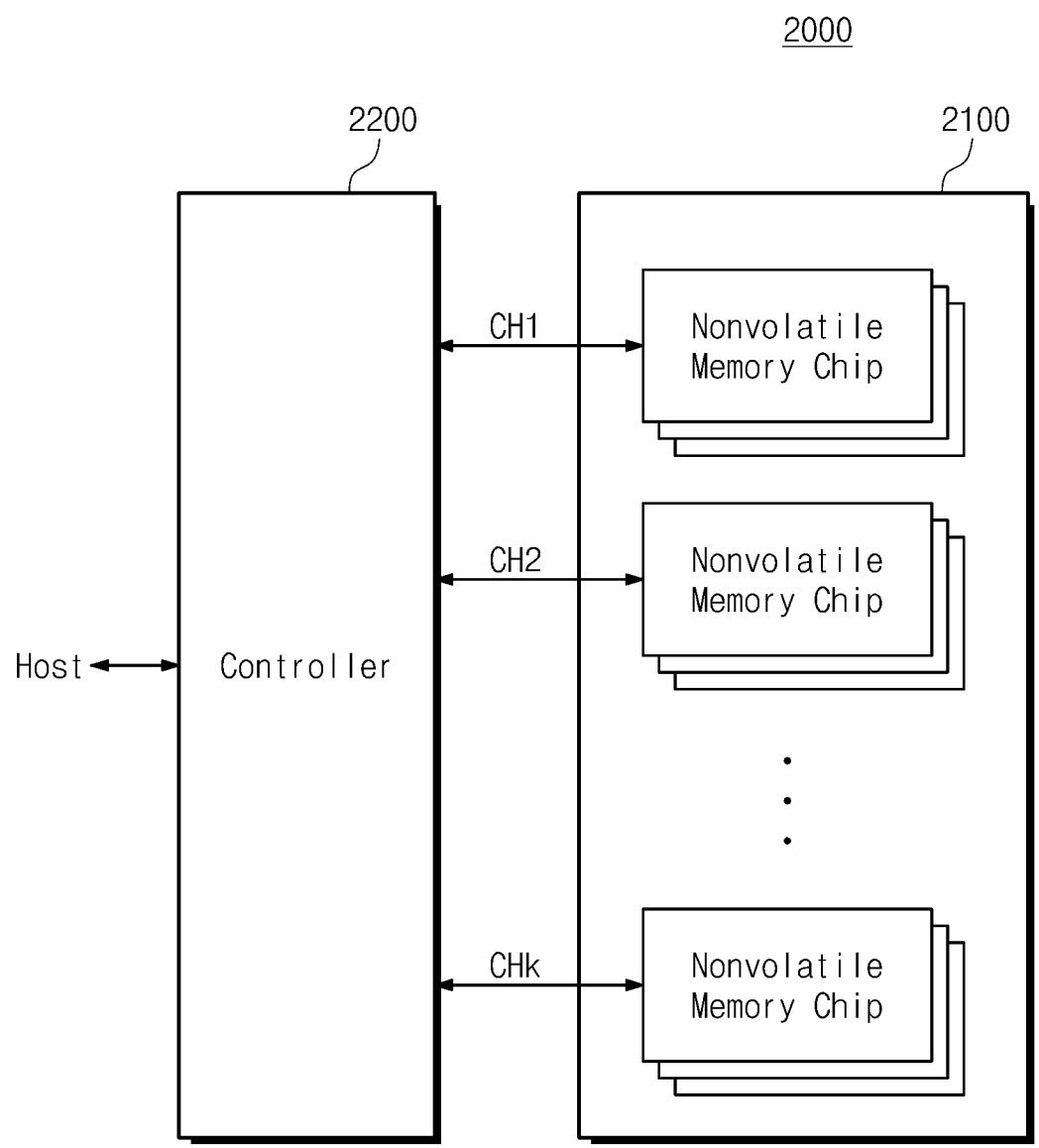
FIG. 64 is a block diagram illustrating applications of memory systems in FIG. 63.

FIG. 64 is a block diagram illustrating applications of memory systems in FIG. 63. Referring to FIG. 64, a memory system 2000 may include a nonvolatile memory device 2100 and a controller 2200. The nonvolatile memory device 2100 may include a plurality of nonvolatile memory chips, which may be classified into a plurality of groups. Nonvolatile memory chips in each group may communicate with the controller 2200 via a common channel. In FIG. 64, an example may be illustrated in which a plurality of memory chips communicate with the controller 2200 via K channels CH1 to CHk.

Each of the nonvolatile memory chips may have the same structure as one of nonvolatile memory devices 100, 200, and 300 according to example embodiments described with respect to FIGS. 1-62. Each nonvolatile memory chip may include a plurality of cell strings CS11, CS12, CS21 and CS22 provided on a substrate 111. Each of the cell strings CS11, CS12, CS21 and CS22 may include a plurality of cell transistors CT stacked in a direction perpendicular to the substrate 111. Each nonvolatile memory chip may control a voltage applying time of a specific voltage and/or a voltage applying time and a voltage level thereof, according to input command and address. The specific voltage may be a program voltage Vpgm and/or an erase voltage Vers.

As illustrated in FIG. 64, one channel may be connected with a plurality of nonvolatile memory chips. However, the memory system 2000 may be modified such that one channel is connected with one nonvolatile memory chip.

Figure 65:
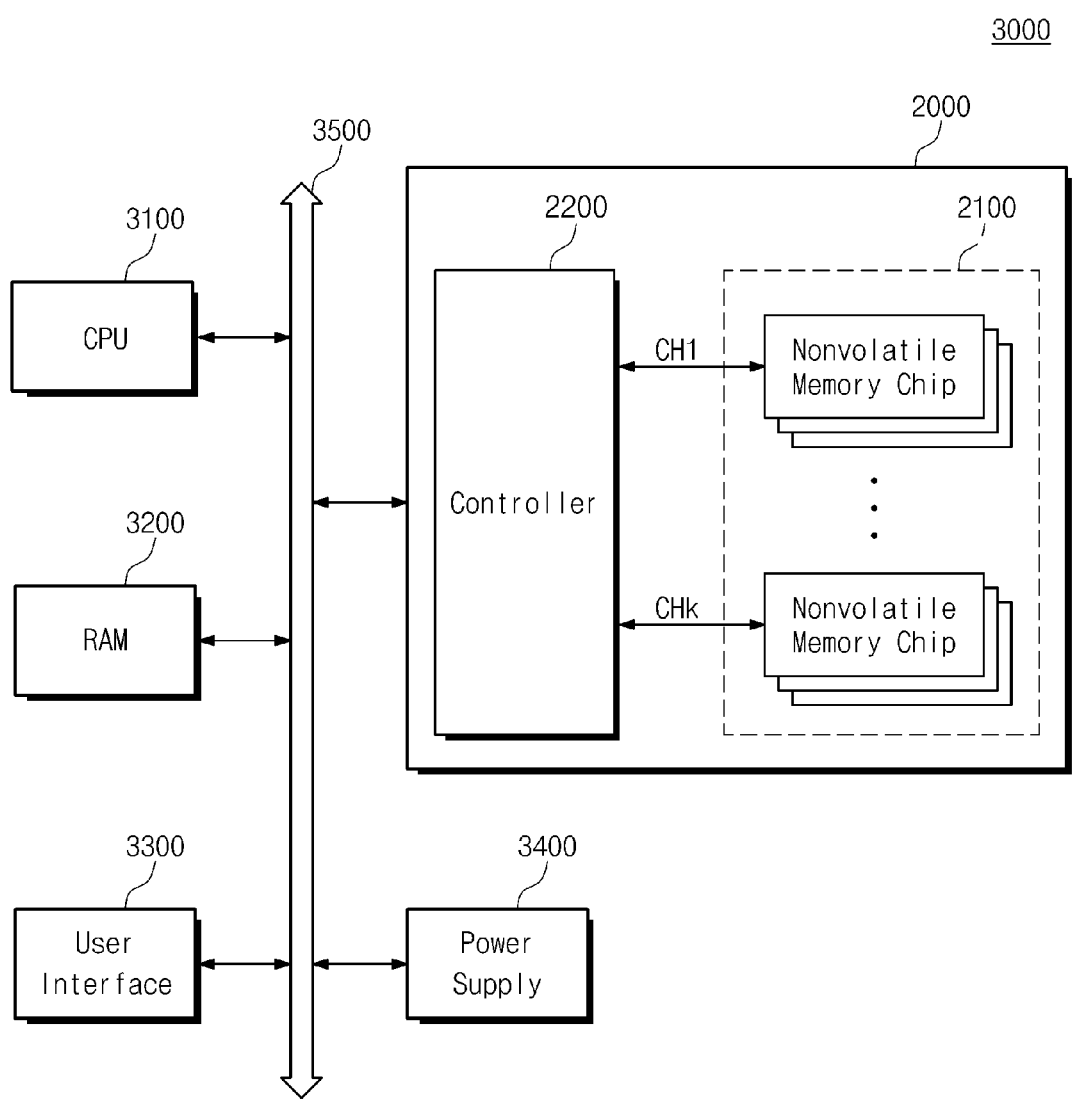

65 is a block diagram illustrating computing systems including memory systems illustrated in FIG. 64. Referring to FIG. 65, a computing system 3000 may include a CPU 3100, a RAM 3200, a user interface 3300, a power supply 3400 and a memory system 2000.

The memory system 2000 may be electrically connected with the CPU 3100, the RAM 3200, the user interface 3300 and the power supply 3400. Data provided via the user interface 3300 and/or processed by the CPU 3100 may be stored in the memory system 2000.

As illustrated in FIG. 65, a nonvolatile memory device 2100 may be connected with a system bus 3500 via a controller 2200. The nonvolatile memory device 2100 may be connected directly with the system bus 3500. The memory system 2000 in FIG. 65 may be a memory system described in FIG. 64. However, the memory system 2000 may be replaced with a memory system 1000 in FIG. 63. The computing system 3000 may be configured to include all memory systems 1000 and 2000 described in FIGS. 63 and 64.

As understood from the above description, as a cross-sectional area of a pillar varies, a voltage applying time and/or a voltage level of program and erase voltages may vary. Because a threshold voltage distribution of memory cells becomes narrow, the reliability may be improved.

While example embodiments have been particularly shown and described, it will be understood by one of ordinary skill in the art that variations in form and detail may be made therein without departing from the spirit and scope of the claims.

What is claimed is:

1. A method of operating a nonvolatile memory device, the method comprising:
   receiving a command and an address;
   determining a voltage applying duration in response to the received command and address; and
   applying a first voltage to memory cells of a plurality of cell strings corresponding to the received address for the voltage applying duration,
   each of the plurality of cell strings including a pillar extending in a direction perpendicular to a substrate.

2. The operating method of claim 1, wherein:
   the received command is a program command; and
   the applying a first voltage includes applying a program voltage to the memory cells for the voltage applying duration.

3. The operating method of claim 2, wherein the determining a voltage applying duration comprises:
   determining the voltage applying duration based on a word line address of the received address such that a lower a value of the word line address a shorter the voltage applying duration, and
   the word line address is associated with a plurality of word lines connected to memory cells of the plurality of cell strings.

4. The operating method of claim 2, wherein the determining a voltage applying duration includes determining the voltage applying duration based on a word line address of the received address such that, in first and second ranges of word line addresses, a lower a value of the word line address a shorter the voltage applying duration, address values of the second range being greater than address values of the first range, a voltage applying duration corresponding to at least one address of the first range being greater than a voltage applying duration corresponding to at least one address of the second range, and
   each of the word line addresses is associated with a plurality of word lines connected to memory cells of the plurality of cell strings.

5. The operating method of claim 2, wherein the determining a voltage applying duration includes determining the voltage applying duration based on a word line address of the received address such that,
   in a first range of addresses, a lower a value of the word line address a greater the voltage applying duration,
   in a second range of addresses, a lower a value of a word line address a shorter the voltage applying duration, address values of the second range being greater than address values of the first range, and
   each of the word line addresses is associated with a plurality of word lines connected to memory cells of the plurality of cell strings.

6. The operating method of claim 2, wherein:
the determining a voltage applying duration includes determining the voltage applying duration based on cross-sectional areas of portions of the pillars corresponding to memory cells addressed by the received address, such that a smaller the cross-sectional areas a lower the voltage applying duration.

7. The operating method of claim 2, wherein the determining a voltage applying duration includes determining the voltage applying duration such that a lower a number of memory cells stacked between the substrate and at least one memory cell of the memory cells corresponding to the received address, a lower the voltage applying duration.

8. The operating method of claim 2, wherein the determining a voltage applying duration includes determining the voltage applying duration such that, within first and second groups of the memory cells, the lower a number of memory cells stacked between the substrate and at least one memory cell of the memory cells corresponding to the received address, the lower the voltage applying duration, the memory cells of the first group being farther from the substrate than the memory cells of the second group, a voltage applying duration corresponding to at least one of the memory cells in the first group being less than a voltage applying duration of at least one of the memory cells in the second group.

9. The operating method of claim 2, wherein:
a plurality of word lines connected with a plurality of memory cells of the plurality of cell strings are divided into a plurality of word line groups; and
the determining a voltage applying duration includes determining the voltage applying duration based on which of the plurality of word line groups corresponds to the received address.

10. The operating method of claim 1, further comprising:
applying a verify voltage to the memory cells; and
applying a second voltage to the memory cells for the voltage applying duration upon detecting during the applying a verify voltage that at least one memory cell of the memory cells is not programmed.

11. The operating method of claim 10, wherein the applying a second voltage includes applying a voltage level that is greater than a voltage level of the first voltage,
a voltage difference between the first and second voltages corresponds to a length of the voltage applying duration, and
a smaller the length, a lower the voltage difference.

12. The operating method of claim 10, wherein:
the determining a voltage applying duration includes determining a voltage applying duration corresponding to a first memory cell that is different from a voltage applying duration corresponding to a second memory cell; and
an interval between a start point of a voltage pulse and a start point of a verify voltage pulse applied to the first memory cell is same as an interval between a start point of a voltage pulse and a start point of a verify voltage pulse applied to the second memory cell.

13. The operating method of claim 10, wherein:
the determining a voltage applying duration includes determining a voltage applying duration corresponding to a first memory cell that is different from a voltage applying duration corresponding to a second memory cell; and
an interval between an end point of a voltage pulse and a start point of a verify voltage pulse applied to the first memory cell is the same as an interval between an end point of a voltage pulse and a start point of a verify voltage pulse applied to the second memory cell.

14. The operating method of claim 1, wherein:
the received command is an erase command; and
the applying a first voltage includes applying an erase voltage to the memory cells via the substrate for the voltage applying duration.

15. A nonvolatile memory device, comprising:
a memory cell array including a plurality of cell strings, each of the plurality of cell strings including a plurality of memory cells stacked vertically on each other in a direction perpendicular to a substrate between at least one string selection transistor and at least one ground selection transistor;
an address decoder connected to a plurality of string selection transistors of the plurality of cell strings via a plurality of string selection lines, the address decoder connected to a plurality of memory cells of the plurality of cell strings via a plurality of word lines, and the address decoder connected to a plurality of ground selection transistors of the plurality of cell strings via a ground selection line;
a reading/writing circuit connected to the plurality of string selection transistors of the plurality of cell strings via a plurality of bit lines;
a voltage generator configured to generate a plurality of voltages; and
a controller configured to adjust a voltage applying duration upon applying a voltage generated by the voltage generator to a plurality of memory cells of the memory cell array.

16. A method of operating a three-dimensional (3D) semiconductor array, the method comprising:
applying a first voltage to a first semiconductor array of a plurality of semiconductor arrays for a first period of time, each of the plurality of semiconductor arrays including a portion of one vertical channel, the first period of time based on a width of the portion of the vertical channel included in the first semiconductor array, wherein the vertical channel is perpendicular to a substrate.

17. The method of claim 16, further comprising:
applying a second voltage to a second semiconductor array of the plurality of semiconductor arrays for a second period of time, the second period of time based on a width of the portion of the vertical channel included in the second semiconductor array, the second period of time being different from the first period of time.

18. The method of claim 17, wherein:
a width of the vertical channel increases as a function of distance from an end of the vertical channel;
the second semiconductor array is farther from the end of the vertical channel than the first semiconductor array; and
the second period of time is greater than the first period of time.

19. The method of claim 18, wherein the first and second voltages are a same voltage.

20. A method of operating a memory system, comprising:
applying the method of claim 16 to a non-volatile memory using a controller.

* * * * *